(12) United States Patent
Maehara et al.

(10) Patent No.: US 12,447,728 B2
(45) Date of Patent: Oct. 21, 2025

(54) BONDING METHOD AND BONDING DEVICE

(71) Applicant: NIKON CORPORATION, Tokyo (JP)

(72) Inventors: Yoshihiro Maehara, Tokyo (JP); Atsushi Kamashita, Tokyo (JP); Hajime Mitsuishi, Tokyo (JP); Minoru Fukuda, Tokyo (JP)

(73) Assignee: Nikon Corporation, Tokyo (JP)

( * ) Notice: Subject to any disclaimer, the term of this patent is extended or adjusted under 35 U.S.C. 154(b) by 1125 days.

(21) Appl. No.: 17/156,472

(22) Filed: Jan. 22, 2021

(65) Prior Publication Data

US 2021/0138778 A1 May 13, 2021

Related U.S. Application Data

(63) Continuation of application No. PCT/JP2019/026511, filed on Jul. 3, 2019.

(30) Foreign Application Priority Data

Jul. 25, 2018 (JP) .................................. 2018-139686

(51) Int. Cl.
*B32B 37/12* (2006.01)
*B32B 37/10* (2006.01)
(Continued)

(52) U.S. Cl.
CPC .............. *B32B 37/12* (2013.01); *B32B 37/10* (2013.01); *H01L 21/185* (2013.01);
(Continued)

(58) Field of Classification Search
CPC . H01L 21/185; H01L 21/187; H01L 21/2007; H01L 22/12; H01L 27/1469;
(Continued)

(56) References Cited

U.S. PATENT DOCUMENTS 6,593,212 B1 * 7/2003 Kub .................. H01L 21/76254
438/22
7,002,175 B1 * 2/2006 Singh ..................... H10D 8/755
438/455

(Continued)

FOREIGN PATENT DOCUMENTS

CN 108886043 A 11/2018
JP 2014-107448 A 6/2014

(Continued)

OTHER PUBLICATIONS

International Search Report of International Application No. PCT/JP2019/026511 dated Oct. 8, 2019.

(Continued)

*Primary Examiner* — Eduardo A Rodela
(74) *Attorney, Agent, or Firm* — Finnegan, Henderson, Farabow, Garrett & Dunner, L.L.P.

(57) ABSTRACT

A bonding method including firstly bonding a first substrate to a second substrate by releasing a holding of the first substrate to form a first stack; and secondly bonding one substrate, which has been thinned, among the first substrate and the second substrate that have been bonded, to a third substrate, to form a second stack, wherein when the first substrate is thinned, the holding of the third substrate is released at the second bonding, and when the second substrate is thinned, the holding of the first stack is released at the second bonding.

19 Claims, 71 Drawing Sheets

(51) Int. Cl.

| | |
|---|---|
| *H01L 21/18* | (2006.01) |
| *H01L 21/20* | (2006.01) |
| *H01L 21/66* | (2006.01) |
| *B23K 20/00* | (2006.01) |
| *H01L 21/02* | (2006.01) |
| *H01L 21/67* | (2006.01) |
| *H10D 84/00* | (2025.01) |
| *H10D 84/03* | (2025.01) |
| *H10D 99/00* | (2025.01) |
| *H10F 39/00* | (2025.01) |

(52) U.S. Cl.
CPC ...... *H01L 21/2007* (2013.01); *H01L 21/2011* (2013.01); *H01L 21/2015* (2013.01); *H01L 22/12* (2013.01); *B23K 20/00* (2013.01); *B32B 2457/08* (2013.01); *H01L 21/02* (2013.01); *H01L 21/67092* (2013.01); *H10D 84/00* (2025.01); *H10D 84/038* (2025.01); *H10D 99/00* (2025.01); *H10F 39/011* (2025.01); *H10F 39/803* (2025.01)

(58) Field of Classification Search
CPC . H01L 21/2011; H01L 21/2015; B32B 37/12; B32B 37/10; B32B 2457/08
See application file for complete search history.

(56) References Cited

U.S. PATENT DOCUMENTS

| | | | | |
|---|---|---|---|---|
| 7,166,520 | B1* | 1/2007 | Henley | H01L 21/6835 |
| | | | | 438/455 |
| 9,396,947 | B2* | 7/2016 | Kerwin | H01L 27/0921 |
| 9,735,077 | B1* | 8/2017 | Chen | H01L 23/3128 |
| 10,139,619 | B2* | 11/2018 | Oganesian | H10F 39/8027 |
| 10,340,248 | B2* | 7/2019 | Matsunaga | H05K 13/0061 |
| 10,748,802 | B2* | 8/2020 | Marinov | H01L 21/78 |
| 10,892,295 | B2* | 1/2021 | Nagaraja | H10F 39/805 |
| 11,024,501 | B2* | 6/2021 | Donofrio | H01L 21/304 |
| 2008/0211061 | A1* | 9/2008 | Atwater, Jr. | H01L 21/2007 |
| | | | | 257/E29.089 |
| 2010/0244631 | A1 | 9/2010 | Kobayashi et al. | |
| 2011/0248396 | A1 | 10/2011 | Liu et al. | |
| 2019/0027462 | A1 | 1/2019 | Sugaya et al. | |
| 2019/0037155 | A1 | 1/2019 | Tanaka et al. | |
| 2019/0043826 | A1 | 2/2019 | Sugaya et al. | |
| 2019/0122915 | A1 | 4/2019 | Mitsuishi et al. | |
| 2022/0130689 | A1* | 4/2022 | Uno | H01L 21/02057 |
| 2022/0223475 | A1* | 7/2022 | Tanoue | H01L 21/304 |
| 2022/0270926 | A1* | 8/2022 | Mizomoto | H01L 21/02334 |

FOREIGN PATENT DOCUMENTS

| | | |
|---|---|---|
| JP | 2016-213491 A | 12/2016 |
| KR | 10-2019-0018627 A | 2/2019 |
| TW | 200606996 A | 2/2006 |
| TW | 201303960 A | 1/2013 |
| TW | 201448005 A | 12/2014 |
| TW | 201801136 A | 1/2018 |
| TW | 201801225 A | 1/2018 |
| TW | 201826332 A | 7/2018 |
| WO | WO 2017/168531 A1 | 10/2017 |
| WO | WO 2017/168534 A1 | 10/2017 |
| WO | WO 2017/187738 A1 | 11/2017 |
| WO | WO 2017/217431 A1 | 12/2017 |

OTHER PUBLICATIONS

Notice of Reason for Refusal from the Japanese Patent Office, issued in the counterpart Japanese Patent Application No. 2020-532257 mailed on Feb. 1, 2022.

Office Action issued by the Taiwan Intellectual Property Office on Dec. 21, 2023 in counterpart Taiwanese Patent Application No. 108125356, and English Translation thereof.

International Preliminary Report of Patentability issued on Jan. 26, 2021 by the International Bureau of WIPO in International Application No. PCT/JP2019/026511.

Notification of Reason for Refusal from the Korean Patent Office, issued in the counterpart Korean Patent Application No. 10-2021-7002256 mailed on Mar. 29, 2022.

Office Action issued by the Taiwan Intellectual Property Office on May 30, 2023 in counterpart Taiwanese Patent Application No. 108125356, and English Translation thereof.

Office Action issued by the Chinese Patent Office and mailed on Jun. 27, 2024 in counterpart Chinese Patent Application No. 201980045550.6, and English Translation thereof.

Office Action issued by the Taiwan Patent Office on Feb. 21, 2025, in counterpart Taiwanese Patent Application No. 108125356, and English Translation thereof.

Office Action issued by the Taiwan Patent Office on Jul. 25, 2025, in counterpart Taiwanese Patent Application No. 11420774110 and English Translation thereof.

\* cited by examiner

| | Firstly released side during bonding | |
|---|---|---|
| | The first bonding | The second bonding |
| Implementation 1 | Logic substrate | DRAM substrate |
| Implementation 2 | CIS substrate | Intermediate stack |
| Comparative example 1 | Logic substrate | Intermediate stack |
| Comparative example 2 | CIS substrate | DRAM substrate |

FIG. 11

| | DISTORTION GENERATED IN EACH LAYER OF STACK | | |
|---|---|---|---|
| | CIS SUBSTRATE | LOGIC SUBSTRATE | DRAM SUBSTRATE |
| IMPLEMENTATION 1 | -[DISTORTION 2] | [DISTORTION 1] -[DISTORTION 2] | O |
| IMPLEMENTATION 2 | [DISTORTION 2] | -[DISTORTION 1] +[DISTORTION 2] | O |
| COMPARATIVE EXAMPLE 1 | [DISTORTION 2] | [DISTORTION 1'] +[DISTORTION 2] | O |
| COMPARATIVE EXAMPLE 2 | -[DISTORTION2 ] | -[DISTORTION 1'] -[DISTORTION 2] | O |

DISTORTION GENERATED IN THE FIRST BONDING
DISTORTION GENERATED IN THE SECOND BONDING

*FIG. 12*

| | DIFFERENCE OF DISTORTIONS BETWEEN EACH LAYER OF STACK | | |
|---|---|---|---|
| | BETWEEN CIS - LOGIC | BETWEEN LOGIC - DRAM | BETWEEN CIS - DRAM |
| IMPLEMENTA-TION 1 | -[DISTORTION 1] | [DISTORTION 1]<br>-[DISTORTION 2] | -[DISTORTION 2] |
| IMPLEMENTA-TION 2 | [DISTORTION 1] | -[DISTORTION 1]<br>+[DISTORTION 2] | [DISTORTION 2] |
| COMPARATIVE EXAMPLE 1 | -[DISTORTION 1'] | +[DISTORTION 1']<br>+[DISTORTION 2] | [DISTORTION 2] |
| COMPARATIVE EXAMPLE 2 | [DISTORTION 1'] | -[DISTORTION 1']<br>-[DISTORTION 2] | -[DISTORTION 2] |

[DISTORTION ]: DISTORTION GENERATED IN THE FIRST BONDING
[DISTORTION ]: DISTORTION GENERATED IN THE SECOND BONDING

FIG. 13

BONDING METHOD AND BONDING DEVICE

The contents of the following Japanese and International patent applications are incorporated herein by reference:
No. 2018-139686 filed in JP on Jul. 25, 2018, and
No. PCT/JP2019/026511 filed in WO on Jul. 3, 2019

BACKGROUND

1. Technical Field

The present invention relates to a bonding method and a bonding device.

2. Related Art

There is a method of aligning and bonding two substrates on each of which a pattern such as an electric circuit is formed to form a stack (for example, see Patent Document 1).

Patent Document 1: Japanese Patent Application Publication No. 2016-213491

One of two bonded substrates may be a stack in which a plurality of substrates is already bonded. In this case, there is a defect where the distortion generated when forming this stack and the distortion generated when this stack is further bonded to another substrate are superimposed, and the distortion of the finally obtained stack is increased.

SUMMARY

A first aspect of the present invention provides a bonding method, including firstly bonding a first substrate to a second substrate by releasing a holding of the first substrate to form a first stack, and secondly bonding one substrate, which has been thinned, among the first substrate and the second substrate that have been bonded, to a third substrate, to form a second stack, and when the first substrate is thinned, the holding of the third substrate is released at the second bonding, and when the second substrate is thinned, the holding of the first stack is released at the second bonding.

A second aspect of the present invention provides a bonding method, including firstly bonding a first substrate to a second substrate, and secondly bonding one substrate of the first substrate and the second substrate that have been bonded, to a third substrate, and the one substrate is bonded to the third substrate so that an amount of misalignment between a structure of the one substrate where a distortion has been generated at the first bonding and the structure of the third substrate is equal to or less than a predetermined amount at the second bonding.

A third aspect of the present invention provides a bonding method, including firstly bonding a first substrate and a second substrate to form a first stack, secondly bonding one substrate of the first substrate and the second substrate that have been bonded, to a third substrate, to form a second stack, and determining which holding of those of the first stack and the third substrate is to be released at the second bonding so that an amount of misalignment between a structure of the one substrate where a distortion has been generated at the first bonding and a structure of the third substrate is equal to or less than a predetermined amount.

A fourth aspect of the present invention provides a bonding method, including firstly bonding a first substrate and a second substrate, and secondly bonding one substrate of the first substrate and the second substrate that have been bonded, to a third substrate, and the one substrate and the third substrate are bonded so that at the second bonding, a distribution of a stress generated in the third substrate at the second bonding is the same as a distribution of a stress generated in the one substrate at the first bonding.

A fifth aspect of the present invention provides a bonding device, including a bonding unit for bonding a stack having one of a first substrate and a second substrate thinned, which is a stack having the first substrate and the second substrate that have been bonded, to a third substrate, and a reception unit for receiving instructions indicating which holding of those of the stack and the third substrate is to be released for bonding, wherein the bonding unit bonds the stack and the third substrate by releasing any holding of those of the stack and the third substrate based on the instructions received by the reception unit.

A sixth aspect of the present invention provides a bonding device, including an obtaining unit for obtaining information that specifies which of a first substrate and a second substrate is thinned, when a second stack is formed by laminating a third substrate on a first stack with one of the first substrate and the second substrate thinned that have been bonded by releasing a holding of the first substrate, a specifying unit for specifying the third substrate when the first substrate is thinned, and specifying the first stack when the second substrate is thinned, based on the information obtained by the obtaining unit, and a bonding unit for releasing a holding of the first stack or the third substrate specified by the specifying unit and laminating the first stack and the third substrate.

A seventh aspect of the present invention provides a bonding device, including a bonding unit for bonding a stack having one of a first substrate and a second substrate thinned, which is a stack having the first substrate and the second substrate that have been bonded, to a third substrate, wherein the bonding unit bonds the stack and the third substrate by releasing a holding of one of the stack and the third substrate whose holding is determined to be released for bonding based on which of the first substrate and the second substrate is thinned.

An eighth aspect of the present invention provides a bonding device, including a bonding unit for bonding a first substrate to a second substrate, and bonding one substrate of the first substrate and the second substrate that have been bonded to a third substrate, wherein the bonding unit bonds one substrate to the third substrate so that an amount of misalignment between a structure of the one substrate where a distortion has been generated when bonding the first substrate and the second substrate, and a structure of the third substrate is equal to or less than a predetermined amount.

A ninth aspect of the present invention provides a bonding device, including a bonding unit for forming a first stack by bonding a first substrate to a second substrate, and forming a second stack by bonding one substrate of the first substrate and the second substrate that have been bonded, to a third substrate, and a determination unit for determining which holding of those of the first stack and the third substrate is to be released for bonding of one substrate to the third substrate so that an amount of misalignment between a structure of the one substrate where a distortion has been generated due to a bonding by the bonding unit and a structure of the third substrate is equal to or less than a predetermined amount.

A tenth aspect of the present invention provides a bonding device, including a bonding unit for bonding a first substrate to a second substrate, and bonding one substrate of the first substrate and the second substrate that have been bonded, to a third substrate, wherein the bonding unit bonds one substrate to the third substrate so that a distribution of a stress generated in the third substrate due to bonding to the one substrate is the same as a distribution of a stress generated in the one substrate.

The summary clause does not necessarily describe all necessary features of the embodiments of the present invention. The present invention may also be a sub-combination of the features described above.

BRIEF DESCRIPTION OF THE DRAWINGS

FIG. 11 is a table indicating choices of the manufacturing procedure of the completed stack 240.

FIG. 12 is a table indicating distortions generated in the respective substrates when the substrates are bonded according to the choices.

FIG. 13 is a table indicating distortions generated between the layers of the completed stack 240 when the substrates are bonded according to the choices.

DESCRIPTION OF EXEMPLARY EMBODIMENTS

Hereinafter, some embodiments of the present invention will be described. The following embodiments do not limit the invention according to the claims. Not all of the combinations of features described in the embodiments are essential to the solving means of the invention.

Figure 1:
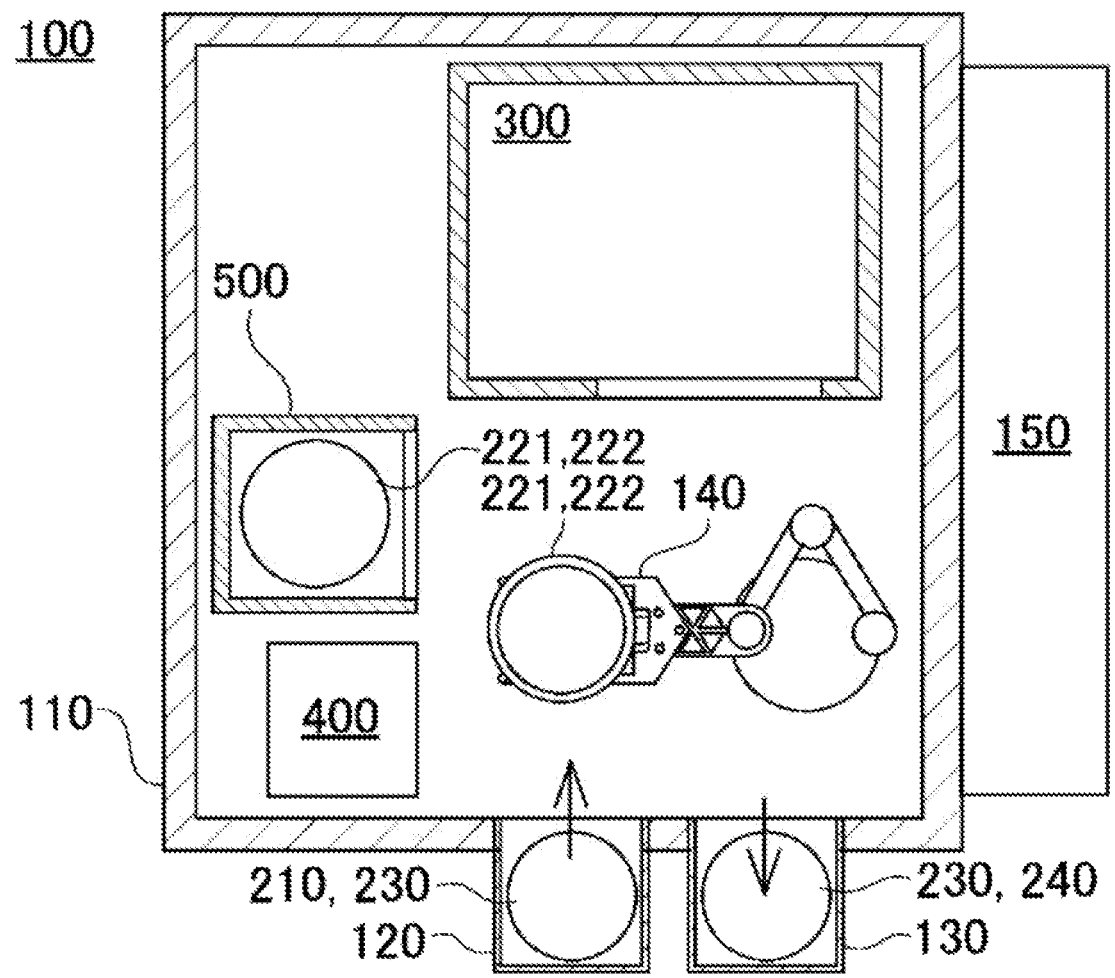
FIG. 1 is a schematic view of a substrate laminating apparatus 100.

FIG. 1 illustrates a schematic planar view of a substrate laminating apparatus 100. The substrate laminating apparatus 100 includes a housing 110, substrate cassettes 120 and 130 arranged outside the housing 110, and a control unit 150, a transport unit 140 arranged inside the housing 110, a bonding unit 300, a holder stocker 400, and a prealigner 500.

The substrate cassettes 120 and 130 can be individually attached to and detached from the housing 110. The one substrate cassette 120 accommodates an intermediate stack 230 that is a first stack formed by bonding a substrate 210, or a plurality of substrates 210 to be bonded. The other substrate cassette 130 accommodates a completed stack 240 that is a second stack formed by bonding an intermediate stack 230, or a substrate 210 and an intermediate stack 230.

Herein, the substrate 210 includes a semiconductor wafer such as a silicon single crystal wafer and a compound semiconductor wafer, and may also further include a glass substrate, a sapphire substrate and so on other than the semiconductor wafer. Also, the intermediate stack 230 is laminated on another substrate 210 or another intermediate stack 230. Although the completed stack 240 is a completed product in the laminating step, any of the intermediate stack 230 and the substrate 210 located on the surface is further thinned. Furthermore, the completed stack 240 may also be subjected to downstream steps such as dicing, testing and packaging.

Also, the bonding of the substrate 210 refers to stacking the principal surfaces of the plurality of substrates 210 in parallel with each other and fixing the relative positions of each other by hydrogen bonding, van der Waals bonding, covalent bonding and so on. On the other hand, stacking the substrates 210 refers to the principal surfaces of the plurality of substrates 210 being in a state of contacting with each other, but does not necessarily mean a state where the relative positions of the substrates 210 to each other are fixed. Further, "laminating" may be used synonymously with "stacking".

Also, when bonding the substrates 210, the two substrates 210 are aligned with each other prior to bonding. In particular, the substrate 210 on which an electronic circuit or the like is formed is aligned with high precision so that an electrical connection with a circuit of another bonded substrate 210 is formed.

The transport unit 140 moves the single substrate 210, the single substrate holders 221 and 222, the intermediate stack 230, and the completed stack 240 inside the housing 110. Further, the transport unit 140 may also transport the substrate holders 221 and 222 holding the substrate 210, the intermediate stack 230, the completed stack 240 and so on.

The control unit 150 individually controls the operations of each unit of the substrate laminating apparatus 100, and at the same time comprehensively controls the cooperation of the units with each other. Further, the control unit 150 may also receive an instruction from an external user and instruct the bonding unit 300 to perform a procedure and so on for laminating the substrates 210 and so on. Furthermore, the control unit 150 may also include a user interface such as a display unit for displaying the operation state of the substrate laminating apparatus 100 to the outside.

The bonding unit 300 has a pair of stages facing each other, and aligns the substrate 210, the intermediate stack 230 and so on with each other held on each of the stages. Herein, the holding refers to a state in which the movement of the substrate 210 is restricted by applying a force to the substrate 210 and so on. The holding may restrict not only the movement of the substrate 210, but also the deformation. Also, the release of the holding means removing a force applied on the substrate 210 for the purpose of holding the substrate 210.

Also, the bonding unit 300 forms the intermediate stack 230 by bringing the aligned substrates 210 into contact with each other to bond them. Furthermore, the bonding unit 300 bonds another substrate 210 to the intermediate stack 230 to form a completed stack 240. Details of the bonding unit 300 will be described below in reference to FIG. 3 to FIG. 7.

It is noted that the substrate laminating apparatus 100 uses the substrate holders 221 and 222 accommodated in the holder stocker 400 during handling the substrate 210, the intermediate stack 230, and the completed stack 240 inside. The substrate holders 221 and 222 are formed of a hard material such as alumina ceramics, and have a holding mechanism such as a vacuum chuck and an electrostatic chuck. The substrate holders 221 and 222 protect the substrate 210, the intermediate stack 230, and the completed stack 240, which are thin and brittle, against external impact and so on by attracting the substrate 210 and so on using a holding mechanism.

Further, the substrate holders 221 and 222 maintain the shape of the substrate 210 according to the shape of the holding surfaces of the substrate holders 221 and 222 by attracting the substrate 210 and the intermediate stack 230 and so on. In this way, the flat state of the substrate 210, the intermediate stack 230 and so on can be maintained, or the deformed state according to the shape of the holding surface can be maintained. The unused substrate holders 221 and 222 are accommodated again in the holder stocker 400 in the substrate laminating apparatus 100 and are not taken out of the substrate laminating apparatus 100 except for the cases of maintenance and replacement.

The prealigner 500 in cooperation with the transport unit 140 causes the substrate holders 221 and 222 to hold the loaded substrate 210. Also, the prealigner 500 is also used in a case in which the intermediate stack 230 carried out of the bonding unit 300 is separated from the substrate holders 221 and 222.

Figure 2:
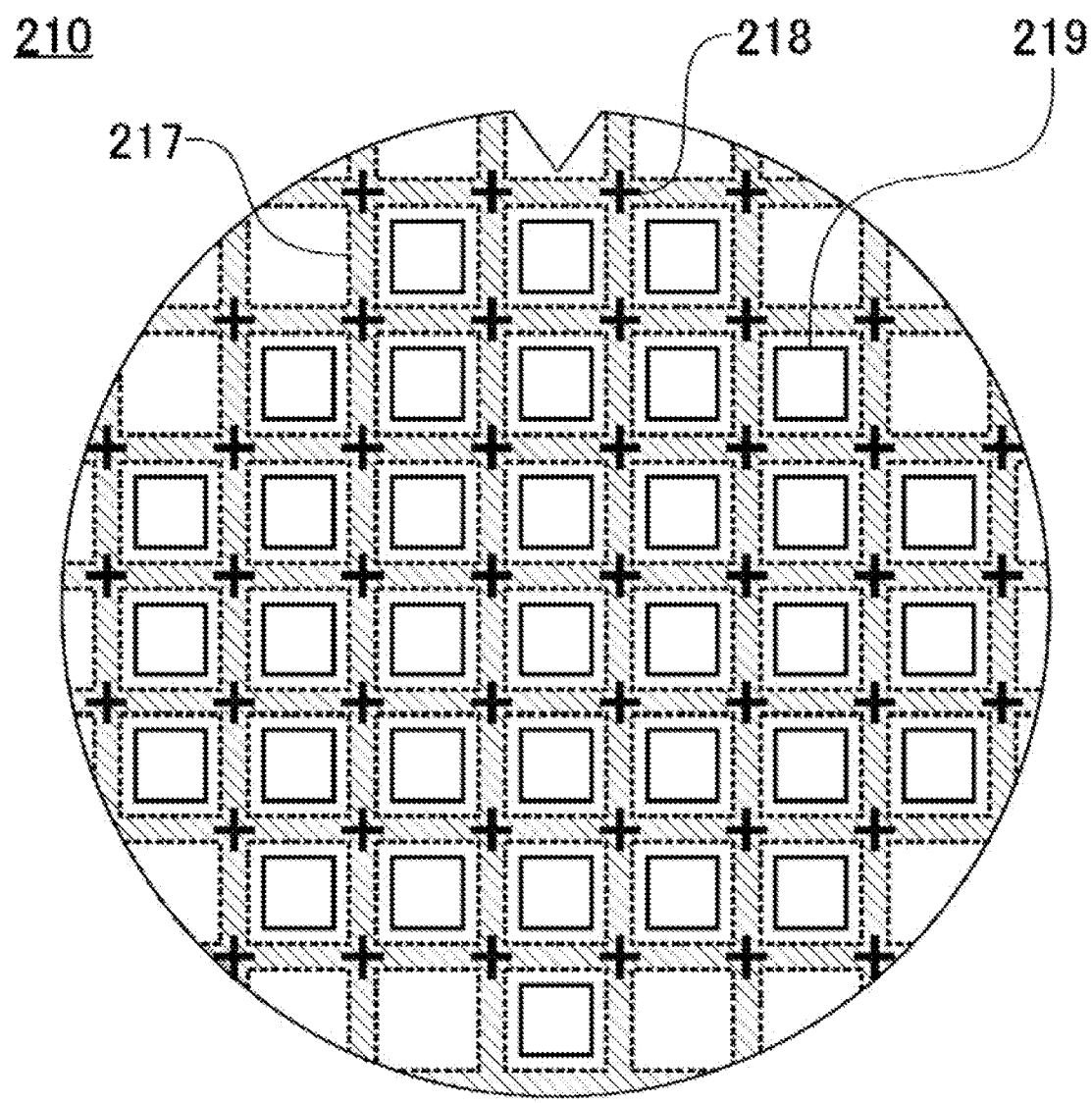
FIG. 2 is a schematic planar view of a substrate 210.

FIG. 2 illustrates a schematic planar view indicating one example of the substrate 210. The substrate 210 has scribe lines 217, marks 218 and circuit regions 219. A plurality of marks 218 and circuit regions 219 are provided on the surface of the substrate 210, respectively.

The mark 218 is an example of a structure formed on the surface of the substrate 210, and in the illustrated example, the marks 218 are arranged to be overlapped with the scribe lines 217 arranged between the circuit regions 219. At least a part of the mark 218 is used as a reference for alignment when the substrate 210 is bonded to another substrate 210.

Each of the circuit regions 219 includes a structure such as an element, a wiring, and a protective film formed by a photolithography technique or the like. Further, the circuit region 219 is provided with a connection unit such as a pad or a bump serving as a connection terminal when the substrate 210 is electrically connected to another substrate 210, a lead frame and so on.

Figure 3:
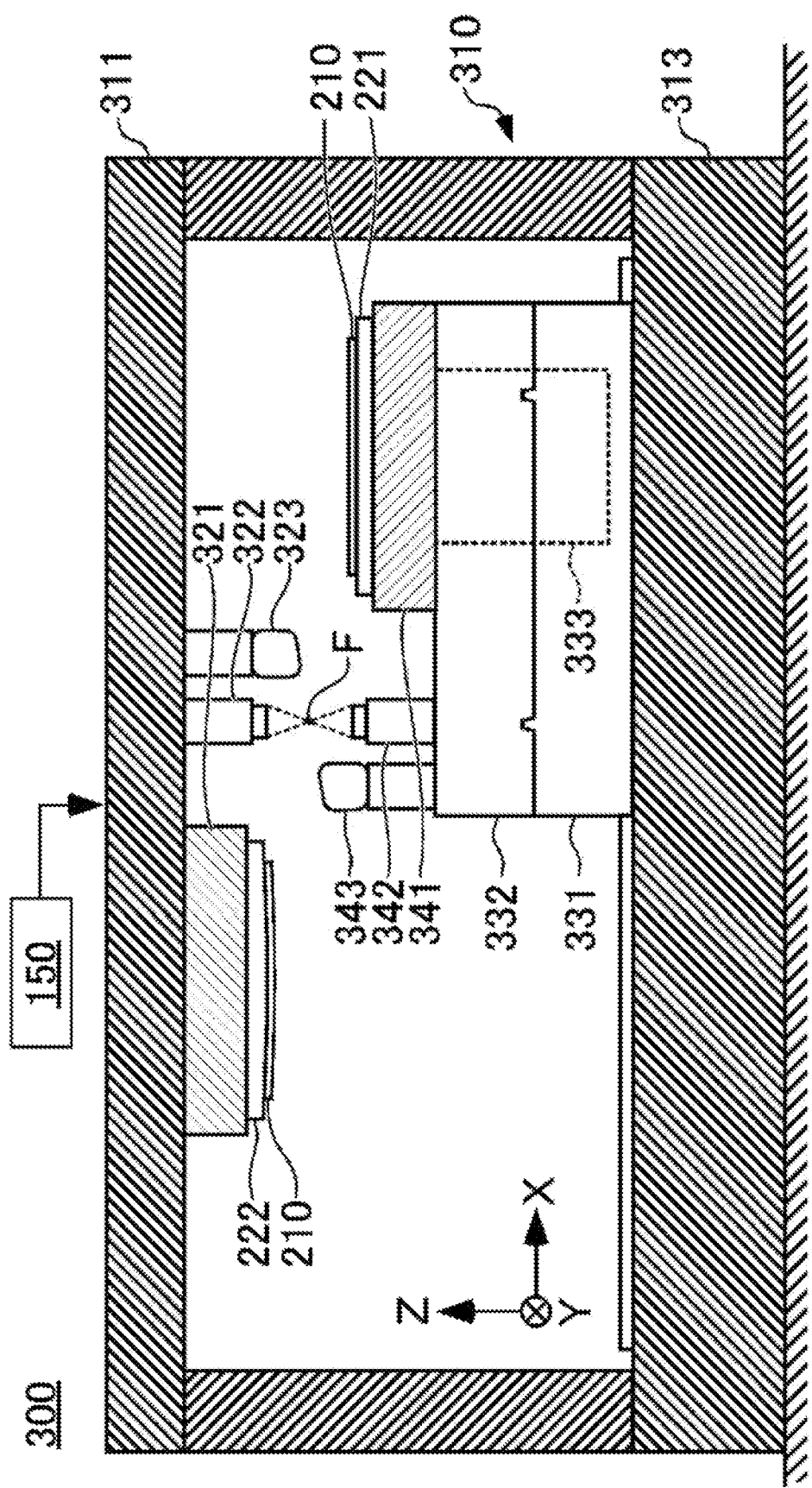
FIG. 3 is a schematic cross sectional view of a bonding unit 300.

FIG. 3 illustrates a schematic cross sectional view indicating the structure of the bonding unit 300, and indicates a state immediately after two substrates 210 have been carried into the bonding unit 300. The bonding unit 300 includes a frame 310, a fixed stage 321, and a moving stage 341.

The frame 310 has a top plate 311 and a bottom plate 313 that are horizontal respectively. The fixed stage 321 is fixed downward to the illustrated lower surface of the top plate 311, and has a holding mechanism that can hold the substrate holder 222 holding the substrate 210. The substrate holder 222 held by the fixed stage 321 is carried into the bonding unit 300 such that the bonding surface of the substrate 210 faces downward in the figure, and is also held downward by the fixed stage 321.

It is noted that in the illustrated example, the substrate holder 222 held by the fixed stage 321 has a shape in which the center of the attracting surface for attracting the substrate 210 is raised. In this way, the substrate 210 held by attraction on the substrate holder 222 is also held in a state in which the center is raised downward in the figure according to the shape of the substrate holder 222.

On the illustrated lower surface of the top plate 311, a microscope 322 and an activation device 323 fixed downward in the figure are arranged on the side of the fixed stage 321. The microscope 322 can observe the upper surface of another substrate 210 mounted on the moving stage 341 arranged to face the fixed stage 321. The activation device 323 generates, for example, plasma to clean or activate the upper surface of the substrate 210 mounted on the moving stage 341.

An X-direction driving unit 331, a Y-direction driving unit 332, and a moving stage 341 are arranged to be stacked on the illustrated upper surface of the bottom plate 313 of the frame 310. On the illustrated upper surface of the moving stage 341, a substrate holder 221 holding the substrate 210 is held. In the illustrated example, the substrate holder 221 has a flat attracting surface, and the substrate 210 held by the substrate holder 221 is held in a flat state.

The X-direction driving unit 331 moves in a direction indicated by an arrow X in the figure, in parallel with the bottom plate 313. The Y-direction driving unit 332 moves on the X-direction driving unit 331 in parallel with the bottom plate 313, in the direction indicated by an arrow Y in the figure. By combining the operations of the X-direction driving unit 331 and the Y-direction driving unit 332, the moving stage 341 moves two-dimensionally in parallel with the bottom plate 313.

A Z-direction driving unit 333 is further arranged between the Y-direction driving unit 332 and the moving stage 341. The Z-direction driving unit 333 moves the moving stage 341 with respect to the Y-direction driving unit 332 in the direction that is perpendicular to the bottom plate 313 and is indicated by an arrow Z. In this way, the moving stage 341 is moved up and down. The amount of movement of the moving stage 341 by the X-direction driving unit 331, the Y-direction driving unit 332 and the Z-direction driving unit 333 is controlled with high precision using an interferometer or the like.

A microscope 342 and an activation device 343 are mounted on the illustrated upper surface of the Y-direction driving unit 332 on the side of the moving stage 341. The microscope 342 moves together with the Y-direction driving unit 332 to observe the lower surface of the downward substrate 210 held on the fixed stage 321. The activation device 343 generates, for example, plasma for irradiating the substrate 210, cleaning or activating the illustrated lower surface of the substrate 210 held on the fixed stage 321, similar to the activation device 323 described above, while moving together with the Y-direction driving unit 332.

It is noted that the activation of the substrate 210 means the case including that when a bonding surface of the substrate 210 comes into contact with a bonding surface of another substrate 210, a hydrogen bonding, a van der Waals bonding, a covalent bonding or the like is generated, and at least the bonding surface of one substrate is processed so that they should be in a bonded state in the solid phase without being melted. In other words, activation includes generating dangling bonds (unbounded hands) on the surface of the substrate 210 to facilitate formation of bonds.

More specifically, in the activation device 323 and the activation device 343, for example, an oxygen gas which is a treatment gas is excited into plasmas under a reduced-pressure atmosphere, and the oxygen ions are irradiated on a surface to be a bonding surface of each of the two substrates. For example, when the substrate is a substrate in which a SiO film is formed on Si, the bond of SiO on the substrate surface serving as a bonding surface is broken during lamination due to the irradiation of the oxygen ions, and the dangling bond of Si and O is formed. Forming such a dangling bond on the surface of the substrate 210 may be referred to as activation.

When the substrate on which the dangling bonds are formed is exposed to, for example, the atmosphere, moisture in the air is bonded to the dangling bonds, and the substrate surface is covered with hydroxyl groups (OH groups). The surface of the substrate is in a state of being easily bonded to water molecules, that is, a state of being easily hydrophilized. That is, as a result, the surface of the substrate becomes to be in a state of being easily hydrophilized due to the activation. Also, in a solid phase bonding, the presence of impurities such as oxides at the bonding interface, defects at the bonding interface and so on affect the bonding strength. Therefore, the cleaning of the bonding surface may also be considered as a part of the activation.

As a method of activating the substrate 210, in addition to radical irradiation by DC plasma, RF plasma, and MW excitation plasma, irradiation by sputter etching, ion beam, high-speed atom beam and so on using inert gases can be also exemplified. Further, activation by ultraviolet irradiation, ozone asher and so on can also be exemplified. Further, a chemical cleaning treatment using a liquid or gaseous etchant can be exemplified.

Furthermore, the surface of the substrate 210 may also be hydrophilized by applying pure water or the like on the surface to be the bonding surface of the substrate 210 using a hydrophilizing device not illustrated. By this hydrophilization, the surface of the substrate 210 becomes to be in a state where OH groups are attached, that is, a state where it is terminated with OH groups. It is noted that another activation device instead of the activation devices 323 and 343 may also be provided in a place different from the bonding unit 300 and the substrate 210 activated in advance may also be carried into the bonding unit 300.

The bonding unit 300 further includes a control unit 150. The control unit 150 controls the operations of the X-direction driving unit 331, the Y-direction driving unit 332, the Z-direction driving unit 333, the activation device 323, and the activation device 343.

It is noted that prior to bonding the substrate 210, the control unit 150 calibrates the relative positions of the microscope 322 and the microscope 342 in advance. The calibration of the microscope 322 and the microscope 342 can be performed, for example, by causing the microscope 322 and the microscope 342 to focus on a common focal point F and observe each other. Further, the common standard index may also be observed with the microscope 322 and the microscope 342.

Figure 4:
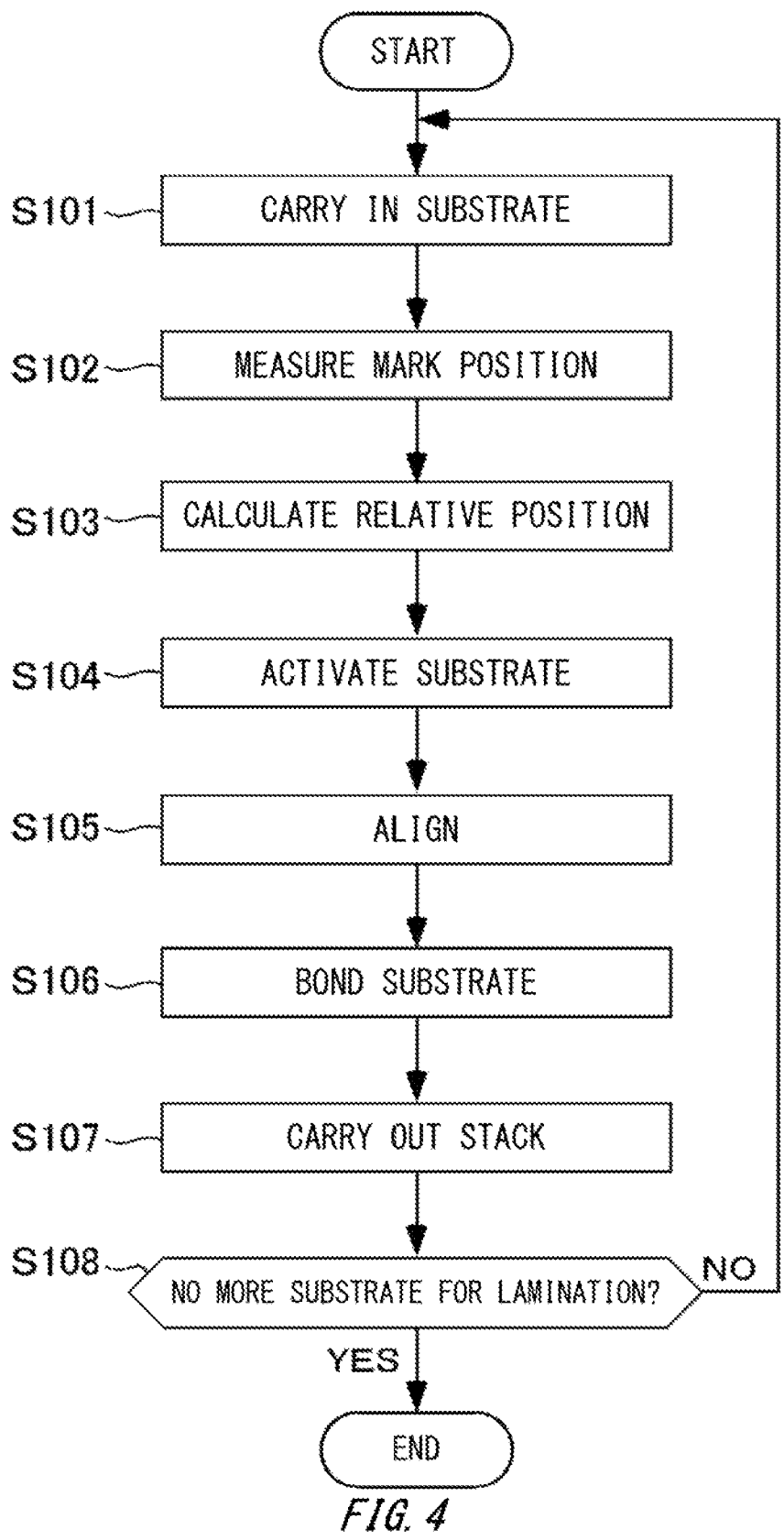
FIG. 4 is a flow diagram indicating an operation procedure of the bonding unit 300.
Figure 5:
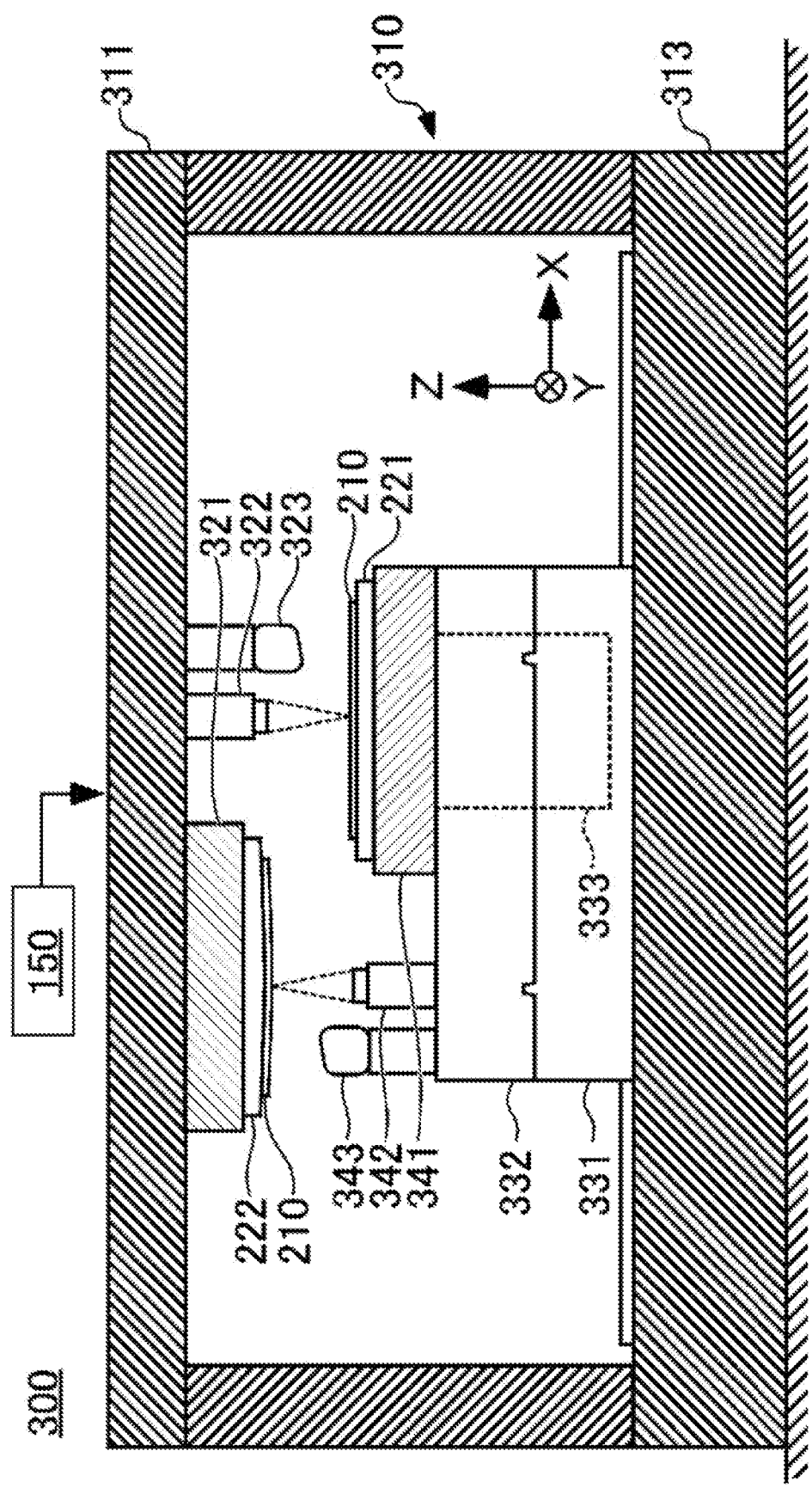
FIG. 5 is a schematic cross sectional view indicating the operations of the bonding unit 300.
Figure 6:
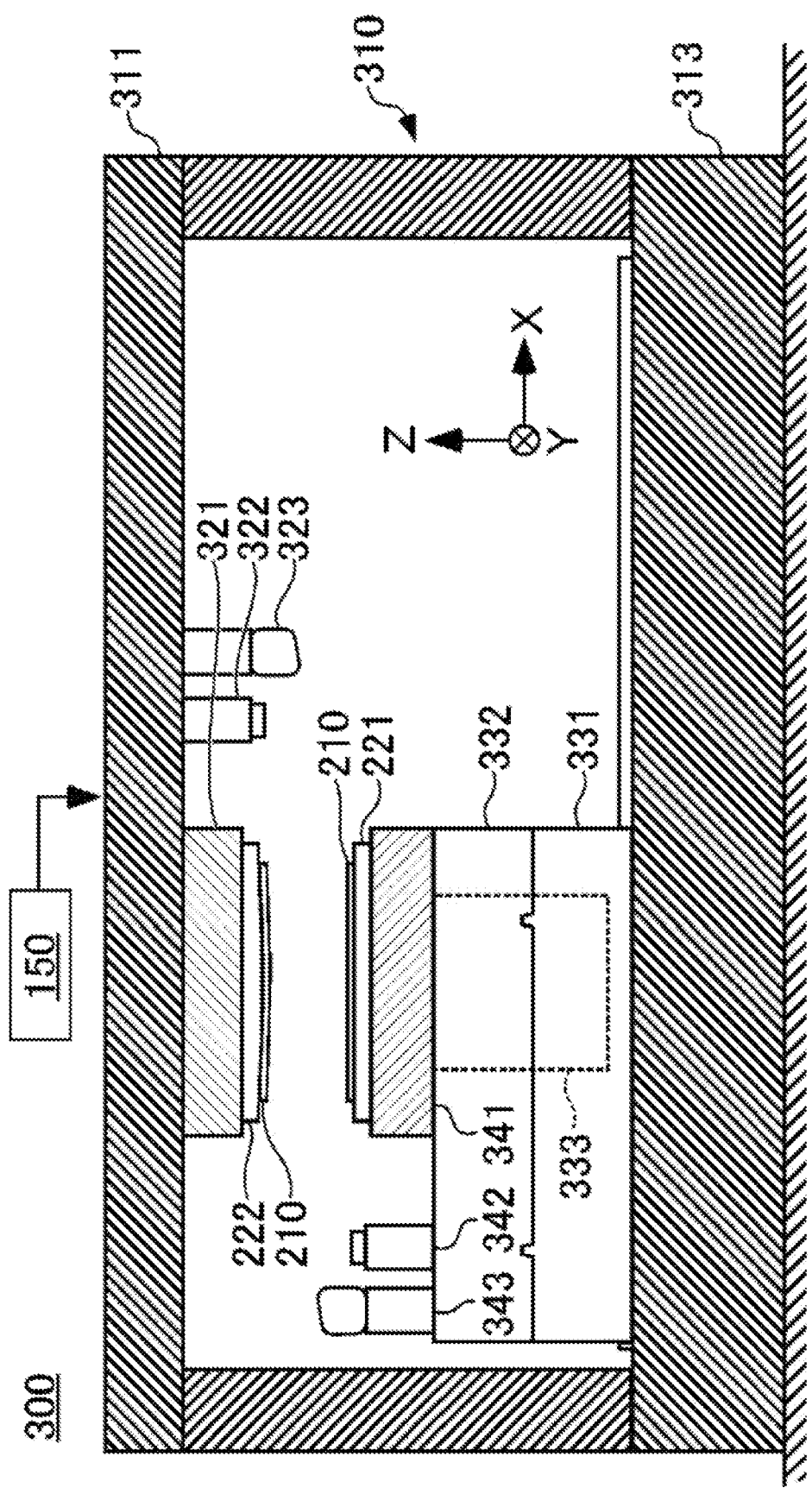
FIG. 6 is a schematic cross sectional view indicating the operations of the bonding unit 300.
Figure 7:
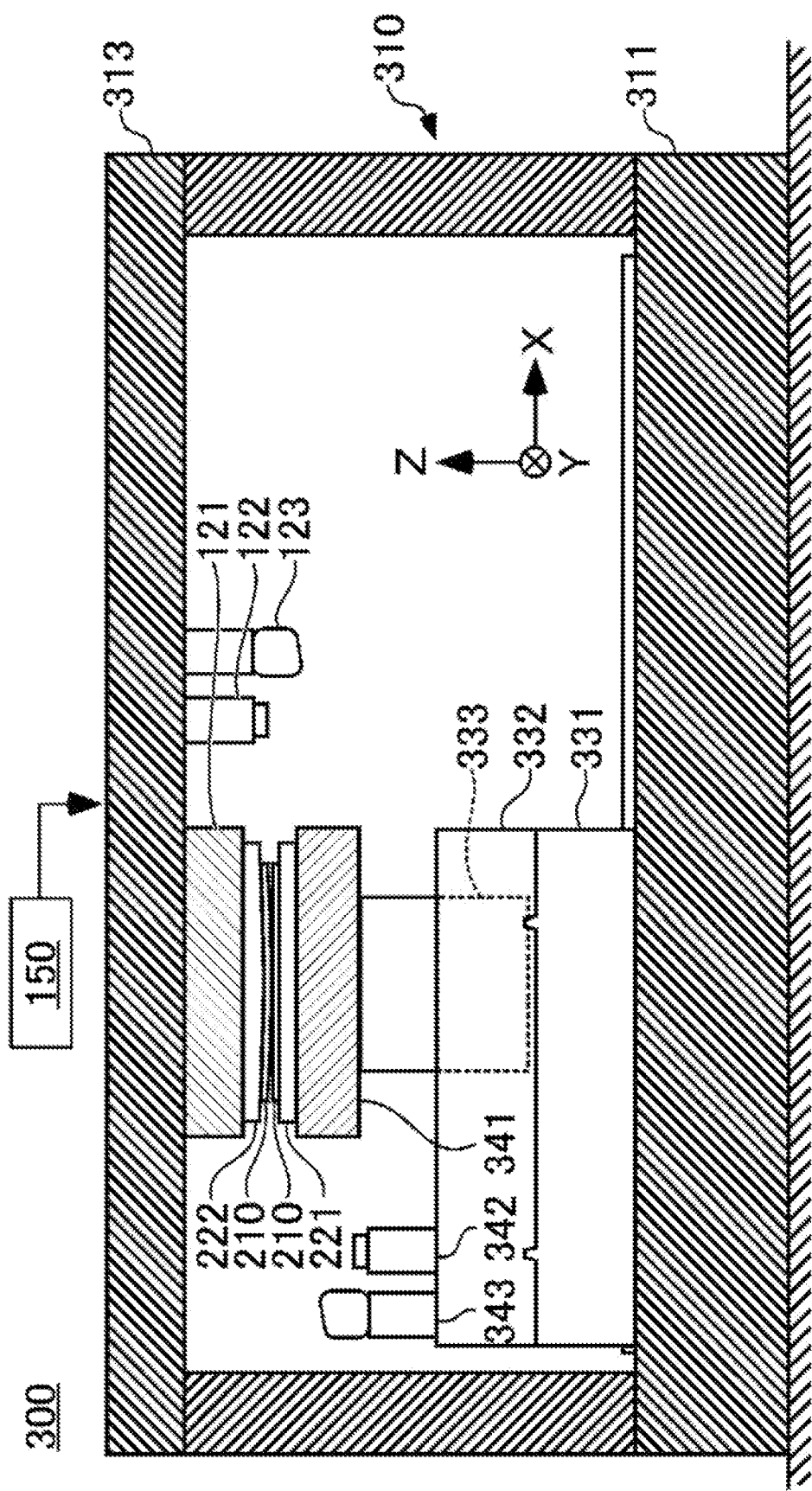
FIG. 7 is a schematic cross sectional view indicating the operations of the bonding unit 300.

FIG. 4 illustrates a flow diagram indicating a procedure for performing bonding for once using the bonding unit 300. Also, FIG. 5 to FIG. 7 illustrate schematic cross sectional views indicating the operations of the bonding unit 300 in various stages. An example in which the two substrates 210 are the objects to be bonded is described, but the objects to be bonded may also be the substrate 210 and the intermediate stack 230. Also, when the substrates 210 are bonded to each other, the substrates 210 with the same structure may be bonded to each other, and substrates with different structures may also be bonded to each other.

First, the control unit 150 instructs the transport unit 140 to carry the two substrates 210 that are objects to be bonded into the bonding unit 300 (step S101). Next, as shown in FIG. 5, the control unit 150 measures the position of the marks 218 on the substrate 210 using the microscopes 322 and 342 and the moving stage 341 (step S102). That is, a specific position in the visual field of the microscopes 322 and 342 is adjusted to the marks 218 by moving the moving stage 341. Since the position of the microscope 322 and the initial position of the microscope 342 are known, the control unit 150 can measure the absolute position of the marks 218.

Next, the control unit 150 calculates the relative position of the substrate 210 based on the position of the marks 218 obtained in step S102 (step S103). Furthermore, based on the calculated relative position of substrate 210, the control unit 150 calculates the amount of movement of the moving stage 341 which is necessary for aligning the substrate 210. The necessary amount of movement for alignment is calculated as the amount of movement of the moving stage 341 in the x and y directions and the rotation angle θ by a known method, for example, EGA (Enhanced Global Alignment) and so on. In this way, the control unit 150 becomes to be in a state where the substrate 210 can be aligned with reference to the specified marks 218.

Next, the control unit 150 scans the surface of the substrate 210 with plasma to activate the bonding surface of the substrate 210 by moving the moving stage 341 with the activation device 323 and the activation device 343 being operated, while the information of the amount of movement of the substrate 210 calculated for the alignment is maintained (step S104). The activated surface of the substrate 210 becomes to be in a state of being bonded by contact without medium such as an adhesive, or processings such as welding and pressure bonding.

Next, the control unit 150 moves the moving stage 341 based on the relative position calculated previously in step S103, and aligns the substrates 210 with each other as shown in FIG. 6 (step S105). Furthermore, as shown in FIG. 7, the control unit 150 operates the Z-direction driving unit 333 to raise the moving stage 341.

In this way, the substrate 210 rises, and eventually comes into contact with a part of the substrate 210 held by the moving stage 341 in a part of the region where the substrate 210 held by the fixed stage 321 protrudes downward. The substrate 210 whose surface has been activated in step S106 is bonded by hydrogen bonding, van der Waals bonding, covalent bonding and so on in a part of the contacted region. Furthermore, the intermediate stack 230 is formed, in which the two substrates 210 are laminated and bonded by releasing the holding of the entire substrate 210, enlarging the region bonded by the attracting force of the substrate 210 itself and eventually bonding the substrate 210 substantially over the entire surface (step S106).

The intermediate stack 230 formed in this way is carried out of the bonding unit 300 (step S107). Furthermore, the intermediate stack 230 is separated from the substrate holder 221 and is accommodated in the substrate cassette 130.

It is noted that in the case where the two substrates 210 are in a hydrogen bond by mutual contact, a covalent bond may also be generated between the substrates 210 by carrying the intermediate stack 230 into a heating apparatus such as an annealing furnace and heating after forming the intermediate stack 230. In this way, the bonding strength between the substrates 210 can be improved.

Next, the control unit 150 checks whether there is no more substrate 210 to be bonded from the substrate cassette 120 (step S108). When the substrate 210 to be bonded remains (step S108: NO), the control unit 150 returns the procedure to step S101, and repeats a series of bonding procedures from steps S102 to S108. When it is determined in step S108 that there is no more substrate 210 to be bonded (step S108: YES), the control unit 150 ends the control of the substrate laminating apparatus 100.

It is noted that in the above example, the fixed stage 321 has held the substrate holder 222 with the attracting surface rose in the center. However, the substrate holder 222 may also be held by the moving stage 341. Further, the attracting surface of the substrate holder 222 used for the purpose of contacting a partial region of the bonding surface of the substrate 210 may also have a local protrusion in addition to a shape having a curved surface as a whole. Further, the substrate 210 may also be pressed by another member penetrating the substrate holder 222 to partially contact the opposite substrate 210.

Also, in the example described above, the intermediate stack 230 has been formed by bonding the two substrates 210. However, the intermediate stack 230 and another third substrate 210 are further bonded using the bonding unit 300 to form a completed stack 240.

Figure 8:
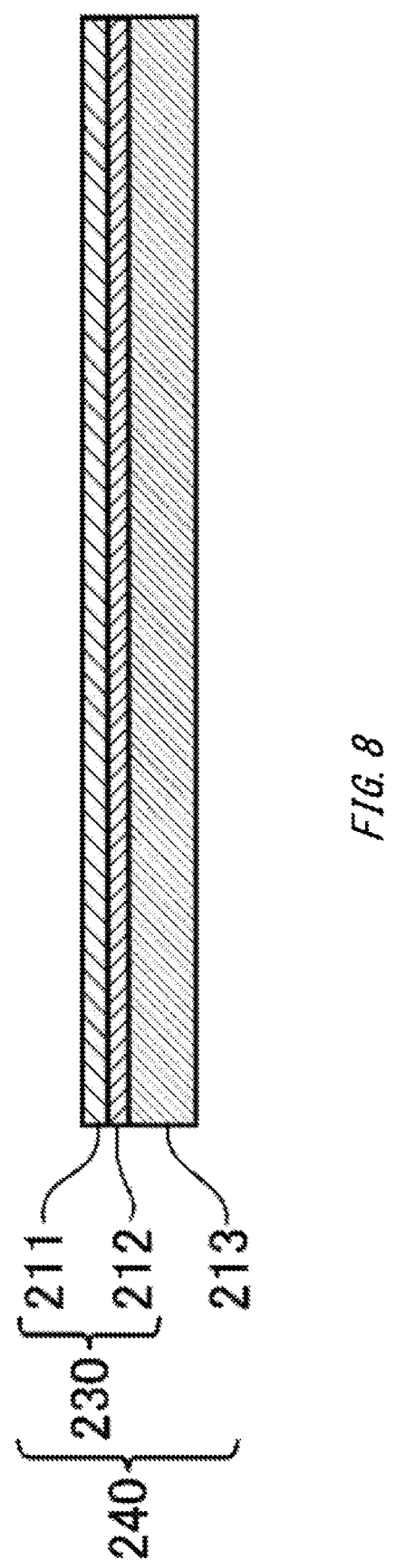
FIG. 8 is a cross sectional view of a completed stack 240.

FIG. 8 illustrates a cross sectional view indicating a specific example of the final form of the completed stack 240. The completed stack 240 is a stacked image sensor having a CIS (CMOS Image Sensor) substrate 211, a LOGIC substrate 212, and a DRAM substrate 213 that are sequentially bonded. Herein, each of the CIS substrate 211, the LOGIC substrate 212, and the DRAM substrate 213 is an example of a single substrate 210 to be laminated.

The CIS substrate 211 is alight receiving element substrate having a large number of light receiving elements arranged two-dimensionally at a high density, converting image light incident from the outside into electric signals, and outputting the electric signals. The LOGIC substrate 212 is a processing substrate that converts electric signals output from the CIS substrate 211 into image signals by performing digital conversion or the like. Furthermore, the DRAM substrate 213 is a memory substrate serving as a buffer that has a large number of memory cells, temporarily stores the image signals generated by the LOGIC substrate 212, and reduces the difference between the processing speed of the CIS substrate 211 and the LOGIC substrate 212, and the speed of the secondary recording medium for recording image signals.

The completed stack 240 is formed by firstly forming the intermediate stack 230 from the CIS substrate 211 and the LOGIC substrate 212, and then laminating the intermediate stack 230 and the DRAM substrate 213. Further, in the illustrated completed stack 240, the CIS substrate 211 and the LOGIC substrate 212 are thinned and are thinner than those when they have been bonded.

Figure 9:
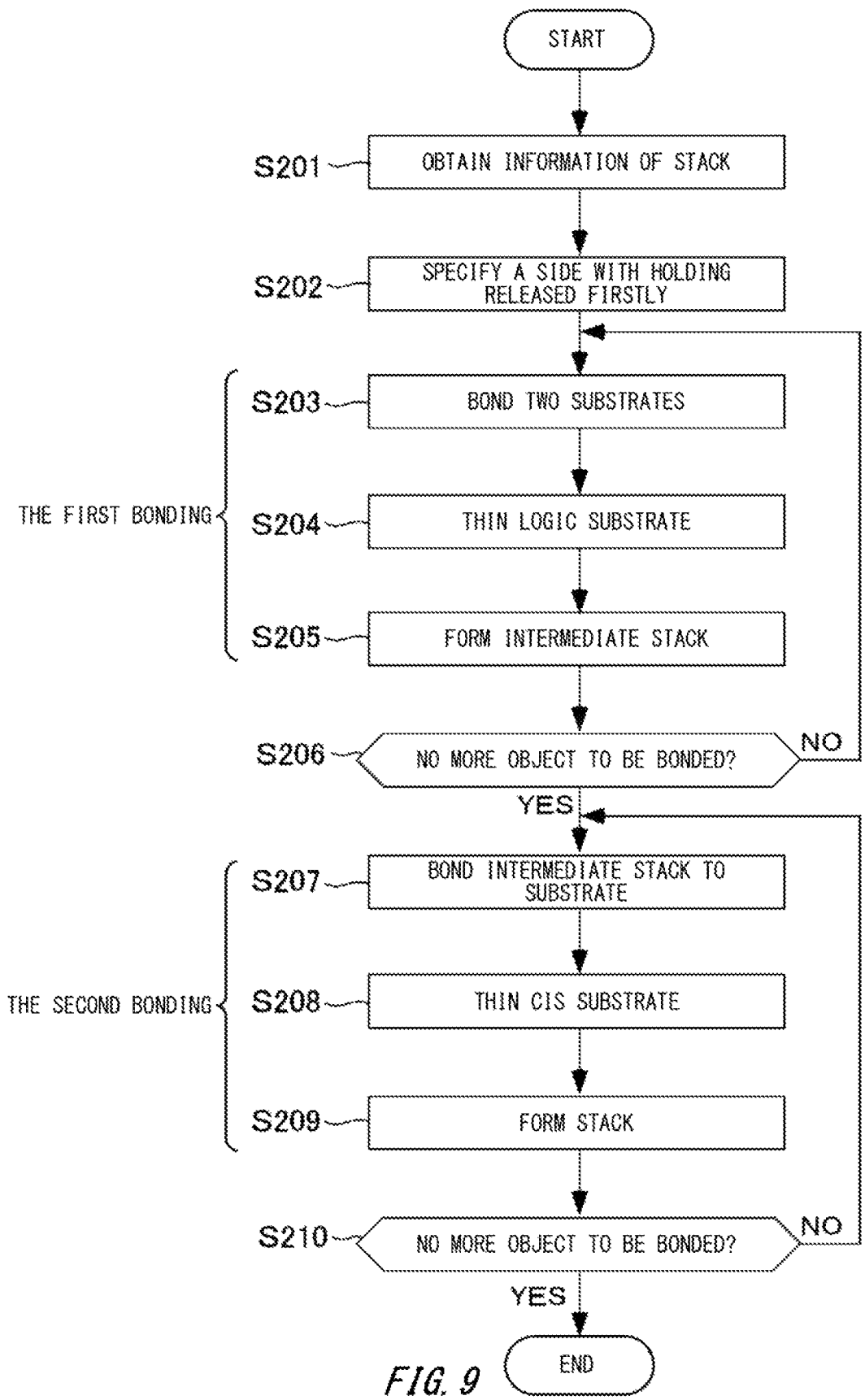
FIG. 9 is a flow diagram indicating a manufacturing procedure of the completed stack 240.

FIG. 9 illustrates a flow diagram indicating a manufacturing procedure of the completed stack 240 described above. First, the control unit 150 firstly obtains information related to the completed stack 240 to be manufactured (step S201).

The information obtained here includes information for specifying which of the layers formed by the CIS substrate 211, the LOGIC substrate 212, and the DRAM substrate 213 is to be thinned in the process of manufacturing the completed stack 240. Therefore, it can be said that the control unit 150 functions as an obtaining unit that obtains information for specifying which of the layers formed by the CIS substrate 211, the LOGIC substrate 212, and the DRAM substrate 213 is to be thinned. Further, the information obtained by the control unit 150 may also include information for specifying which holding is released and bonded when the CIS substrate 211 and the LOGIC substrate 212 are bonded to form the intermediate stack 230.

Next, based on the information obtained in step S201, the control unit 150 specifies which holding is released when the intermediate stack 230 and the DRAM substrate 213 are bonded (step S202). The specifying method is described below in reference with FIG. 10.

Next, the control unit 150 bonds the CIS substrate 211 and the LOGIC substrate 212 in the bonding unit 300 according to the procedure shown in FIG. 4 (step S203), and then instructs a thinning apparatus such as a mechanical chemical polishing apparatus arranged outside the substrate laminating apparatus 100 to thin the LOGIC substrate 212 (step S204). In this way, the first bonding in the manufacture of the completed stack 240 is completed, and the intermediate stack 230 is formed (step S205).

Herein, the control unit 150 checks whether any of the CIS substrate 211 and the LOGIC substrate 212 has been removed from the substrate cassette 120 or not (step S206). When both of the CIS substrate 211 and the LOGIC substrate 212 remain (step S206: NO), the control unit 150 returns the procedure to step S203, and repeats a series of bonding procedures from steps S203 to S205. When it is determined in step S206 that there is no more substrate 210 to be bonded (step S206: YES), the control unit 150 ends the first bonding in the bonding unit 300 and starts the second bonding described below.

In the second bonding, the control unit 150 bonds the formed intermediate stack 230 and the DRAM substrate 213 according to the procedure shown in FIG. 4. First, the control unit 150 bonds the DRAM substrate 213 to the thinned surface of the intermediate stack 230 formed by the CIS substrate 211 and the LOGIC substrate 212, that is, the LOGIC substrate in the bonding unit 300 (step S207). In this bonding, the control unit releases any holding of the intermediate stack 230 and the DRAM substrate 213 specified in step S202, and facilitates the bonding.

Next, the control unit 150 instructs the thinning apparatus arranged outside the substrate laminating apparatus 100 to thin the CIS substrate 211 (step S208). In this way, the second bonding in the manufacture of the completed stack 240 is completed, and the completed stack 240 that is a stacked image sensor is formed (step S209).

Next, the control unit 150 checks whether any of the intermediate stack 230 and the DRAM substrate 213 is removed from the substrate cassette 120 or not (step S210). When both the intermediate stack 230 and the DRAM substrate 213 remain (step S210: NO), the control unit 150 returns the procedure to step S207, and repeats a series of bonding procedures from steps S207 to 209. When it is determined in step S210 that there is no more substrate 210 to be bonded (step S210: YES), the control unit 150 ends the second bonding in the bonding unit 300.

Figure 10:
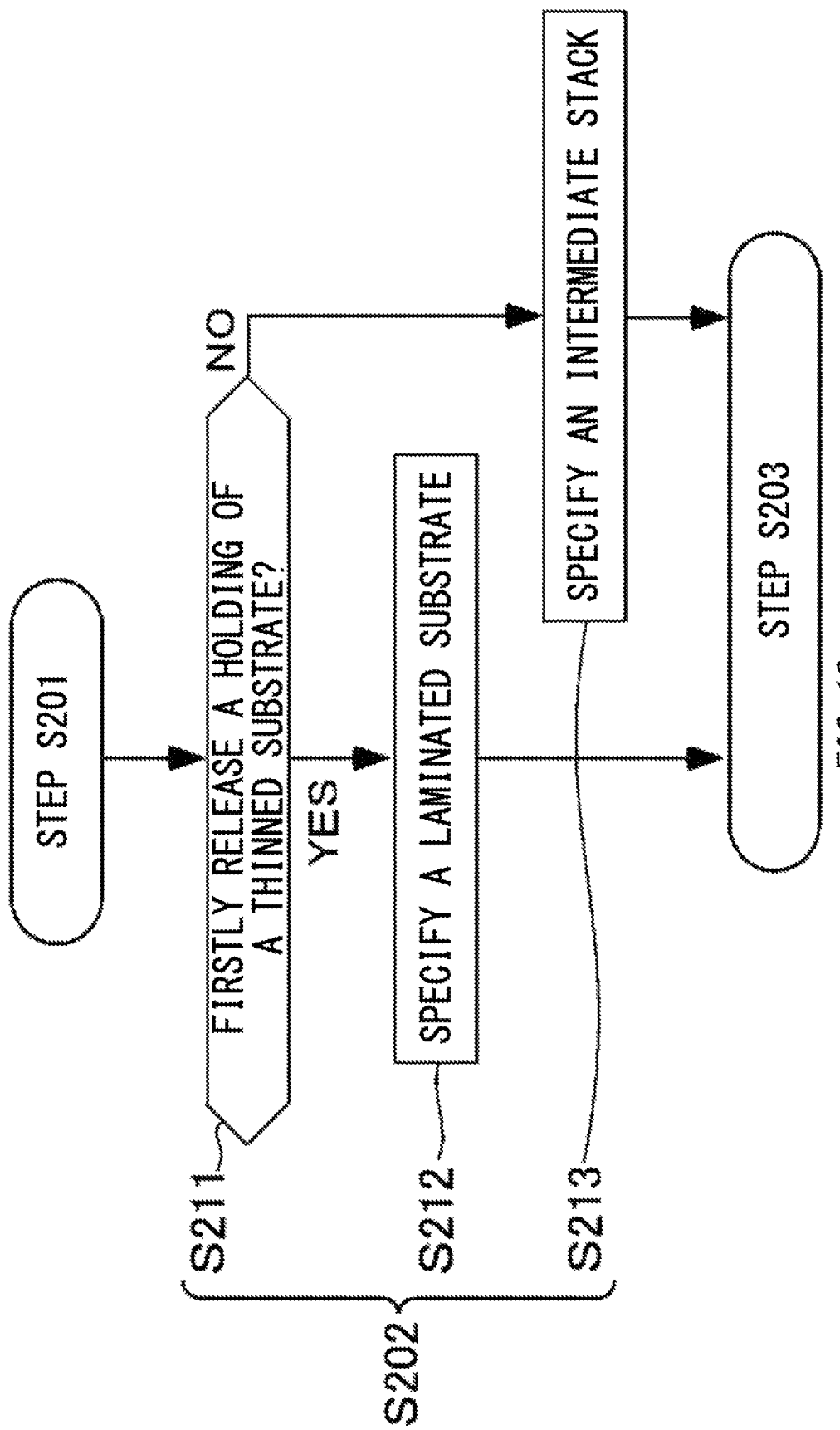
FIG. 10 is a flow diagram indicating a procedure for specifying the substrate 210 whose holding is released firstly when an intermediate stack 230 is bonded to a substrate.

FIG. 10 illustrates a flow diagram indicating a control procedure in the case of specifying a substrate whose holding is released in step S202 described above. First, based on the information obtained in step S201, the control unit 150 checks whether the procedure set for the first bonding is the procedure where the substrate of the CIS substrate 211 and the LOGIC substrate 212 whose holding is released in step S203 is the substrate thinned in step S204 (step S211).

In step S211, when it is determined that the holding of the LOGIC substrate 212 is released (step S211: YES), the control unit 150 specifies a substrate that is not the intermediate stack 230, that is, the DRAM substrate 213, as the substrate whose holding is released in the second bonding (step S212). Also, when it is determined in step S211 that the holding of the LOGIC substrate 212 is not released (step S211: NO), the control unit 150 specifies the intermediate stack 230 as the substrate whose holding is released in the second bonding (step S213). In this case, the control unit 150 can be said to function as a specifying unit, which specifies the DRAM substrate 213 when the substrate whose holding is released in the first bonding is thinned, and specifies the intermediate stack 230 when the substrate whose holding is not released is thinned. The reason for firstly specifying the substrate whose holding is released in the second bonding in such a procedure is described below.

It is noted that in the above example, according to the procedure shown in FIG. 10, the control unit 150 has firstly specified the substrate whose holding is released in the second bonding. However, the control unit 150 may also receive the specification of the side whose holding is released firstly for bonding from the outside. In other words, the following method can be performed with the bonding unit 300 that can designate a side to be released firstly for bonding, without using a dedicated device. In this case, it can be said that the control unit 150 functions as a reception unit for receiving instructions about which of the intermediate stack 230 and the DRAM substrate 213 has the holding to be released for bonding.

FIG. 11 illustrates a table indicating the choices of a manufacturing procedure of the completed stack 240. In the case where the completed stack 240 is manufactured using the bonding unit 300 under the control of the control unit 150, as shown in FIG. 11, there are four specific combinations of the substrates whose holdings are released firstly in the first bonding and the second bonding.

It is noted that in the process of manufacturing the completed stack 240 shown in FIG. 8, the CIS substrate 211 is thinned after the DRAM substrate 213 is laminated on the intermediate stack 230. According to such a procedure, the LOGIC substrate 212 can be thinned using the CIS substrate 211 as a support at a stage before the DRAM substrate 213 being laminated on the intermediate stack 230. Therefore, a procedure for attaching an additional support for thinning the LOGIC substrate 212 can be omitted. Therefore, even in the combination shown in FIG. 11, it is assumed that the LOGIC substrate 212 is thinned in step S204 of the procedure shown in FIG. 9, and the CIS substrate 211 is thinned in step S208 of the second bonding.

FIG. 12 illustrates distortions appearing in the respective layers of the CIS substrate 211, the LOGIC substrate 212, and the DRAM substrate 213 that form the completed stack 240 when the completed stack 240 is formed by the procedure of the combination shown in FIG. 11. Here, the distortion 1 means a relative difference between the distortions generated in the bonding process in the CIS substrate 211 and the LOGIC substrate 212 respectively bonded in the first bonding. Also, the distortion 2 means a relative difference between the distortions generated in the bonding process in the intermediate stack 230 and the DRAM substrate 213 respectively bonded in the second bonding. The distortion 1' means that the distribution of the distortion is inverted from the distortion 1 with respect to the Y axis of the substrate surface due to the fact that the LOGIC substrate 212 is inverted from that in the first bonding and bonded in the second bonding.

In addition, in each of the above-described distortion 1 and distortion 2, the distortion of the substrate whose holding is released is regarded as a distortion with a positive sign. The distortion 1 and the distortion 2 become approximately equal to the distortions generated in the substrates whose holdings are released, when the distortions generated in the substrates whose holding remain unreleased are small enough to be negligible in the bonding of the CIS substrate 211 and the LOGIC substrate 212, or the LOGIC substrate 212 and the DRAM substrate 213. In other words, the distortion 1 and the distortion 2 are distortions remained on the thinned substrate as a result of thinning after bonding the substrates in the first bonding or the second bonding.

Furthermore, FIG. 13 illustrates a table indicating differences of the distortions generated between the layers in the completed stack 240 when the bonding is performed with the combinations shown in FIG. 11. Herein, the layers correspond to the CIS substrate 211, the LOGIC substrate 212, and the DRAM substrate 213 that form the completed stack 240. The distortions generated in the CIS substrate 211, the LOGIC substrate 212, and the DRAM substrate 213 bonded as the completed stack 240 are distributed according to the rigidity of each substrate.

It is noted that the above-described distortions correspond to the distribution of the stress in each of the CIS substrate 211, the LOGIC substrate 212, and the DRAM substrate 213. When the restraint of the substrates by the substrate holder 221 or the like is released, the stress generated in the CIS substrate 211, the LOGIC substrate 212, and the DRAM substrate 213 causes the CIS substrate 211, the LOGIC substrate 212, and the DRAM substrate 213 to deform and causes the structure provided on each substrate to be displaced from the design coordinates, that is, a design position.

In the present embodiment, the distortion that can be generated in each of the substrates 210 including the CIS substrate 211, the LOGIC substrate 212, and the DRAM substrate 213 includes a plane distortion and a three-dimensional distortion. Further, the plane distortion in the substrate 210 may include a magnification distortion and an orthogonal distortion.

The magnification distortion is a distortion in which the amount of misalignment of a structure on the substrate 210 from the center of the substrate 210 increases linearly at a constant increasing rate in a certain radial direction. When the two substrates 210 are laminated, the magnification distortion generated in each of the two substrates 210 is reflected on the misalignment between the substrates 210. The value of the magnification distortion is obtained by dividing the shift amount from the design position at a distance r from the center of the substrate 210 by the distance r, and the unit is ppm.

Furthermore, the magnification distortion may be generated as an isotropic magnification distortion, or may be generated as an anisotropic magnification distortion. When the magnification distortion is generated as an isotropic magnification distortion, the X component and the Y component of the misalignment vector of the structure due to the distortion are equal. Accordingly, when the isotropic magnification distortion is generated, the change in the magnification of the substrate 210 in the X direction is equal to the change in the magnification in the Y direction. When the magnification distortion is generated as an anisotropic magnification distortion, the X component and the Y component of the misalignment vector from the design position of the structure are different, and the magnification in the X direction and the magnification in the Y direction of the substrate 210 are different.

In addition, a plane distortion can be classified into a linear distortion and a nonlinear distortion. The linear distortion is a distortion capable of representing a position at which a structure on the substrate 210 is displaced from a design position due to the distortion by a linear transformation. A nonlinear distortion is a distortion that cannot be represented by a linear transformation. Regarding the above-described magnification distortion, an anisotropic magnification distortion is classified as a nonlinear distortion. A nonlinear distortion is caused by, for example, crystal anisotropy of the substrate 210 and processing in the manufacturing process of the substrate 210. In addition, the nonlinear distortion may also be generated according to the rigidity distribution due to the arrangement of the structural bodies formed on the substrate 210.

The orthogonal distortion generated as a plane distortion in the substrate 210 is a distortion in which a structure is displaced in a direction parallel to the X axis from the design position when the orthogonal coordinates X-Y with the center of the substrate being the origin are set, and becomes larger as the structure becomes further away from the origin in the Y axis direction. Also, the amount of misalignment of the structure due to the orthogonal distortion is equal in each of the plurality of regions crossing the Y axis in parallel with the X axis, and the absolute value of the amount of misalignment increases as the distance away from the X axis increases. Also, in the amount of misalignment due to the orthogonal distortion, the direction of the positive misalignment with respect to the Y axis and the direction of the negative misalignment with respect to the Y axis are opposite to each other.

In contrast to the above-described plane distortion, the three-dimensional distortion generated in the substrate 210 is a distortion that causes a misalignment of a structure in a direction intersecting with the surface of the substrate 210, and is manifested as a bending of the substrate 210. Herein, the bending means that a curving is generated in whole or in a part of the substrate 210. A curving refers to a state in which the surface of the substrate 210 has changed to a shape including a point that does not exist on a plane specified by three points on the surface of the substrate 210.

Also, the bending is distortion in which the surface of the substrate 210 forms a curved surface, and includes a warpage. A warpage refers to a distortion remained on the substrate 210 in a state where the influence of gravity on the distortion of the substrate 210 is eliminated. The distortion that causes the curving in the substrate 210 is referred to as a deflection in the present embodiment when the warpage is affected by gravity. The warpage includes a global warpage in which the entire substrate 210 bends at a substantially uniform curvature, and a local warpage in which a curvature changes and bends in a part of the substrate 210.

The above-described magnification distortion can be classified into an initial magnification distortion, an attraction magnification distortion, and a lamination process magnification distortion, depending on the cause of the generation.

The initial magnification distortion is a distortion that has already been generated in each of the substrates 210 from the stage before lamination, and is to be generated due to a periodic change in rigidity or the like caused by the arrangement of the stress, scribe lines 217, and circuit regions 219 and so on generated in the process of forming the marks 218, the circuit regions 219 and so on the substrate 210. The initial magnification distortion is manifested as a state in which the position of the structure on the substrate 210 deviates from the design position on the substrate 210. The initial magnification distortion can be known before the lamination of the substrate 210 is started. The information related to the initial magnification distortion may also be obtained by measuring the substrate 210 immediately before the lamination, or may also be obtained at the lamination step as the measurement information at the step of manufacturing the substrate 210.

Attraction magnification distortion is a distortion generated when the shape of the substrate 210 and the shape of the attracting surface of a holding member such as the substrate holders 221 and 223 that hold the substrate 210 are different. When the holding member attracts the substrate 210 by a holding mechanism such as an electrostatic chuck or a vacuum chuck, the substrate 210 becomes a shape according to the attracting surface of the holding member. Therefore, when the shape of the substrate 210 is different from the shape of the attracting surface of the holding member, the substrate 210 is deformed by attracting the substrate 210 to the holding member, and the state of the distortion changes.

In addition, when a distortion such as a warpage is generated in the substrate 210, the magnitude of the attraction magnification distortion can be calculated from the state of the distortion including the warpage amount, the warpage shape and so on of the substrate 210, by checking the correlation between the distortion and the attraction magnification distortion in advance. Therefore, by adjusting the shape of the attracting surface by preparing a plurality of holding members with different shapes of the attracting surface and so on, the attraction magnification distortion may also be positively used to correct the distortion of the substrate 210.

A lamination process magnification distortion is a magnification distortion newly generated in the lamination process by stacking and bonding the substrates 210. When the substrates 210 are laminated to each other, the bonding of the substrates 210 starts to expand from a part of the bonding surface of the substrates 210, and finally covers substantially the entire substrate 210. Therefore, in the substrate 210 in the bonding process, at least one of the substrates 210 has deformation generated near the boundary between the region that has been already bonded and adhered to the other substrate and the region that has not been in contact with and is to be bonded to the other substrate. A part of the generated deformation becomes a lamination process magnification distortion when the substrates 210 are fixed by being laminated with each other.

Among the various distortions of the substrate 210 as described above, there is a type in which the distribution of the distortion appearing on the surface to be bonded does not change even when the substrate 210 is inverted for bonding. Further, there is a type such as the lamination process magnification distortion, which can control which of a positive distortion and a negative distortion is generated while the distribution pattern is the same, according to the bonding procedure.

FIG. 14 to FIG. 18 illustrate the nonlinear distortions generated in the CIS substrate 211 and the LOGIC substrate 212 in the first bonding process, when the procedure of the implementation 1 shown in the table of FIG. 11 is performed. As shown in FIG. 11, in the implementation 1, the holding of the LOGIC substrate 212 is firstly released in the first bonding. In the implementation 1, the LOGIC substrate 212 is the first substrate, and the CIS substrate 211 is the second substrate.

Figure 14:
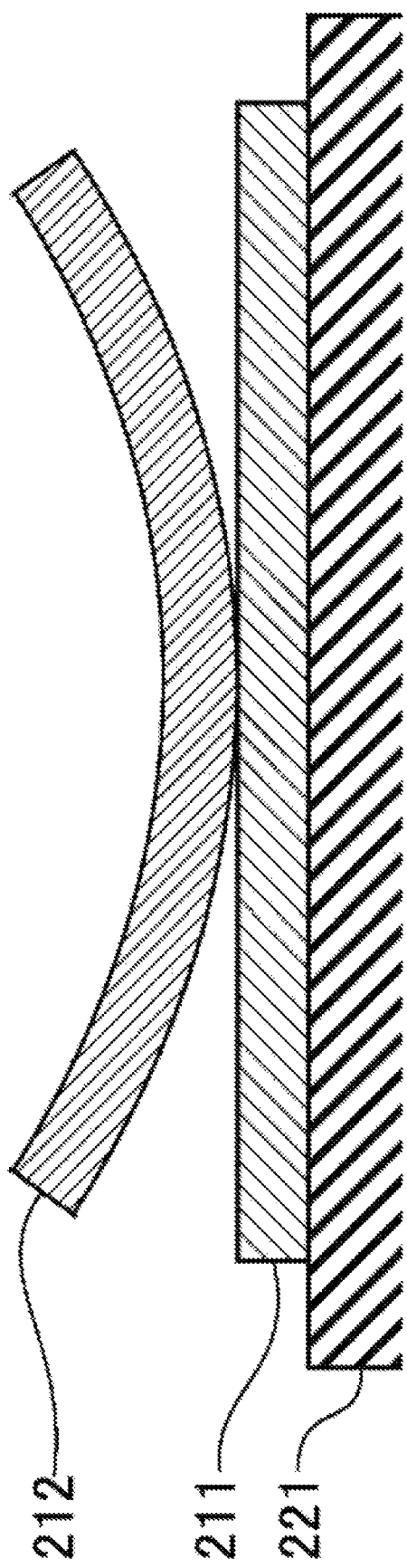
FIG. 14 illustrates a bonding process of a CIS substrate 211 and a LOGIC substrate 212.

As shown in FIG. 14, at the time point when the LOGIC substrate 212 has the holding released and is bonded, the CIS substrate 211 is attracted by the substrate holder 221 with a flat attracting surface and is fixed in a flat state.

Figure 15:
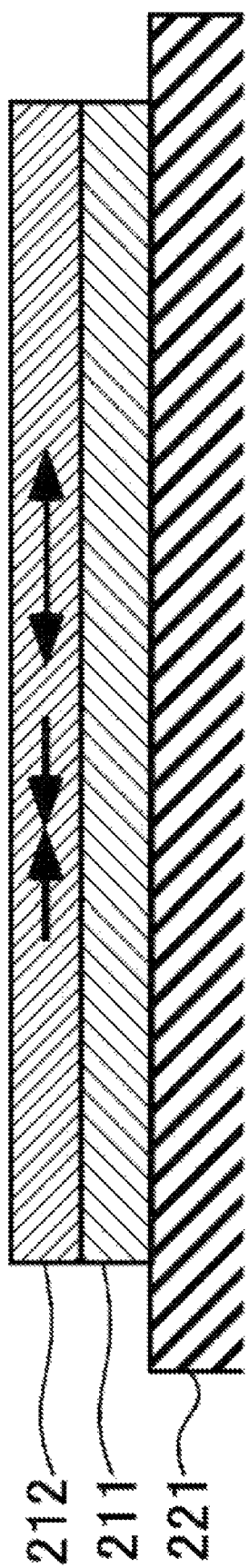
FIG. 15 illustrates a bonding process of the CIS substrate 211 and the LOGIC substrate 212.
Figure 16:
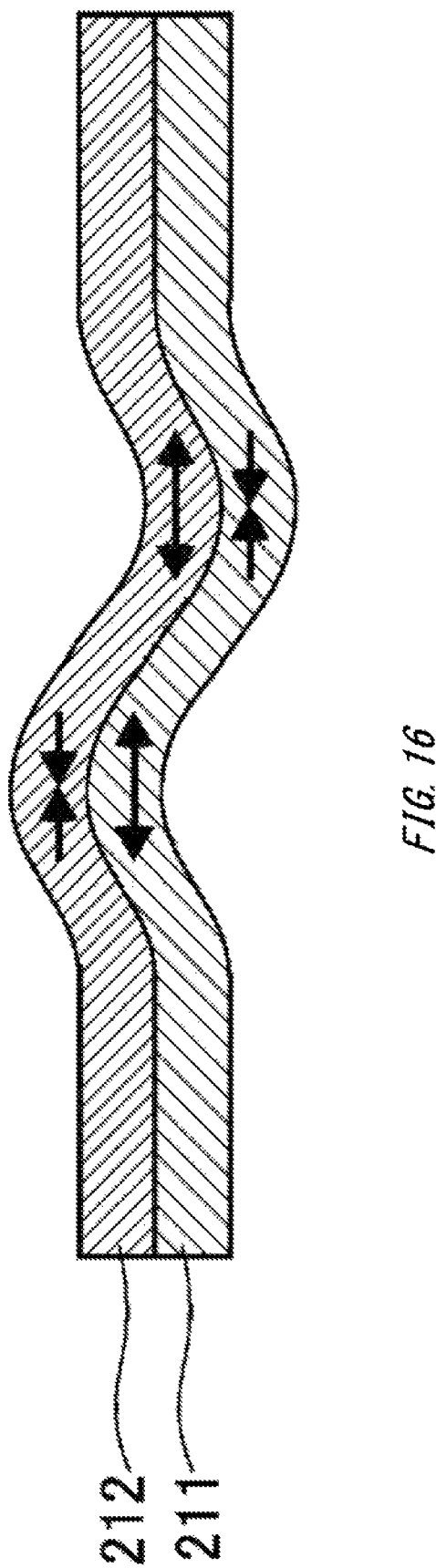
FIG. 16 illustrates a bonding process of the CIS substrate 211 and the LOGIC substrate 212.

Therefore, as shown in FIG. 15, at the stage when the CIS substrate 211 and the LOGIC substrate 212 are bonded, the distortion caused by the bonding is generated in the LOGIC substrate 212 whose holding has been released before the CIS substrate 211. Next, as shown in FIG. 16, when the holding of the CIS substrate 211 by the substrate holder 221 is released, deformations involving warpages are generated in the bonded CIS substrate 211 and the LOGIC substrate 212 due to the stress generated in the layer of the LOGIC substrate 212, and distortions in opposite directions to each other are generated in both of the CIS substrate 211 and the LOGIC substrate 212.

Figure 17:
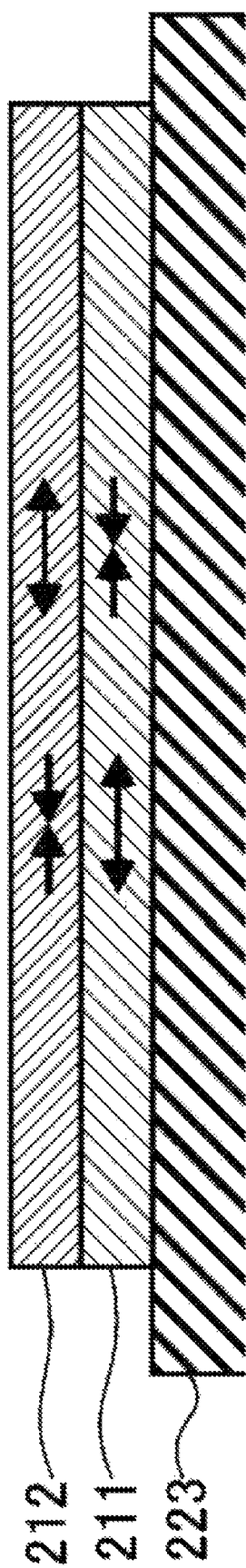
FIG. 17 illustrates a bonding process of the CIS substrate 211 and the LOGIC substrate 212.
Figure 18:
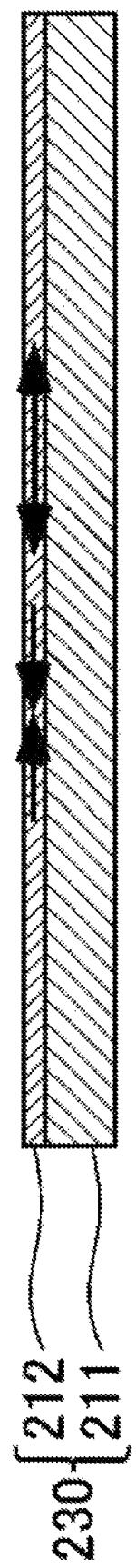
FIG. 18 is a cross sectional view of the intermediate stack 230.

Subsequently, as shown in FIG. 17, the CIS substrate 211 is attracted to a flat substrate holder 223 as a jig for thinning, and the CIS substrate 211 and the LOGIC substrate 212 are forcibly flattened. In this way, the distortion is distributed to each of the bonded CIS substrate 211 and LOGIC substrate 212 according to the rigidity. Further, as shown in FIG. 18, when the holding by the substrate holder 223 to the intermediate stack 230 formed by thinning the LOGIC substrate 212 is released, the distortion of the entire intermediate stack 230 is biased to the layer of the LOGIC substrate 212 with a decreased rigidity due to the thinning, and the distortion of the CIS substrate 211 is significantly reduced.

Figure 19:
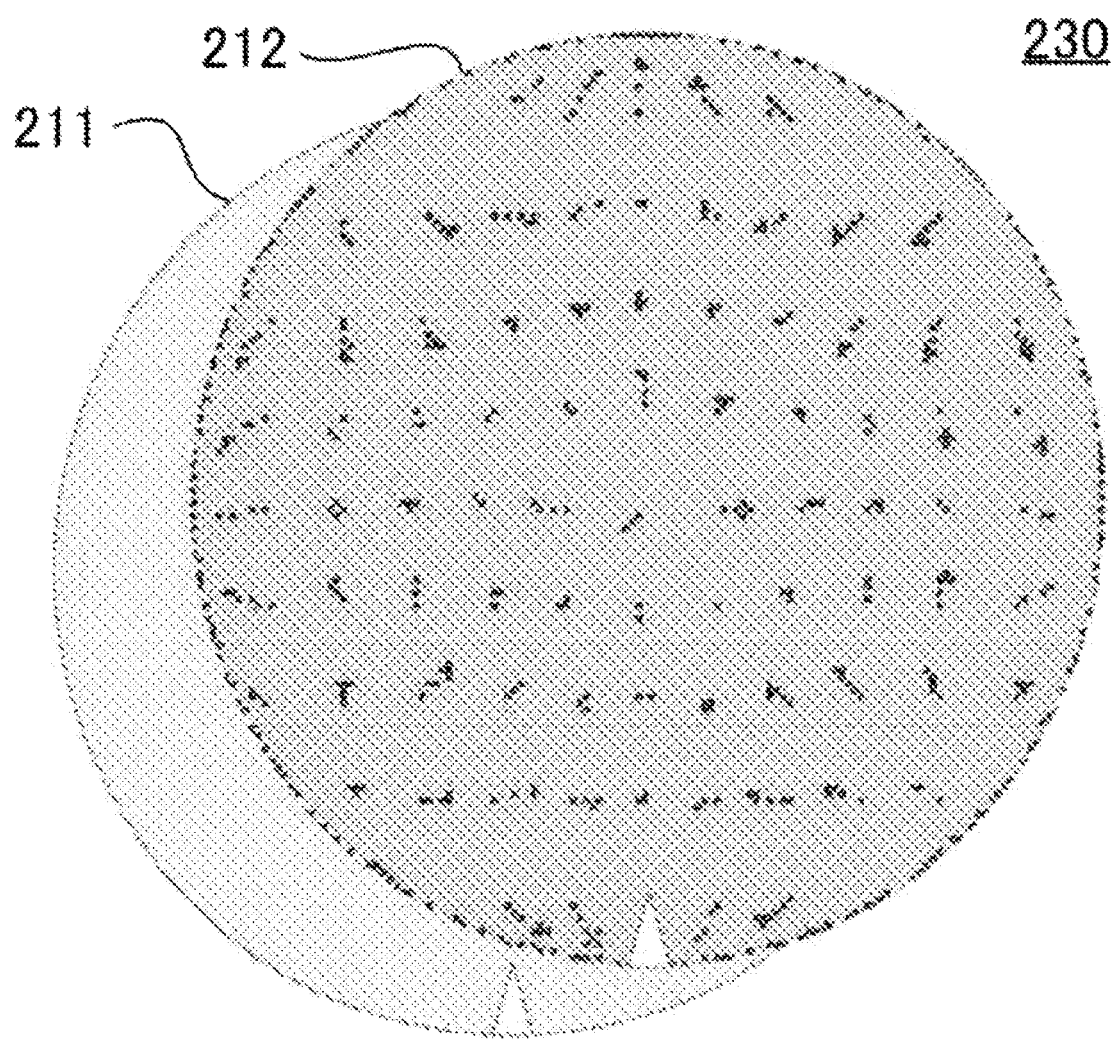
FIG. 19 is a schematic view indicating a distribution of a distortion in the manufacturing process of the intermediate stack 230.
Figure 20:
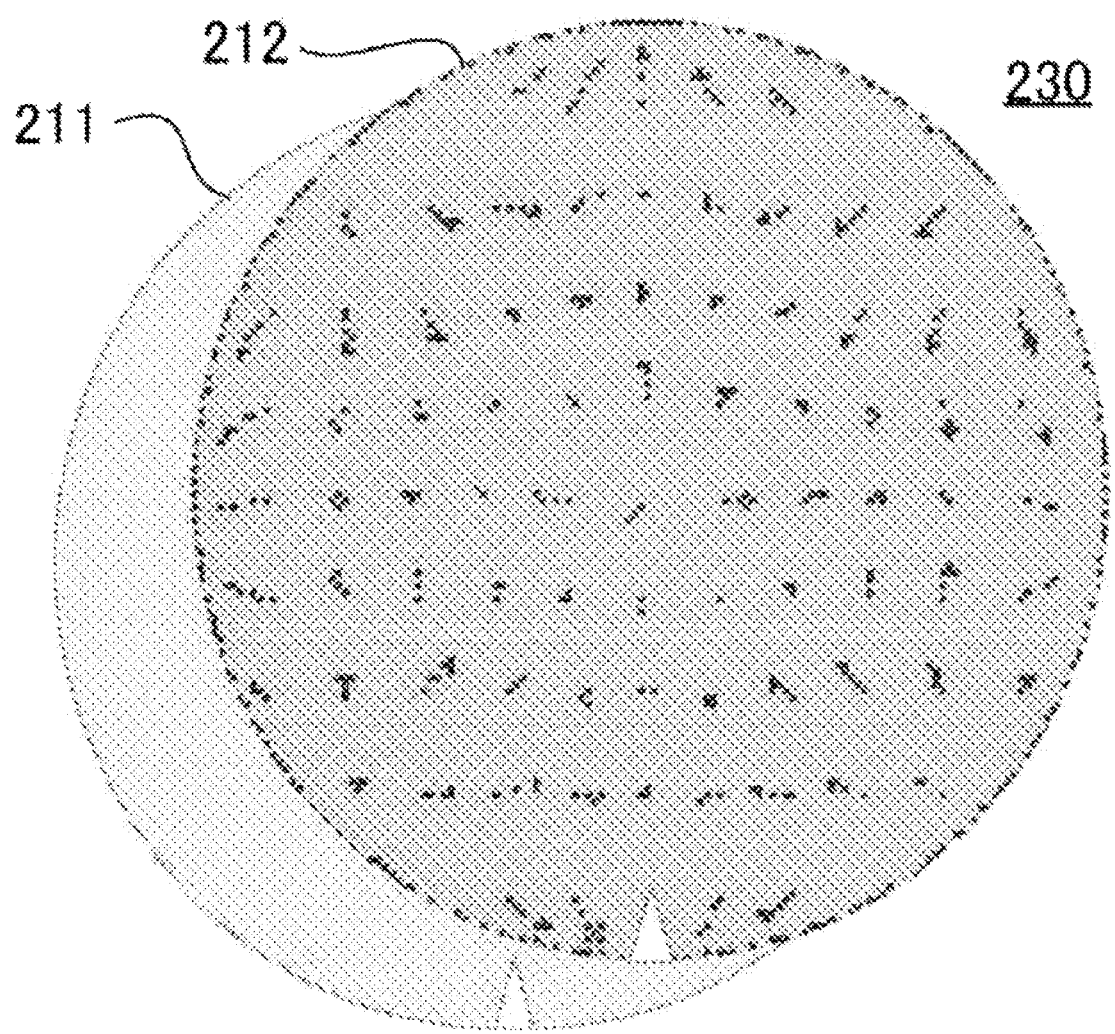
FIG. 20 is a schematic view indicating a distribution of a distortion in the intermediate stack 230.

FIG. 19 illustrates a schematic planar view indicating a distribution of a nonlinear distortion when the bonded CIS substrate 211 and LOGIC substrate 212 are at a state of being held by the substrate holder 221 as shown in FIG. 15. Also, FIG. 20 illustrates a planar view schematically indicating a distribution of a nonlinear distortion in the intermediate stack 230 shown in FIG. 18. As can be seen from a comparison between FIG. 19 and FIG. 20, a large part of the distortion generated in the LOGIC substrate 212 due to the first bonding is transferred to the LOGIC substrate 212 even in the intermediate stack 230.

FIG. 21 to FIG. 25 illustrate the nonlinear distortions generated in each layer of the CIS substrate 211 and the LOGIC substrate 212 in the intermediate stack 230 and the DRAM substrate 213 in the second bonding process when the procedure of the implementation 1 shown in the table of FIG. 11 is performed. As shown in FIG. 11, in the implementation 1, the holding of the DRAM substrate 213 is firstly released in the second bonding. In the implementation 1, the DRAM substrate 213 is the third substrate.

Figure 21:
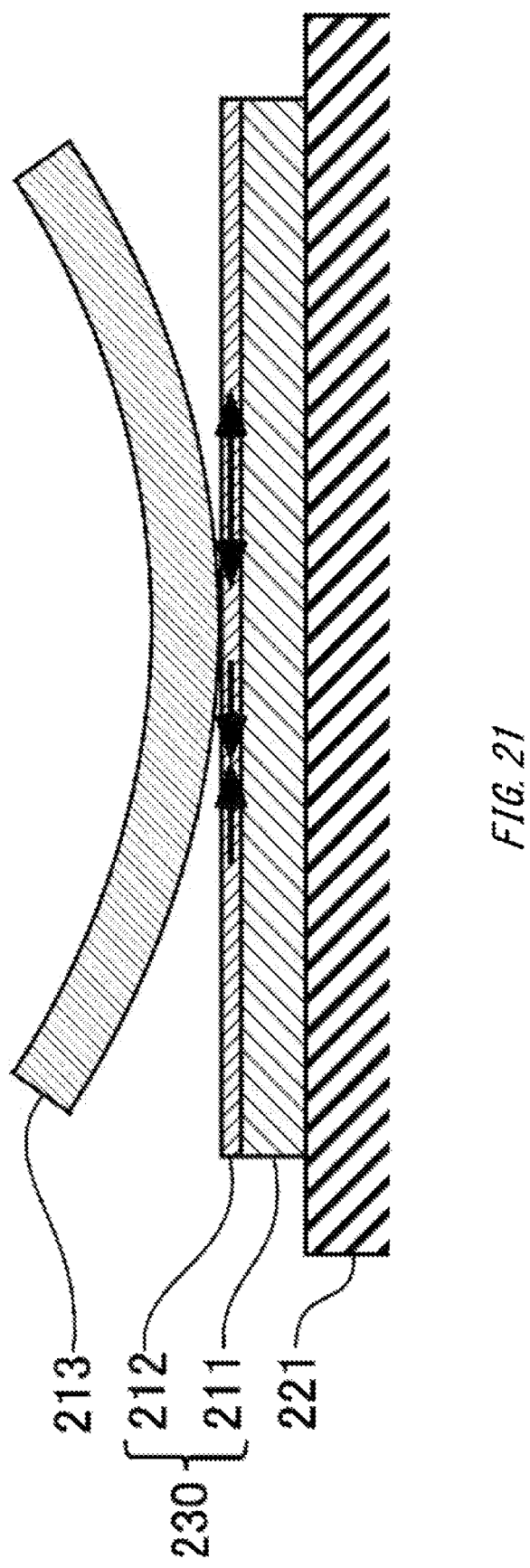
FIG. 21 illustrates a bonding process of the intermediate stack 230 and a DRAM substrate 213.
Figure 22:
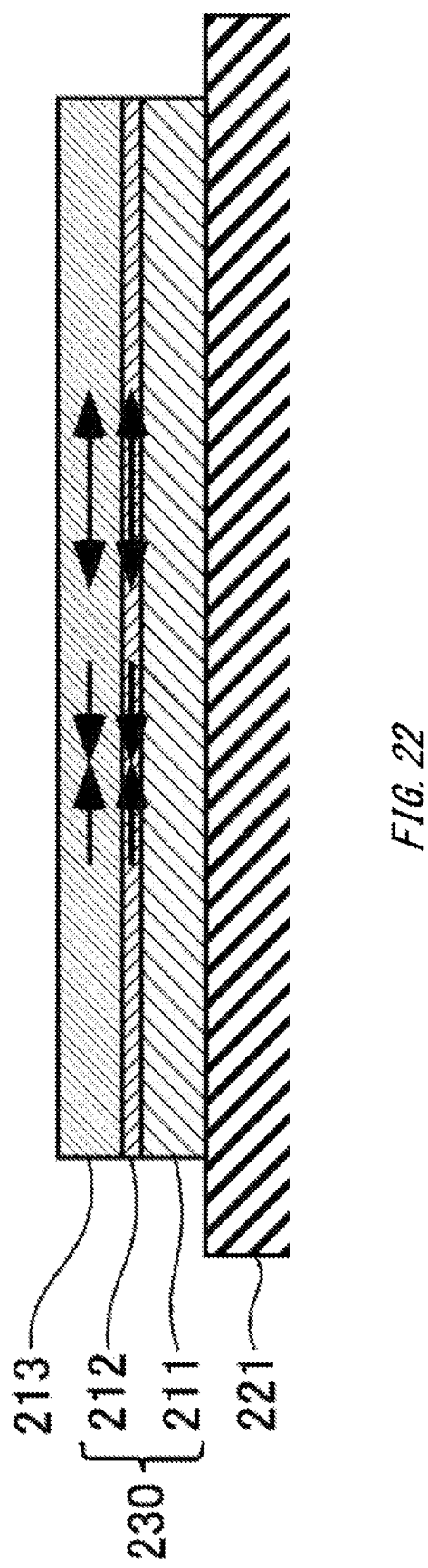
FIG. 22 illustrates a bonding process of the intermediate stack 230 and the DRAM substrate 213.

As shown in FIG. 21, at the point of time when the holding of the DRAM substrate 213 is released and the bonding is started, the intermediate stack 230 is attracted by the substrate holder 221 with a flat attracting surface, and is fixed in a flat state. Therefore, as shown in FIG. 22, at the stage when the intermediate stack 230 and the DRAM substrate 213 are bonded, a distortion due to bonding is generated on the side of the DRAM substrate 213, but at least a part of this distortion is in the same shape as that of the distortion generated in the layer of the LOGIC substrate 212 of the intermediate stack 230, as shown in FIG. 18. In this way, it is possible to reduce the misalignment caused by the difference between the distortion generated in the LOGIC substrate 212 and the distortion generated in the DRAM substrate 213.

At this time, the bonding conditions for bonding the CIS substrate 211 and the LOGIC substrate 212 in the first bonding may also be determined, based on the information related to the distortion estimated to be generated in the DRAM substrate 213 in the case where the intermediate stack 230 and the DRAM substrate 213 has been bonded in the second bonding, so that the distortion generated in the DRAM substrate 213 and the distortion generated in the layer of the LOGIC substrate 212 of the intermediate stack 230 are the distortions in the same shape with each other. Alternatively, the bonding conditions for bonding the intermediate stack 230 and the DRAM substrate 213 in the second bonding may also be determined based on the information related to the distortion generated in the bonding of the CIS substrate 211 and the LOGIC substrate 212 in the first bonding.

If the distortion generated in the LOGIC substrate 212 when forming the intermediate stack 230 and the distortion generated in the DRAM substrate 213 when bonding the intermediate stack 230 and the DRAM substrate 213 are the distortions caused by the same type of reason, and the directions of the distortions are the same, the misalignment due to the difference between the distortion of the LOGIC substrate 212 and the distortion of the DRAM substrate 213 of the intermediate stack 230 is reduced.

In the example described above, at least the lamination process magnification distortion generated when bonding the CIS substrate 211 and the LOGIC substrate 212 to form the intermediate stack 230 and lamination process magnification distortion generated when bonding the intermediate stack 230 and the DRAM substrate 213 are correspondingly such distortions in the same shape with each other. It is noted that even if the distortions are caused by the same reason, distortions having the same sign with each other, that is, distortions generated in different directions, have the difference doubled between the distortions of the DRAM substrate 213 and the LOGIC substrate 212 when compared with the case where no distortion is generated in the DRAM substrate 213. As a result, in the completed stack 240, the misalignment between the DRAM substrate 213 and the LOGIC substrate 212 will increase.

Figure 23:
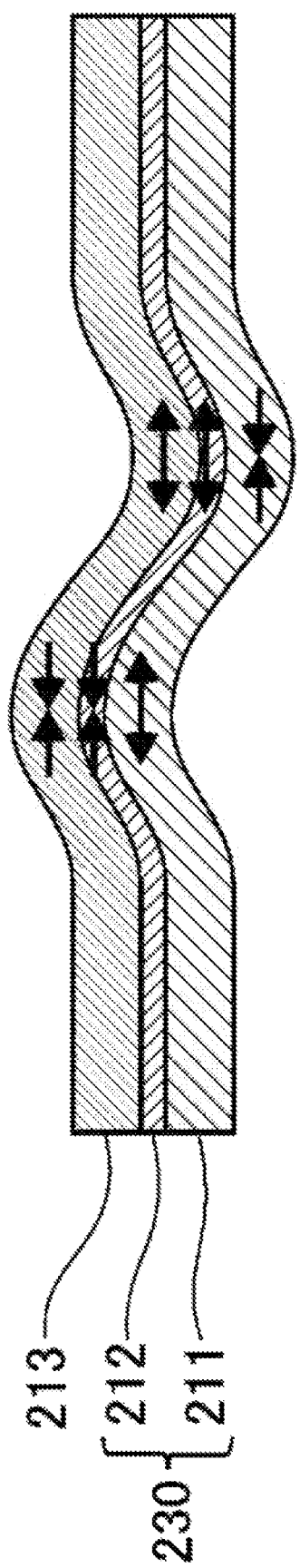
FIG. 23 illustrates a bonding process of the intermediate stack 230 and the DRAM substrate 213.

Next, as shown in FIG. 23, when the holding by the substrate holder 221 is released, a deformation together with a warpage is generated in the entire completed stack 240 due to the effect of the stress, together with the bonded intermediate stack 230 due to the stress generated in the DRAM substrate 213. Therefore, the intermediate stack 230 has a warpage generated in accordance with the DRAM substrate 213. At this time, the CIS substrate 211 and the LOGIC substrate 212 forming the intermediate stack 230 have a distortion opposite to that of the DRAM substrate 213 generated therein.

Figure 24:
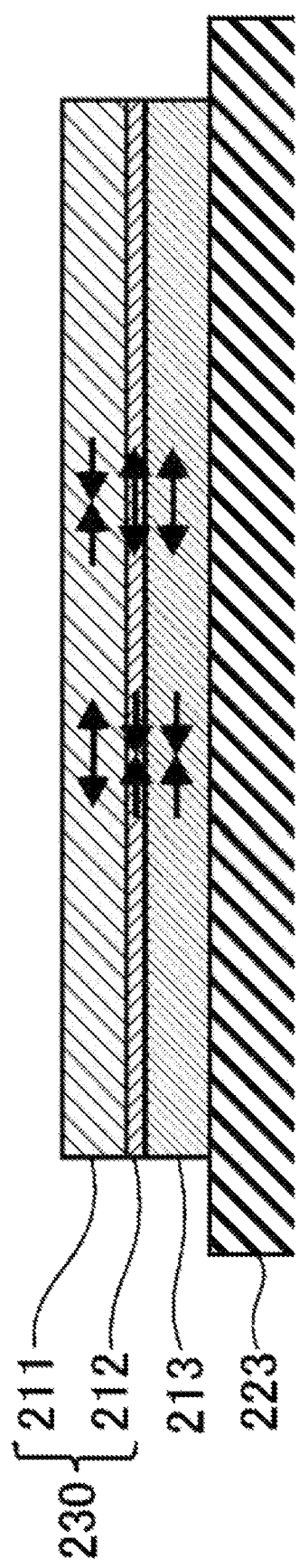
FIG. 24 illustrates a bonding process of the intermediate stack 230 and the DRAM substrate 213.
Figure 25:
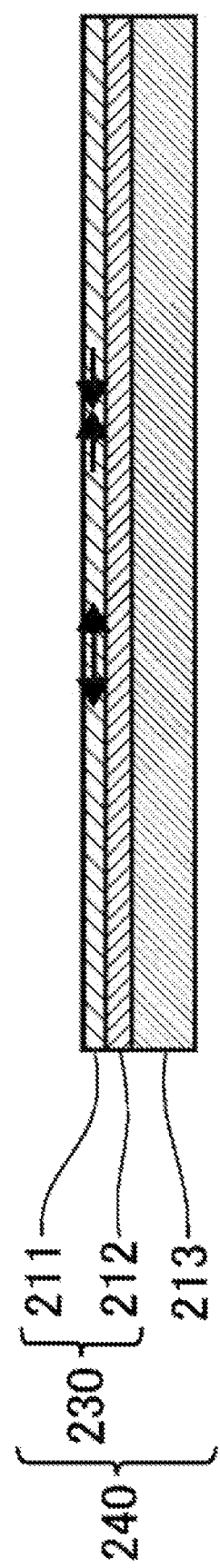
FIG. 25 is a cross sectional view of the completed stack 240.

Subsequently, as shown in FIG. 24, when the surface of the DRAM substrate 213 side is attracted to suctioned by the substrate holder 223 as a jig for thinning to forcibly flatten the intermediate stack 230, a distortion according to the rigidity is distributed in each of the bonded intermediate stack 230 and DRAM substrate 213. Furthermore, as shown in FIG. 25, the rigidity of the thinned CIS substrate 211 is decreased. Therefore, when the holding of the substrate holder 223 to the completed stack 240 is released, the distribution of the distortion to the LOGIC substrate 212 and the CIS substrate 211 increases, and the distortion of the DRAM substrate 213 decreases. In the illustrated example, since the nonlinear distortions generated in the LOGIC substrate 212 and the DRAM substrate 213 have the same shape, in the portion of the LOGIC substrate 212 corresponding to the portion where a reduction deformation or an expanding deformation of the DRAM substrate 213 is generated due to the releasing, a reduction deformation or an expanding deformation is generated with the same amount, thus the nonlinear distortion of the LOGIC substrate 212 is also eliminated. On the other hand, since the CIS substrate 211 has a nonlinear distortion generated with a shape different from that of the nonlinear distortion generated in the DRAM substrate 213, the CIS substrate 211 further deforms in the direction of the reduction deformation or the expanding deformation in the DRAM substrate 213 due to the releasing.

Figure 26:
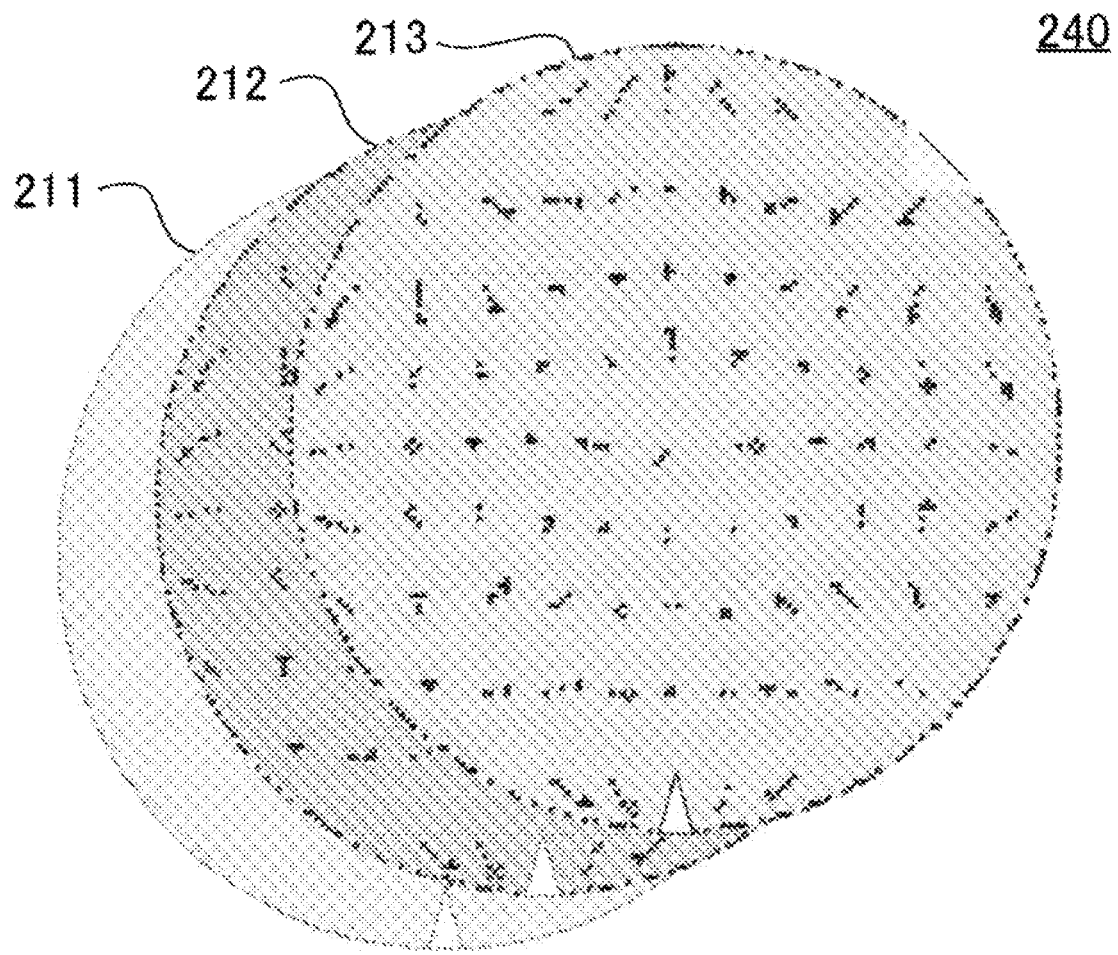
FIG. 26 is a schematic view indicating a distribution of nonlinear distortions in the manufacturing process of the completed stack 240.

FIG. 26 illustrates a schematic planar view showing the distributions of nonlinear distortions in a state where the bonded intermediate stack 230 and the DRAM substrate 213 are held by the substrate holder 221 as shown in FIG. 22. In the state shown in FIG. 26, the distortion caused by the first bonding is generated in the LOGIC substrate 212, and the distortion caused by the second bonding is generated in the DRAM substrate 213.

Figure 27:
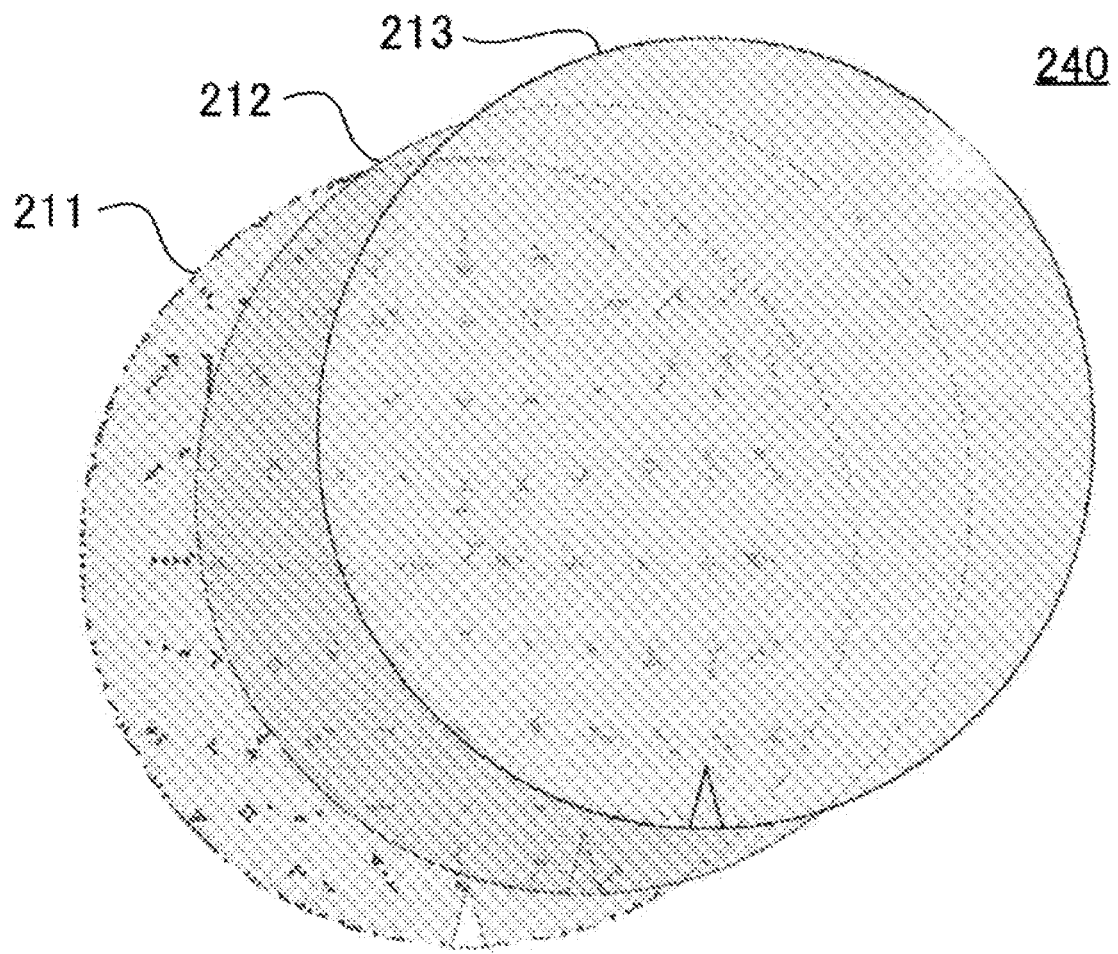
FIG. 27 is a schematic view indicating a distribution of a nonlinear distortion in the completed stack 240.

FIG. 27 illustrates a planar view schematically showing the distribution of a nonlinear distortion in the completed stack 240 shown in FIG. 25, showing a state where the distortion of the DRAM substrate 213 is distributed to the CIS substrate 211 and the DRAM substrate 213 when the CIS substrate 211 is thinned. At this time, a distortion in a direction opposite to that of the DRAM substrate 213 is distributed to the CIS substrate 211. Therefore, in the LOGIC substrate 212, the distortion generated by the first bonding is canceled, and a distortion opposite to that of the DRAM substrate 213 is generated in the CIS substrate 211.

FIG. 28 to FIG. 31 illustrate the magnification distortions generated in the bonding process of the implementation 1. The arrows having white arrowheads shown in FIG. 28 to FIG. 31 indicate that when the outward arrowheads are shown at both ends of one straight line, magnification distortions are generated in which the distance between the structural bodies on the substrate is increased, and the magnification is increased, that is, the substrate expanding and deforming occur towards the outside of the substrate along the radial direction of the substrate. Also, in the case where a pair of arrows having facing arrowheads is shown, the distance between the structural bodies on the substrate is narrowed, and the magnification of the substrate is reduced, that is, magnification distortions are generated due to the substrate shrinking and deforming towards the center of the substrate along the radial direction of the substrate.

Figure 28:
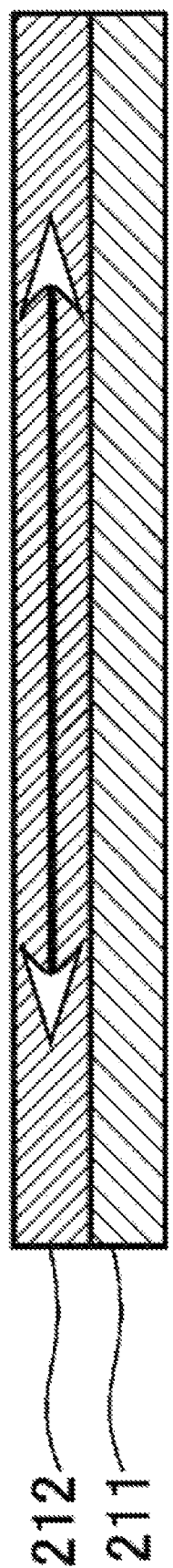
FIG. 28 illustrates a magnification distortion generated in a bonding process of an implementation 1.

When the LOGIC substrate 212 whose holding is released firstly is bonded to the CIS substrate 211 held by the substrate holder 221, a lamination process magnification distortion is generated in the LOGIC substrate 212 due to the deformation generated in the bonding process being fixed. The lamination process magnification distortion of the LOGIC substrate 212 is a linear distortion that appears isotopically, and is a distortion in which the amount of deformation linearly increases radially outward of the LOGIC substrate 212 as shown in FIG. 28.

Figure 29:
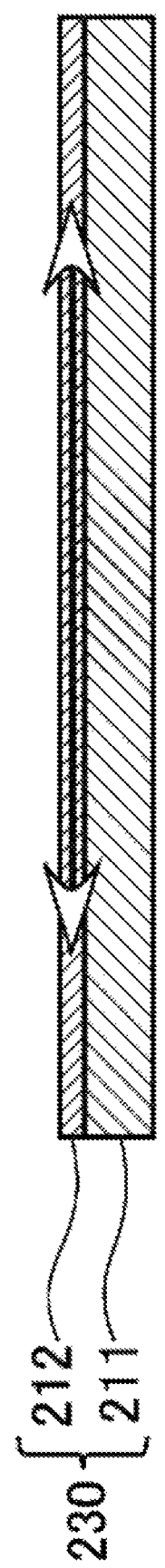
FIG. 29 illustrates a magnification distortion generated in a bonding process of the implementation 1.

Subsequently, when the LOGIC substrate 212 of the bonded CIS substrate 211 and the LOGIC substrate 212 is thinned, the magnification distortion of the LOGIC substrate 212 whose rigidity is decreased due to the thinning hardly affects the CIS substrate 211. Therefore, in the intermediate stack 230 formed by bonding the CIS substrate 211 and the LOGIC substrate 212, the magnification distortion generated in the LOGIC substrate 212 remains as it is on the LOGIC substrate 212 as shown in FIG. 29.

Figure 30:
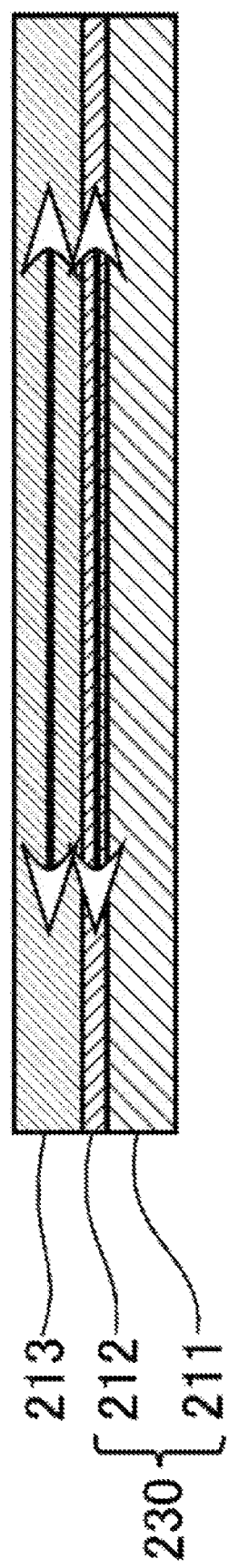
FIG. 30 illustrates magnification distortions generated in a bonding process of the implementation 1.

Next, when the DRAM substrate 213 is bonded to the intermediate stack 230 held by the substrate holder 221, the lamination process magnification distortion is generated in the DRAM substrate 213 whose holding is released firstly. The magnification distortion of the DRAM substrate 213 is a distortion in which the amount of deformation linearly increases radially outward of the DRAM substrate 213, similar to the magnification distortion generated in the LOGIC substrate 212. In the LOGIC substrate 212 in contact with the DRAM substrate 213 in the intermediate stack 230, as shown in FIG. 30, the lamination process magnification distortion has already been generated. Therefore, there is no misalignment generated between the bonded DRAM substrate 213 and the LOGIC substrate 212 due to the lamination process magnification distortion.

Figure 31:
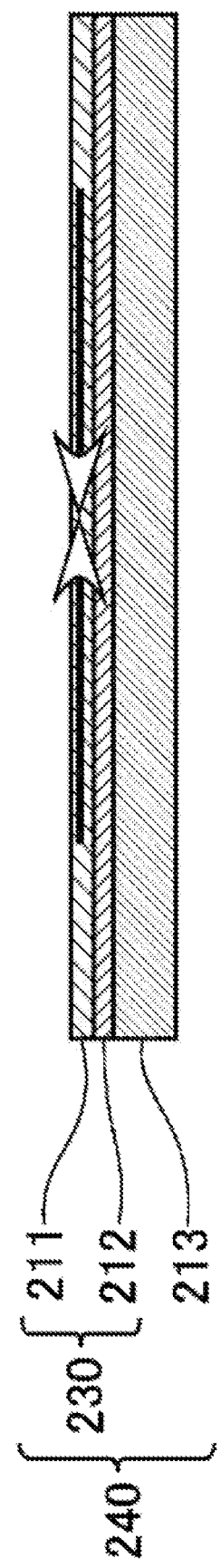
FIG. 31 illustrates a magnification distortion generated in a bonding process of the implementation 1.

Subsequently, when the CIS substrate 211 is thinned, the magnification distortion of the LOGIC substrate 212 and the DRAM substrate 213 concentrates on the thinned CIS substrate 211 as shown in FIG. 31, and the magnification distortions of the LOGIC substrate 212 and the DRAM substrate 213 are substantially eliminated. However, although the magnification distortion whose direction is opposite to that of the magnification distortion that have been generated in the DRAM substrate 213 are generated in the CIS substrate 211, there is no misalignment generated between the already bonded CIS substrate 211, the LOGIC substrate 212, and the DRAM substrate 213.

FIG. 32 to FIG. 36 illustrate nonlinear distortions generated in the CIS substrate 211 and the LOGIC substrate 212 in the first bonding process when the procedure of the implementation 2 shown in the table of FIG. 11 is performed. As shown in FIG. 11, in the implementation 2, the holding of the CIS substrate 211 is firstly released in the first bonding. In the implementation 2, the CIS substrate 211 is the first substrate, and the LOGIC substrate 212 is the second substrate.

Figure 32:
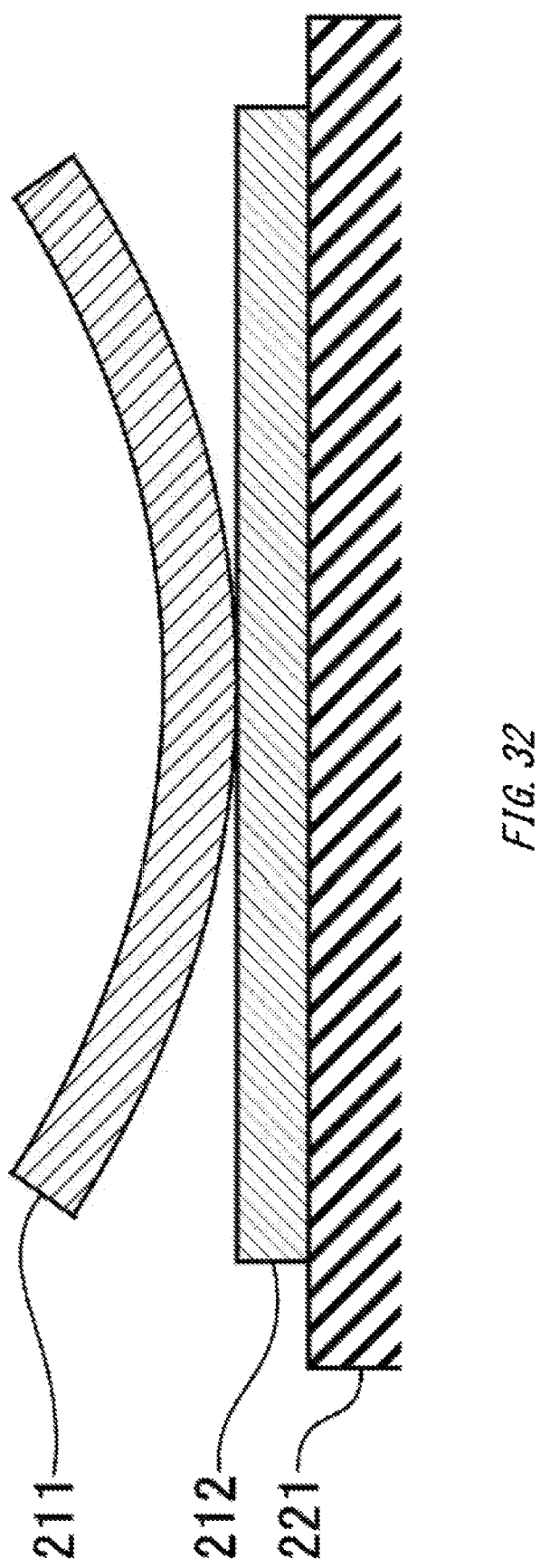
FIG. 32 illustrates a bonding process of the CIS substrate 211 and the LOGIC substrate 212.

As shown in FIG. 32, at the point of time when the holding of the CIS substrate 211 is released and the bonding is started, the LOGIC substrate 212 is attracted by the substrate holder 221 with a flat attracting surface, and fixed in a flat state.

Figure 33:
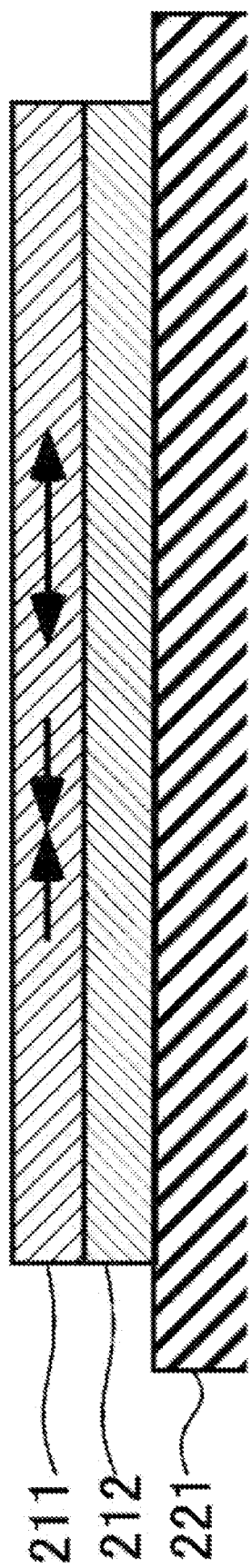
FIG. 33 illustrates a bonding process of the CIS substrate 211 and the LOGIC substrate 212.
Figure 34:
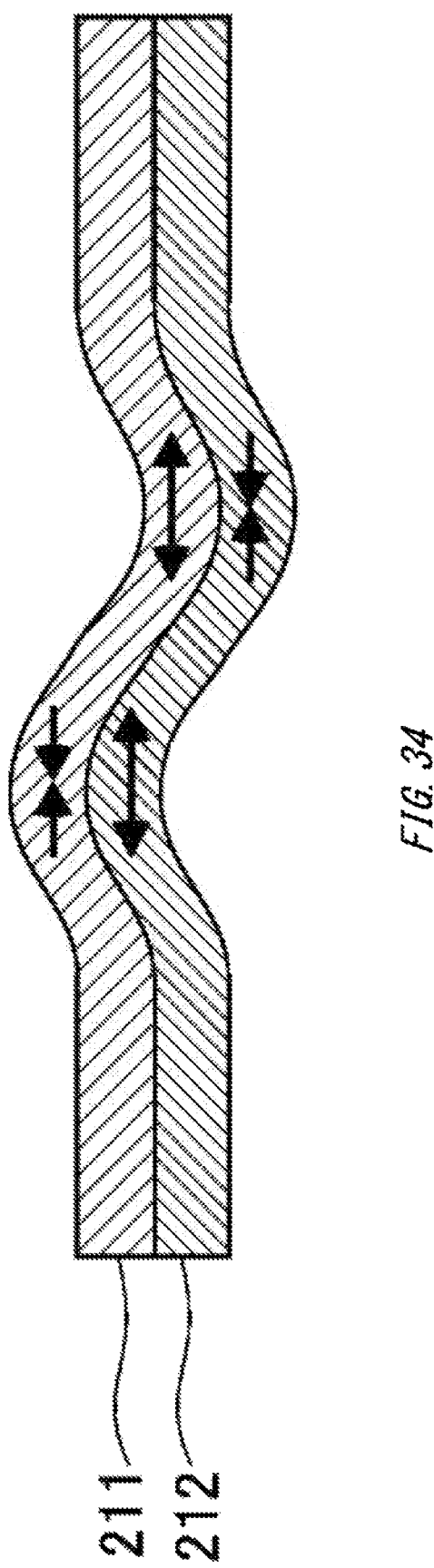
FIG. 34 illustrates a bonding process of the CIS substrate 211 and the LOGIC substrate 212.

Therefore, as shown in FIG. 33, at the stage when the CIS substrate 211 and the LOGIC substrate 212 are bonded, the distortion caused by the bonding is generated in the CIS substrate 211. Next, as shown in FIG. 34, when the holding by the substrate holder 221 is released, deformations along with the warpages are generated in the bonded CIS substrate 211 and the LOGIC substrate 212 due to the stress generated in the layer of the CIS substrate 211, and distortions opposite to each other are generated in both of the CIS substrate 211 and the LOGIC substrate 212.

Figure 35:
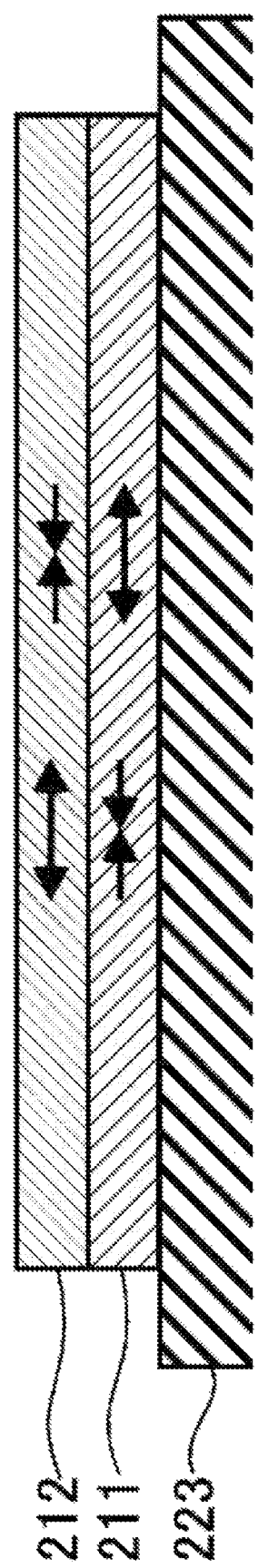
FIG. 35 illustrates a bonding process of the CIS substrate 211 and the LOGIC substrate 212.
Figure 36:
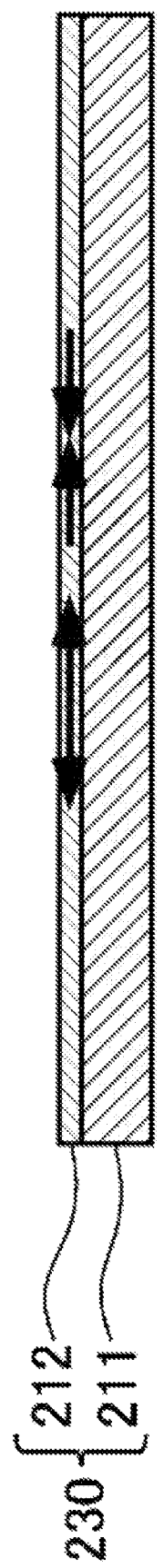
FIG. 36 is a cross sectional view of the intermediate stack 230.

Subsequently, as shown in FIG. 35, the CIS substrate 211 is attracted to the substrate holder 223 as a jig for thinning, and the CIS substrate 211 and the LOGIC substrate 212 are forcibly flattened. In this way, the distortion is distributed to each of the bonded CIS substrate 211 and LOGIC substrate 212 according to the rigidity. Further, as shown in FIG. 36, when the holding of the intermediate stack 230 formed by thinning the LOGIC substrate 212 by the substrate holder 223 is released, the distortion of the entire intermediate stack 230 is biased to the layer of the LOGIC substrate 212 with a decreased rigidity due to the thinning, and the distortion of the CIS substrate 211 is reduced.

Figure 37:
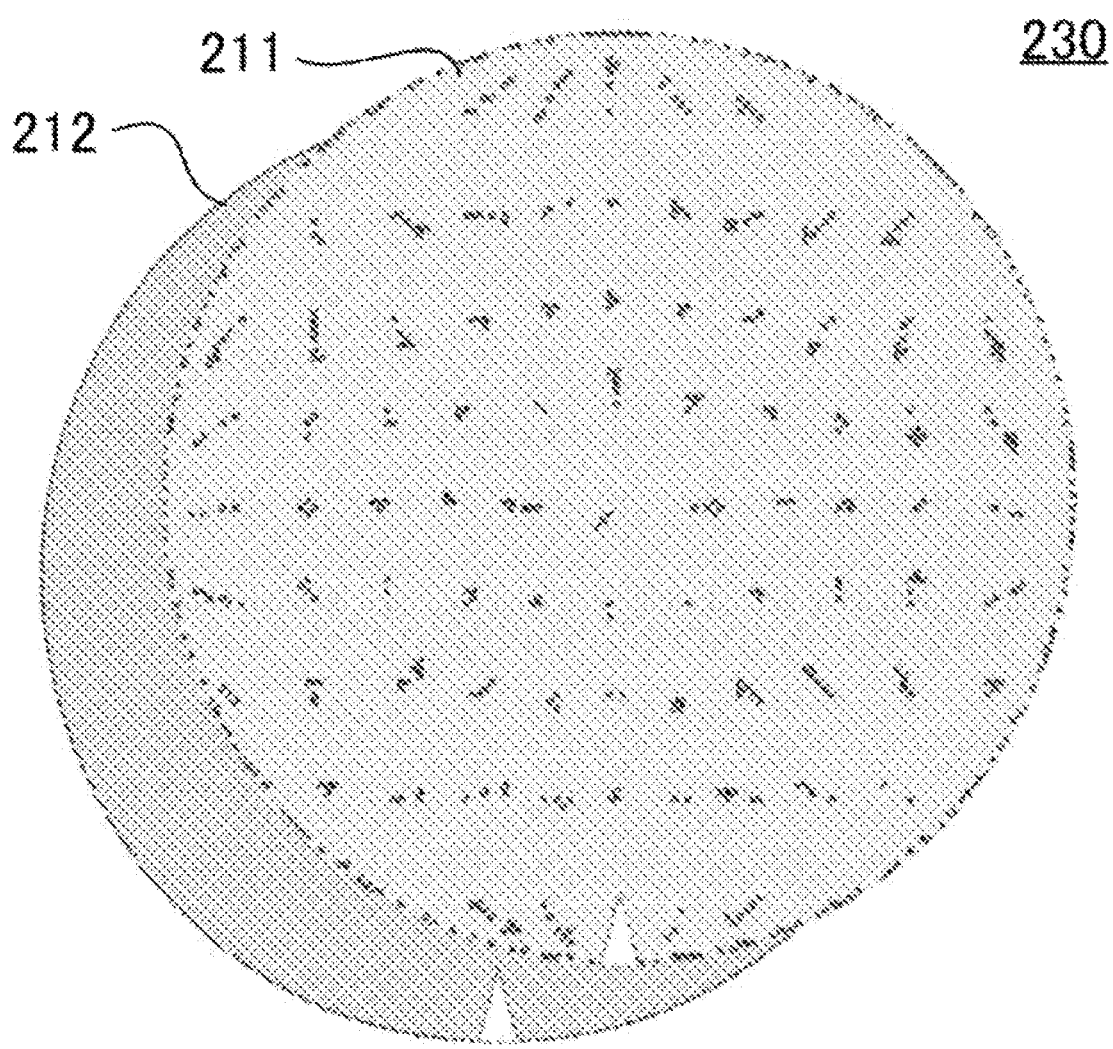
FIG. 37 is a schematic view indicating a distribution of a distortion in the manufacturing process of the intermediate stack 230.
Figure 38:
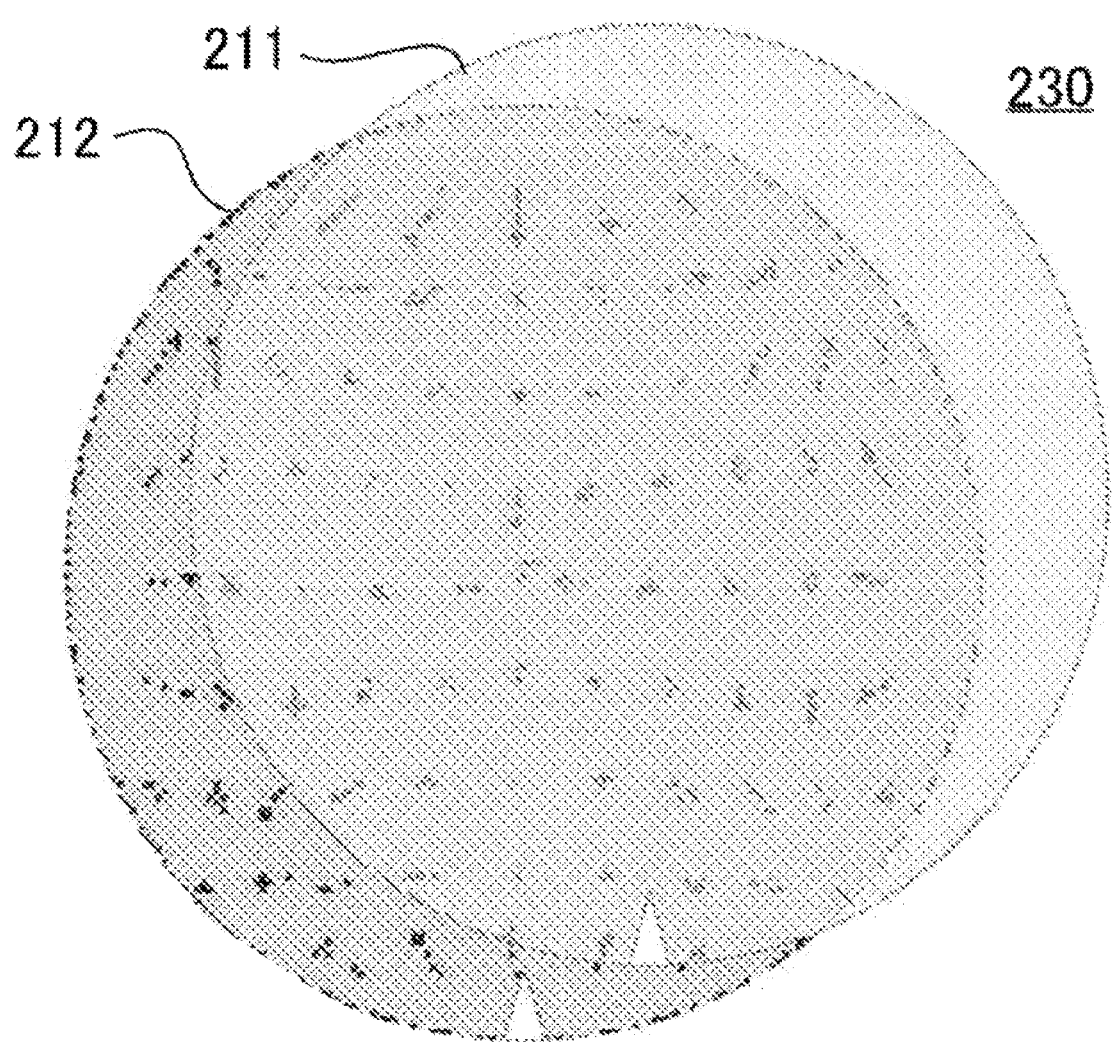
FIG. 38 is a schematic view indicating a distribution of a distortion in the intermediate stack 230.

FIG. 37 illustrates a schematic planar view showing the distribution of a nonlinear distortion in a state where the bonded CIS substrate 211 and LOGIC substrate 212 are held by the substrate holder 221 as shown in FIG. 33. Also, FIG. 38 illustrates a planar view schematically showing the distribution of a nonlinear distortion in the intermediate stack 230 shown in FIG. 36. As can be seen from the comparison between FIG. 37 and FIG. 38, most of the distortion generated in the CIS substrate 211 due to the first bonding is transferred to the LOGIC substrate 212 in the intermediate stack 230.

FIG. 39 to FIG. 43 illustrate the nonlinear distortions generated in the respective layers of the CIS substrate 211 and the LOGIC substrate 212 in the intermediate stack 230 and the DRAM substrate 213 in the second bonding process when the procedure of the implementation 2 shown in the table of FIG. 11 is performed. As shown in FIG. 11, in the implementation 2, the holding of the intermediate stack 230 is released firstly in the second bonding.

Figure 39:
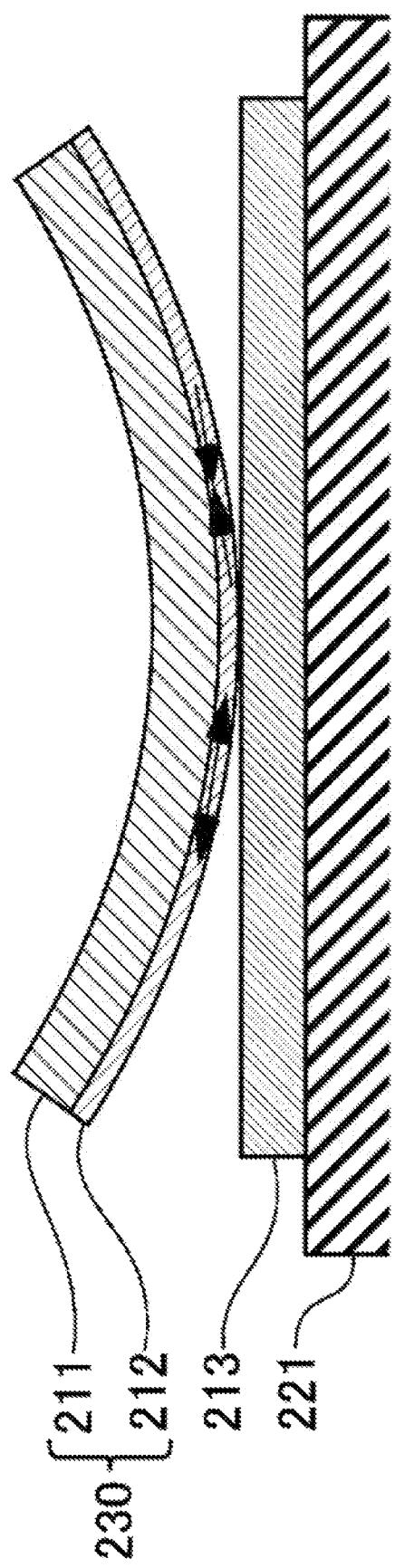
FIG. 39 illustrates a bonding process of the intermediate stack 230 and the DRAM substrate 213.

As shown in FIG. 39, at the point of time when the holding of the intermediate stack 230 is released and the bonding is started, the DRAM substrate 213 is attracted by the substrate holder 221 with a flat attracting surface, and is fixed in a flat state. In the implementation 2, the DRAM substrate 213 is the third substrate.

Figure 40:
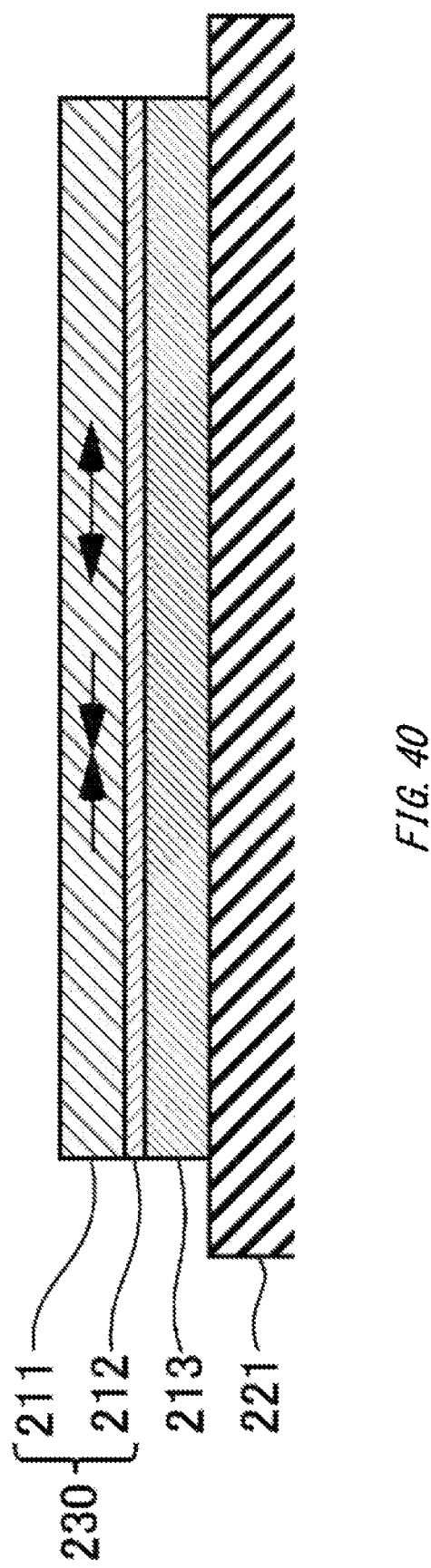
FIG. 40 illustrates a bonding process of the intermediate stack 230 and the DRAM substrate 213.
Figure 41:
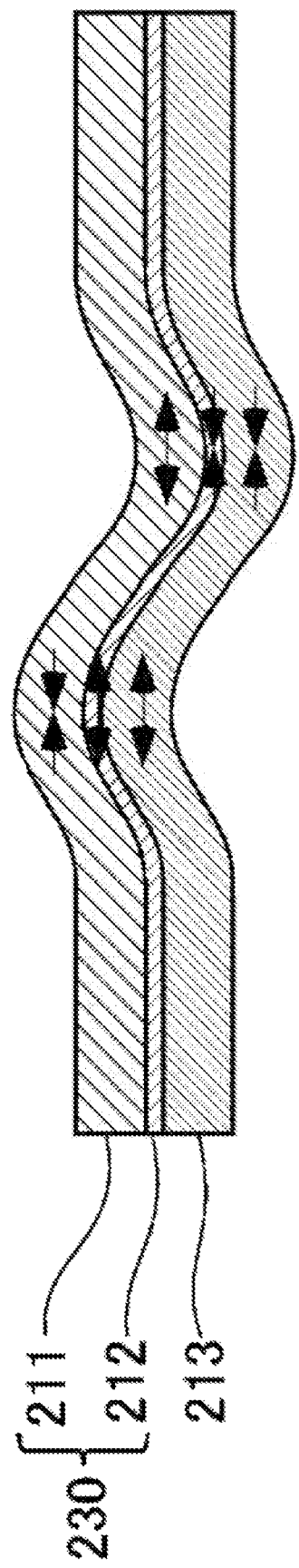
FIG. 41 illustrates a bonding process of the intermediate stack 230 and the DRAM substrate 213.

Therefore, as shown in FIG. 40, at the stage when the intermediate stack 230 and the DRAM substrate 213 are bonded, the distortion caused by the bonding is generated in each layer of the intermediate stack 230. Furthermore, as shown in FIG. 41, when the holding by the substrate holder 221 is released, reversed distortions are generated in the bonded DRAM substrate 213 due to the stress of the intermediate stack 230, and entire deformations along with warpages are generated.

Figure 42:
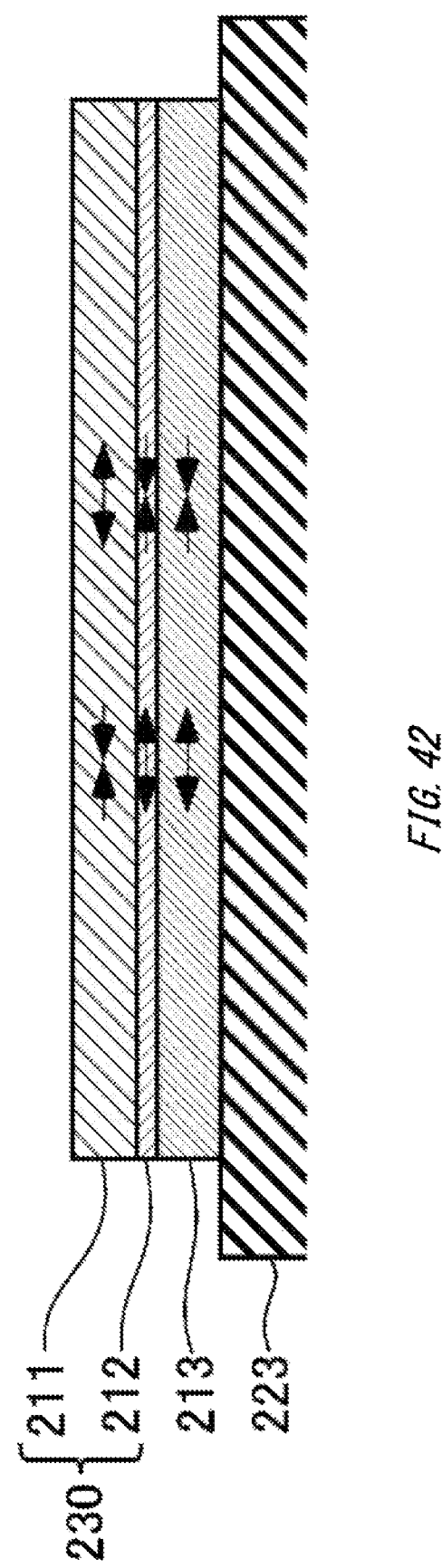
FIG. 42 illustrates a bonding process of the intermediate stack 230 and the DRAM substrate 213.
Figure 43:
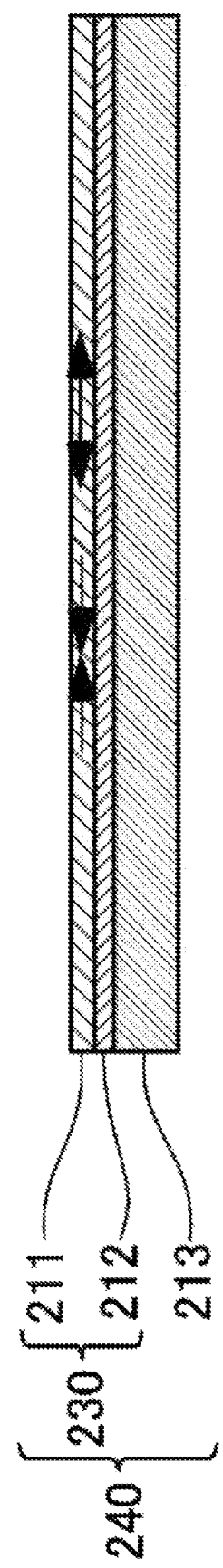
FIG. 43 is a cross sectional view of the completed stack 240.

Subsequently, as shown in FIG. 42, when the DRAM substrate 213 is attracted to the substrate holder 223 as a jig for thinning and the intermediate stack 230 is forcibly flattened, the distortions are distributed to each of the bonded intermediate stack 230 and the DRAM substrate 213 according to the rigidity. Furthermore, as shown in FIG. 43, when the completed stack 240 formed by thinning the CIS substrate 211 has the holding by the substrate holder 223 released, the distribution of distortion to the LOGIC substrate 212 and the CIS substrate 211 increases, and the distortion of the DRAM substrate 213 is reduced.

Figure 44:
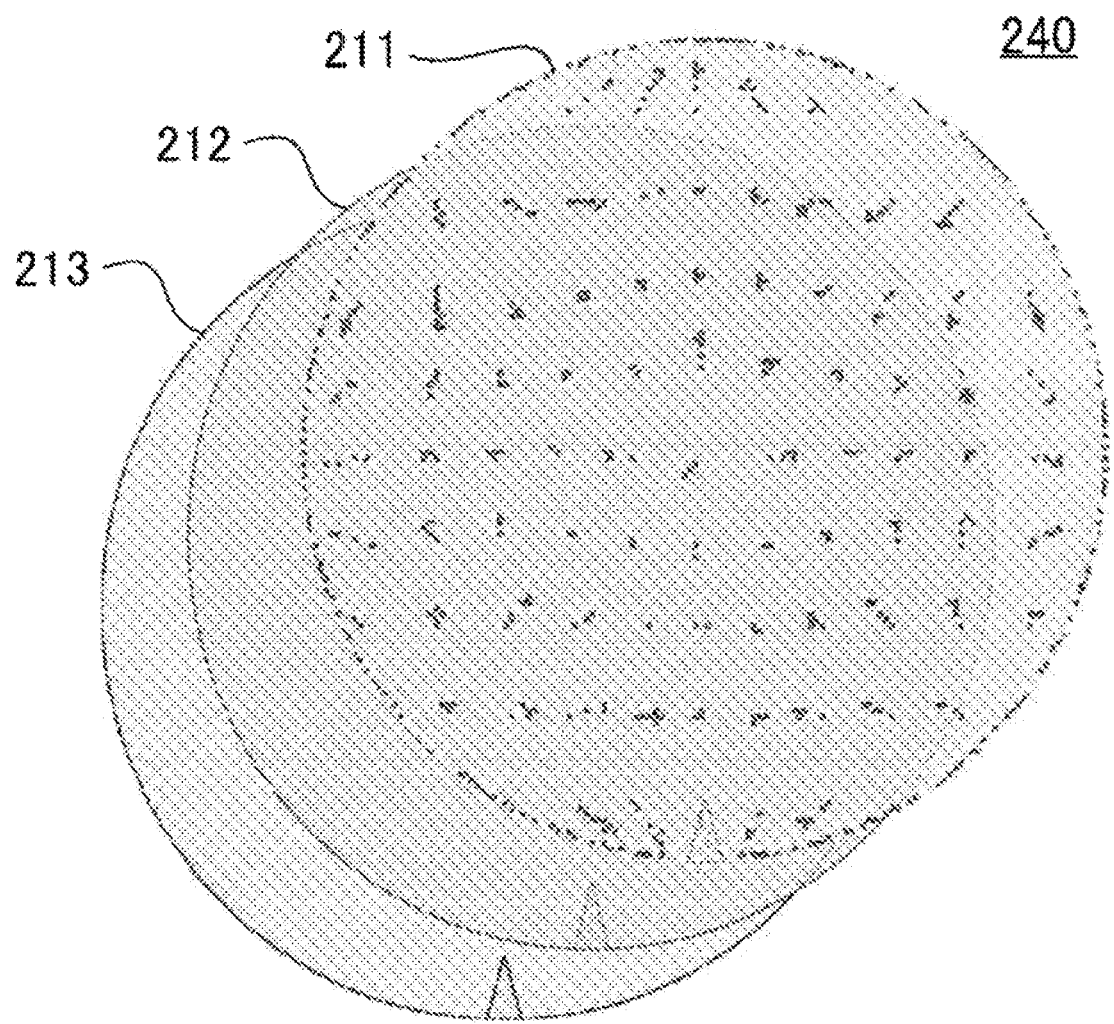
FIG. 44 is a schematic view indicating a distribution of a nonlinear distortion in the manufacturing process of the completed stack 240.

FIG. 44 illustrates a schematic planar view showing a distribution of a nonlinear distortion in a state where the bonded intermediate stack 230 and the DRAM substrate 213 are held by the substrate holder 221 as shown in FIG. 40. Also, FIG. 45 illustrates a planar view schematically showing the distribution of a nonlinear distortion in the completed stack 240 shown in FIG. 43.

Figure 45:
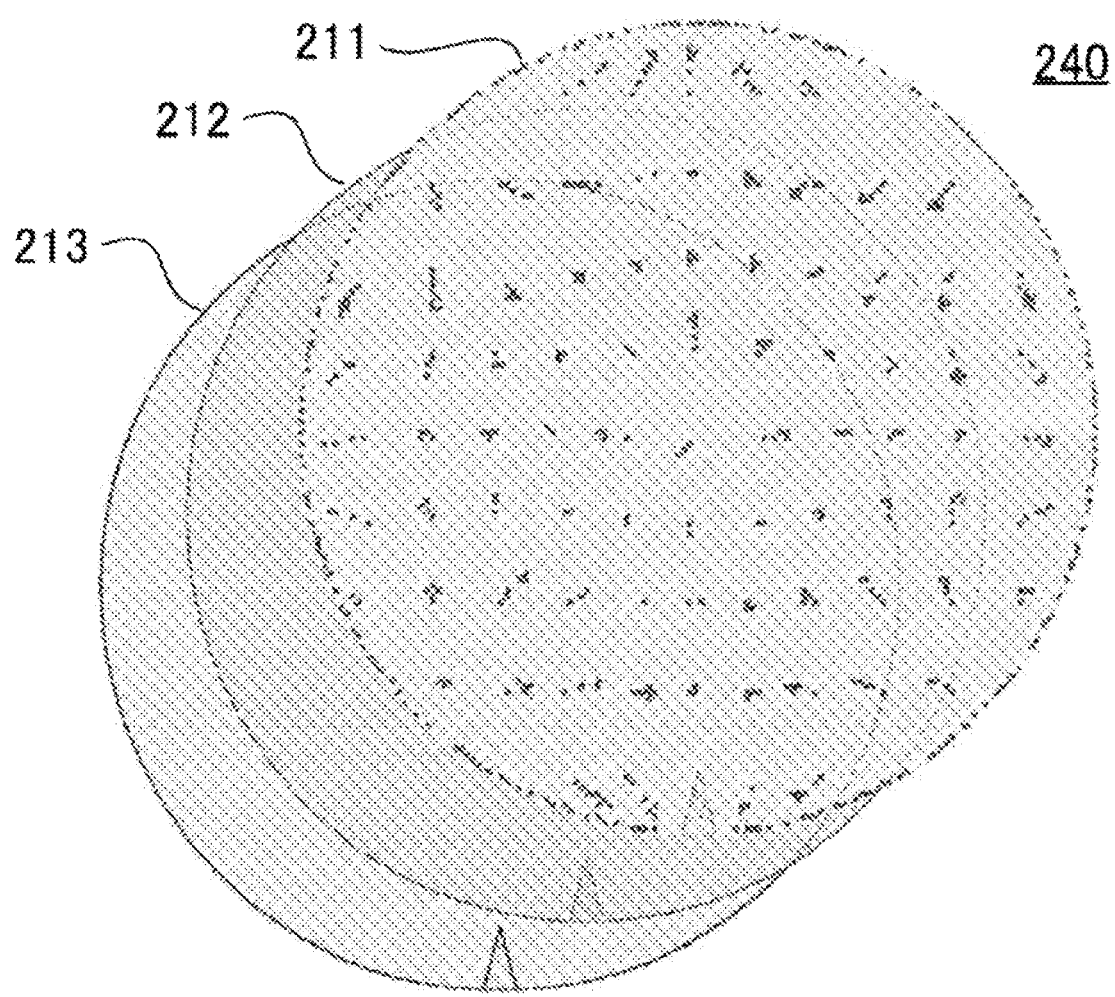
FIG. 45 is a schematic view indicating a distribution of a nonlinear distortion in the completed stack 240.

As can be seen from the comparison between FIG. 44 and FIG. 45, the distortion caused by the second bonding is offset by the distortion remained in the layer of the LOGIC substrate 212 of the intermediate stack 230, and the distortion is only generated in the layer of the CIS substrate 211. Therefore, even in the final completed stack 240, the distortion remains only in the layer of the CIS substrate 211.

FIG. 46 to FIG. 49 illustrate the magnification distortions generated in the bonding process in the implementation 2. The arrows having white arrowheads shown in FIG. 28 to FIG. 31 indicate that when the outward arrowheads are shown at both ends of one straight line, the distance between the structural bodies on the substrate is increased, and the magnification distortion with an increasing magnification is generated. Also, in the case where a pair of arrows having facing arrowheads is shown, the distance between the structural bodies on the substrate is narrowed, and the magnification distortion with a reduced magnification of the substrate is generated.

Figure 46:
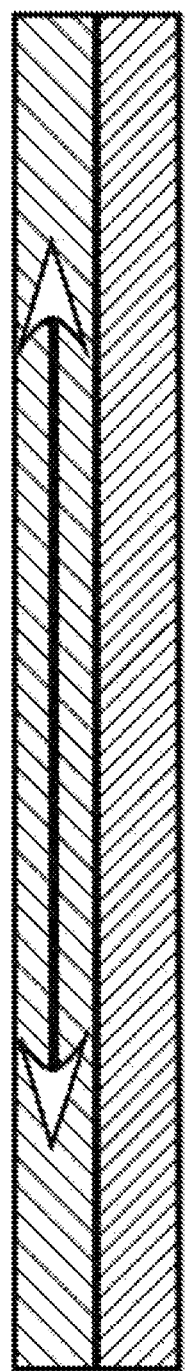
FIG. 46 illustrates a magnification distortion generated in a bonding process of an implementation 2.
Figure 47:
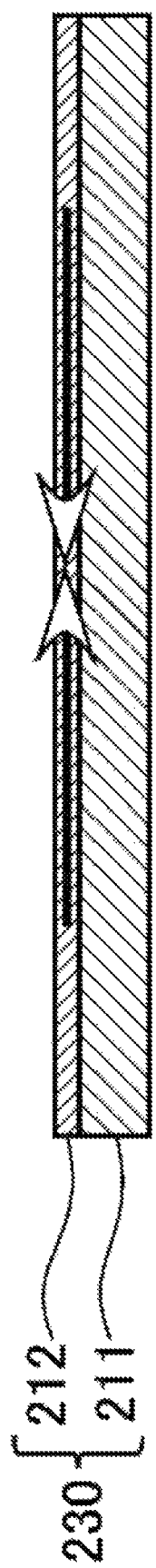
FIG. 47 illustrates a magnification distortion generated in a bonding process of the implementation 2.

When the CIS substrate 211 whose holding is released is bonded to the LOGIC substrate 212 held by the substrate holder 221, as indicated by the arrows in FIG. 46, the lamination process magnification distortion is generated in the CIS substrate 211, and the magnification of the CIS substrate 211 is increased. Subsequently, when the LOGIC substrate 212 is thinned, as shown in FIG. 47, the magnification distortion generated in the CIS substrate 211 is transferred to the thinned LOGIC substrate 212 as magnification distortion for reducing the magnification. In this way, the magnification distortion of the CIS substrate 211 is eliminated.

Next, when the intermediate stack 230 has the holding released and bonded to the DRAM substrate 213 held by the substrate holder 221, a lamination process magnification distortion that increase the magnification is generated in the intermediate stack 230. However, the LOGIC substrate 212 of the intermediate stack 230 includes a magnification distortion with a reduced magnification that is transferred from the CIS substrate 211 during the initial bonding process.

Figure 48:
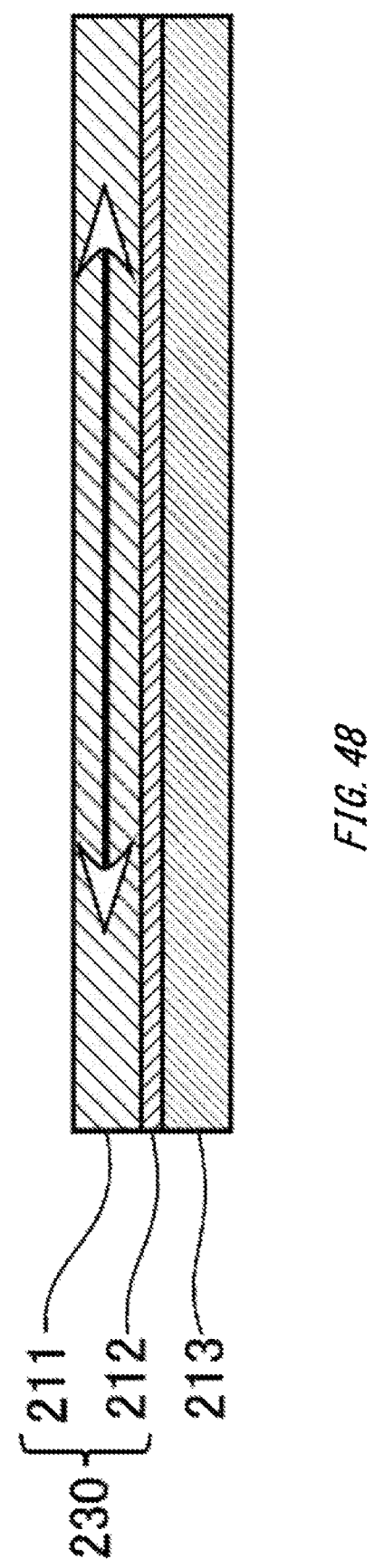
FIG. 48 illustrates a magnification distortion generated in a bonding process of the implementation 2.
Figure 49:
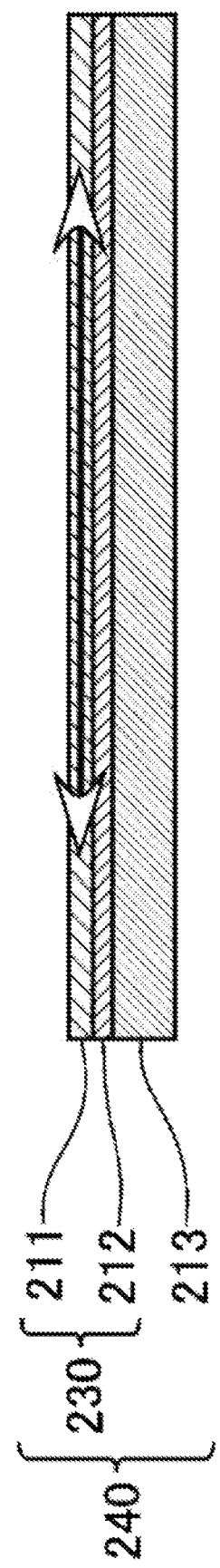
FIG. 49 illustrates a magnification distortion generated in a bonding process of the implementation 2.

Therefore, as shown in FIG. 48, the magnification distortion of the LOGIC substrate 212 is offset by the lamination process magnification distortion generated in the LOGIC substrate 212 in the bonding process with the DRAM substrate 213. In this way, no misalignment due to the magnification distortion is generated between the DRAM substrate 213 and the LOGIC substrate 212 in which the magnification distortion is not generated in the fixed state.

It is noted that the newly generated lamination process magnification distortion remains as it is in the CIS substrate 211 in which once the magnification distortion has been eliminated. Subsequently, when the CIS substrate 211 is thinned, the magnification distortion of the CIS substrate 211 remains as it is as shown by the arrow in FIG. 49, but no misalignment is generated between the CIS substrate 211 and the LOGIC substrate 212.

FIG. 50 to FIG. 54 illustrates nonlinear distortions generated in each of the layers of the CIS substrate 211 and the LOGIC substrate 212 in the intermediate stack 230 and the DRAM substrate 213 in the second bonding process when the procedure of the comparative example 1 shown in the table of FIG. 11 is performed. As shown in FIG. 11, in the comparative example 1, the holding of the intermediate stack 230 is released in the second bonding.

It is noted that, in the comparative example 1, the first bonding is performed in the same procedure as the implementation 1. In other words, in the comparative example 1, the LOGIC substrate 212 is the first substrate, the CIS substrate 211 is the second substrate, and the DRAM substrate 213 is the third substrate. Therefore, the state of the distortion in the intermediate stack 230 formed by the first bonding is the same as the states indicated in FIG. 18 and FIG. 20. Therefore, the distortion generated due to the first bonding is generated exclusively in the LOGIC substrate 212.

Figure 50:
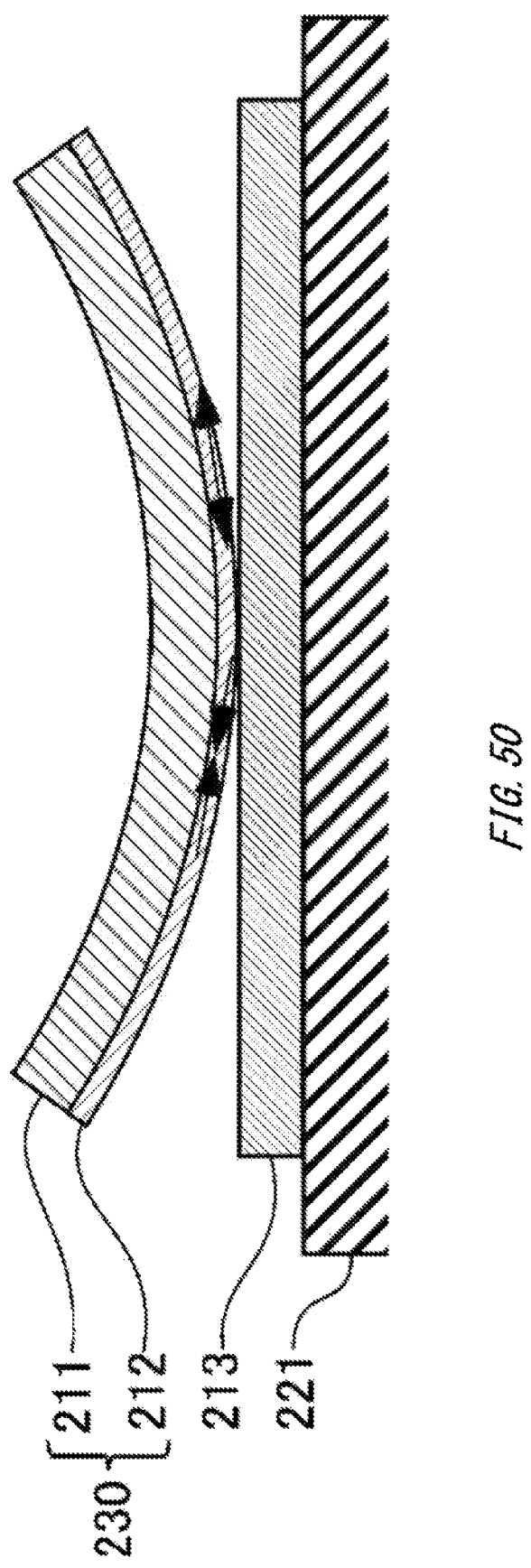
FIG. 50 illustrates a bonding process of the intermediate stack 230 and the DRAM substrate 213.
Figure 51:
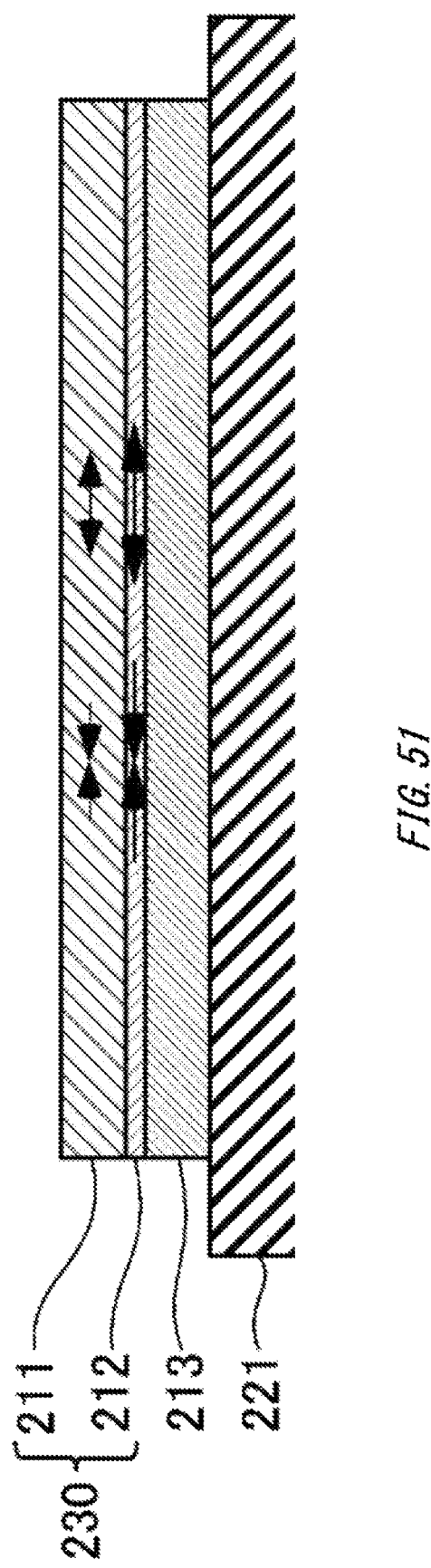
FIG. 51 illustrates a bonding process of the intermediate stack 230 and the DRAM substrate 213.

As shown in FIG. 50, at the point of time when the holding of the intermediate stack 230 is released and the bonding is started, the DRAM substrate 213 is attracted by the substrate holder 221 with a flat attracting surface, and is fixed in a flat state. Therefore, as shown in FIG. 51, at the stage when the intermediate stack 230 and the DRAM substrate 213 are bonded, the distortion caused by the bonding is generated in each layer of the intermediate stack 230. As a result, as shown in FIG. 12, in the comparative example 1, at the stage where the intermediate stack 230 has been bonded to the fixed DRAM substrate 213, the distortion generated in the LOGIC substrate 212 due to the first bonding is superimposed on the distortion generated in the entire intermediate stack 230 due to the second bonding, and the distortion generated in the layer of the LOGIC substrate 212 of the intermediate stack 230 is doubled.

Figure 52:
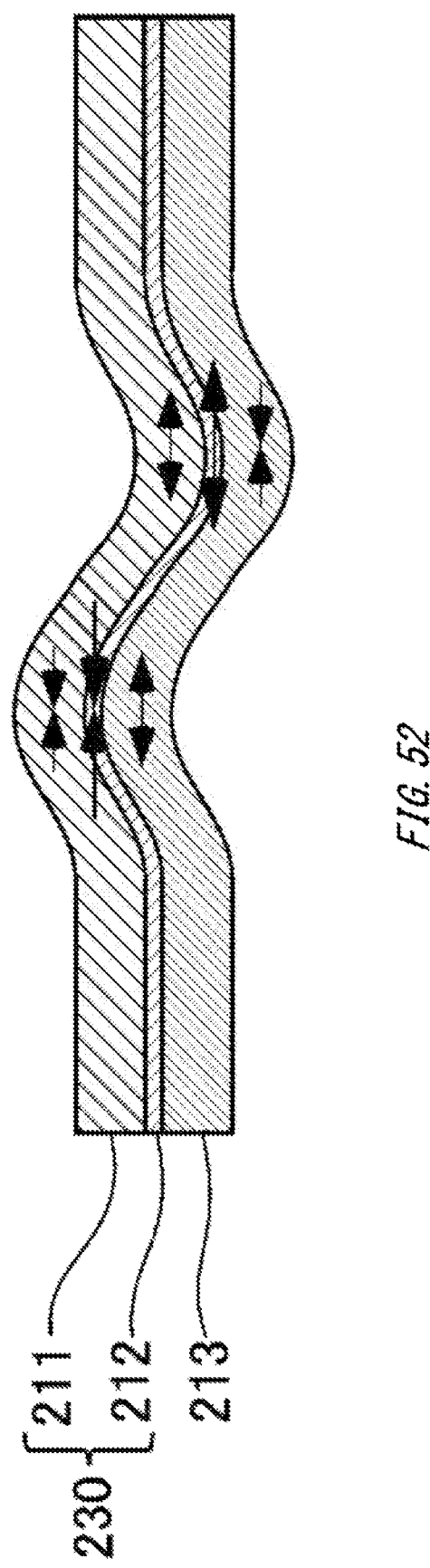
FIG. 52 illustrates a bonding process of the intermediate stack 230 and the DRAM substrate 213.
Figure 53:
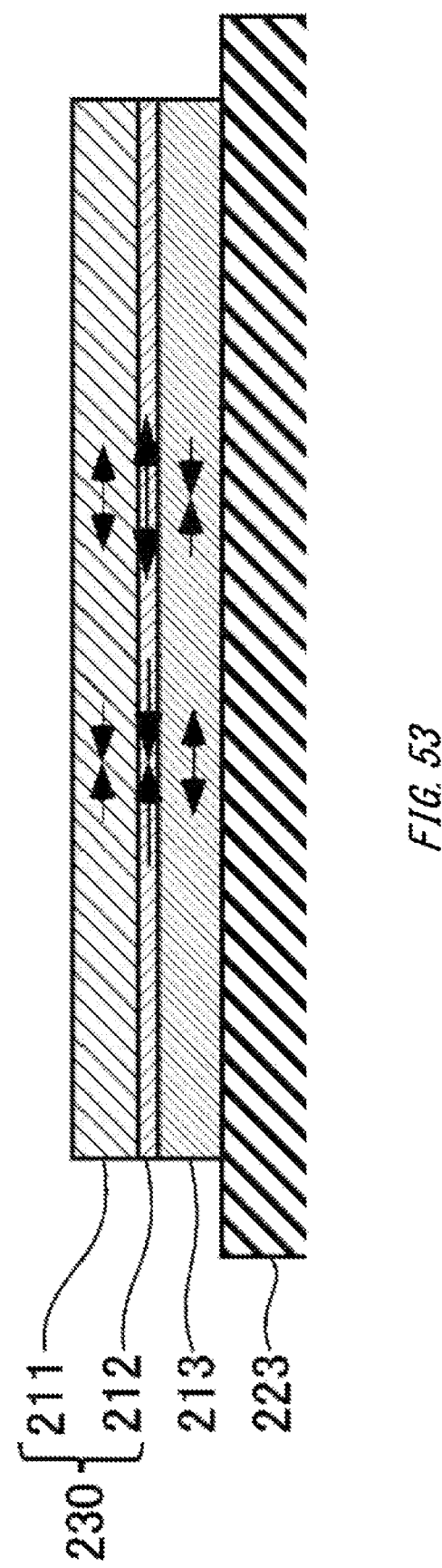
FIG. 53 illustrates a bonding process of the intermediate stack 230 and the DRAM substrate 213.
Figure 54:
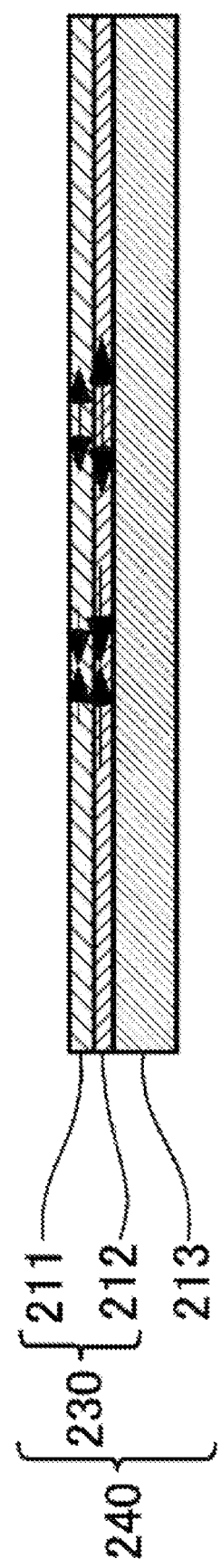
FIG. 54 is a cross sectional view of the completed stack 240.

As shown in FIG. 52, when the holding by the substrate holder 221 is released, the distortion is also distributed to the DRAM substrate 213. As shown in FIG. 53, after being attracted by the substrate holder 223 as a jig for thinning and forcibly flattened, the CIS substrate 211 is thinned as shown in FIG. 54. When the completed stack 240 is released from being held by the substrate holder 223, it returns again to the state where the distortion of the layer of the LOGIC substrate 212 doubles. In this way, when the substrate whose holding is released in the second bonding is incorrectly specified, a significant distortion remains in the completed stack 240.

Figure 55:
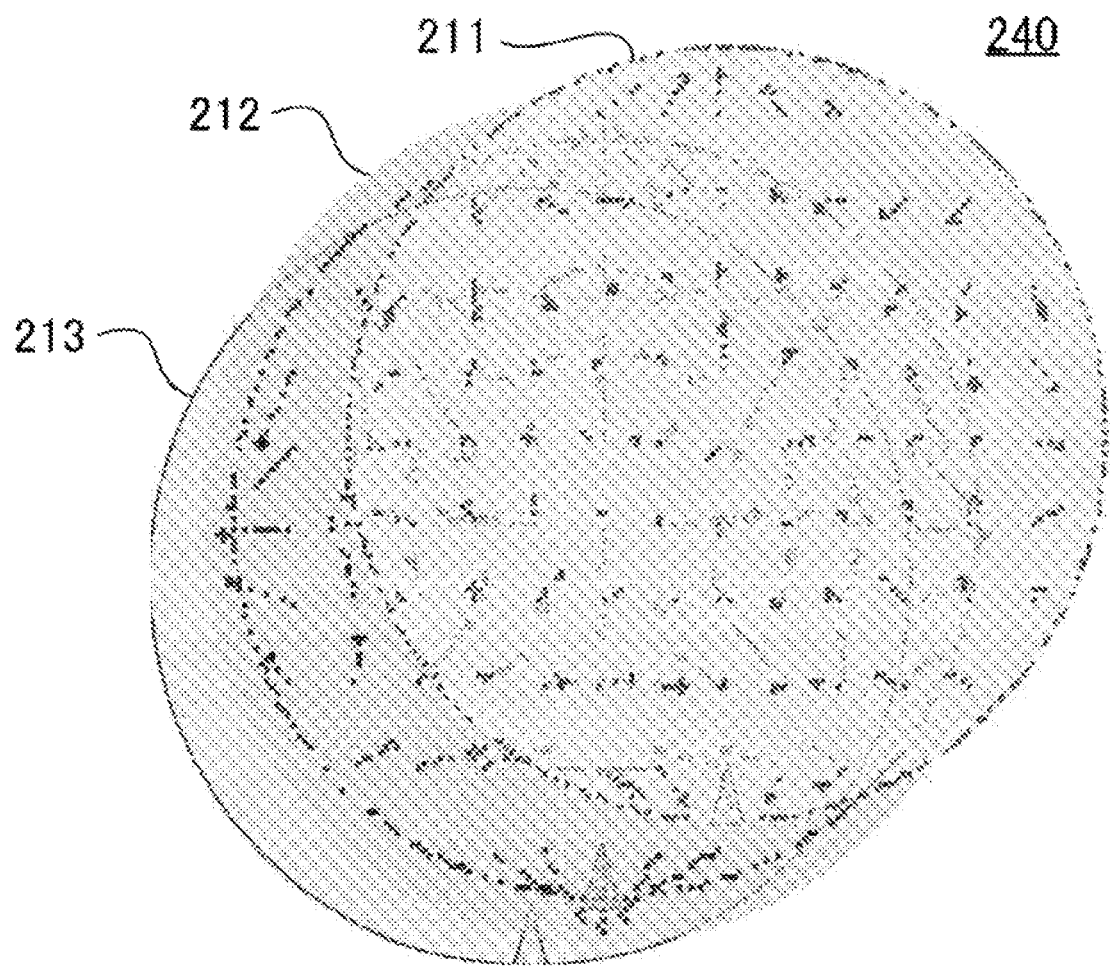
FIG. 55 is a schematic view indicating a distribution of nonlinear distortions in the manufacturing process of the completed stack 240.
Figure 56:
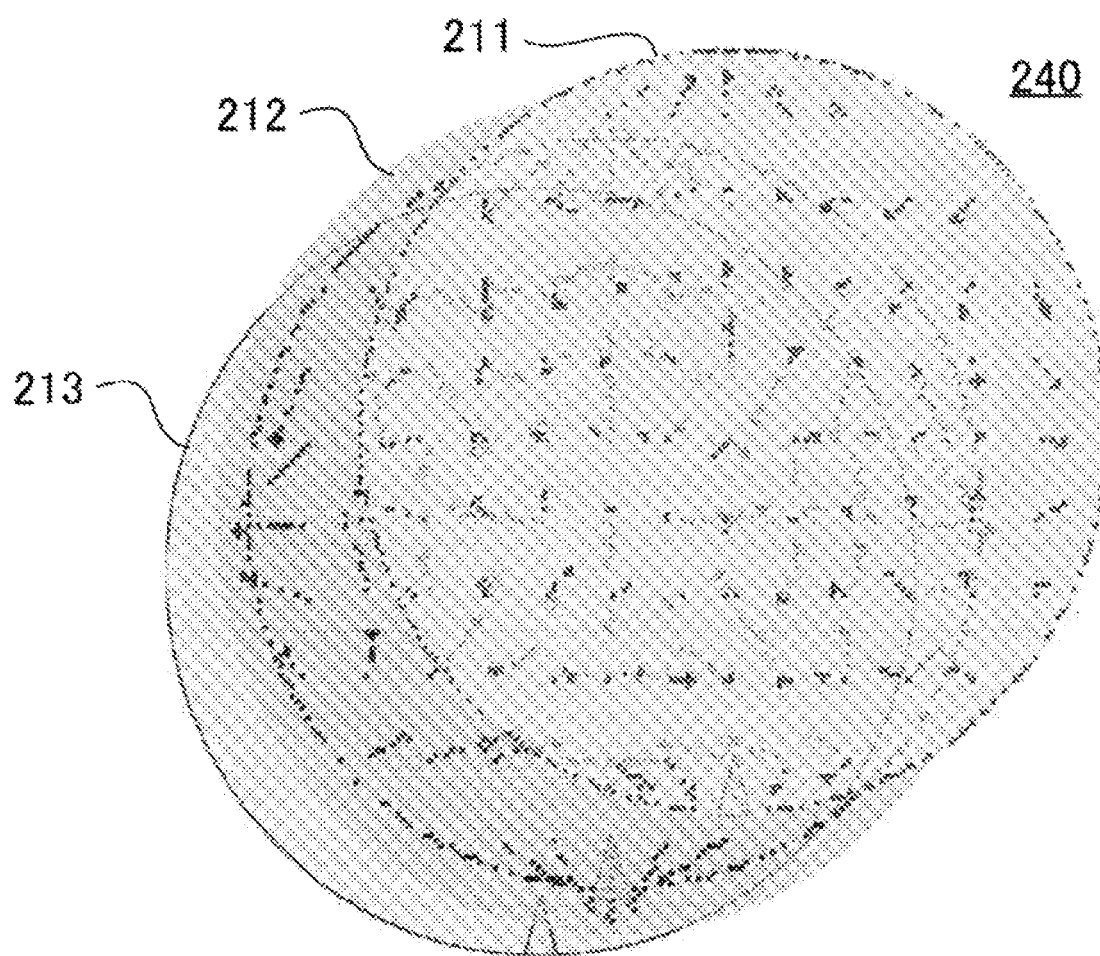
FIG. 56 is a schematic view indicating a distribution of nonlinear distortions in the completed stack 240.

FIG. 55 illustrates a schematic planar view showing the state of the distribution of a nonlinear distortion in which the DRAM substrate 213 is fixed to the substrate holder 221 and the holding of the intermediate stack 230 is firstly released, and the DRAM substrate 213 and the intermediate stack 230 are at a laminated state, as shown in FIG. 51. Also, FIG. 56 schematically illustrates a planar view of the distribution of a nonlinear distortion in the completed stack 240 as shown in FIG. 54. As can be seen from FIG. 55 and FIG. 56, when the procedure of the comparative example 1 is performed in the second bonding, the distortion due to the second bonding cannot be canceled or reduced.

FIG. 57 to FIG. 60 illustrate the magnification distortions generated in the bonding process of the comparative example 1. The arrows having white arrowheads shown in FIG. 57 to FIG. 60 indicate that when the outward arrowheads are shown at both ends of one straight line, the distance between the structural bodies on the substrate is increased, and the magnification distortion with an increasing magnification is generated. Also, in the case where a pair of arrows having facing arrowheads is shown, the distance between the structural bodies on the substrate is narrowed, and the magnification distortion with a reduced magnification of the substrate is generated.

Figure 57:
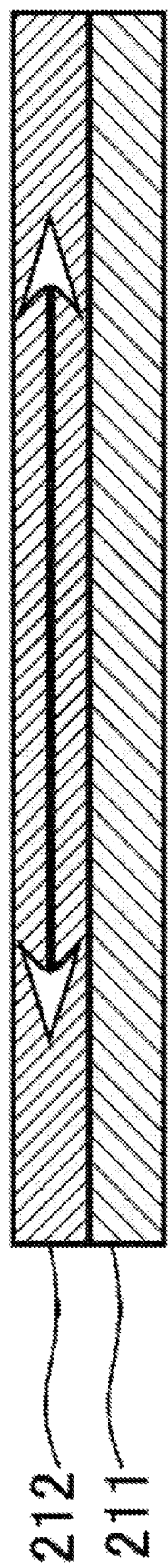
FIG. 57 illustrates a magnification distortion generated in a bonding process of a comparative example 1.
Figure 58:
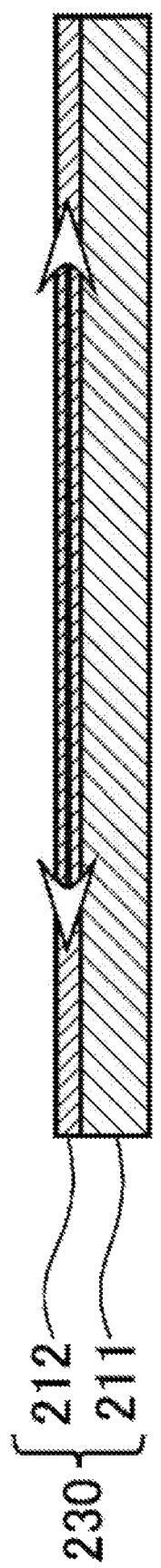
FIG. 58 illustrates a magnification distortion generated in a bonding process of the comparative example 1.

When the LOGIC substrate 212 whose holding is released is bonded to the CIS substrate 211 held by the substrate holder 221, as indicated by the arrows in FIG. 57, the lamination process magnification distortion is generated in the LOGIC substrate 212, and the magnification of the LOGIC substrate 212 is increased. When the LOGIC substrate 212 is thinned, as shown in FIG. 58, the magnification distortion generated in the LOGIC substrate 212 does not affect the CIS substrate 211, so the magnification distortion of the LOGIC substrate 212 is maintained as it is.

Figure 59:
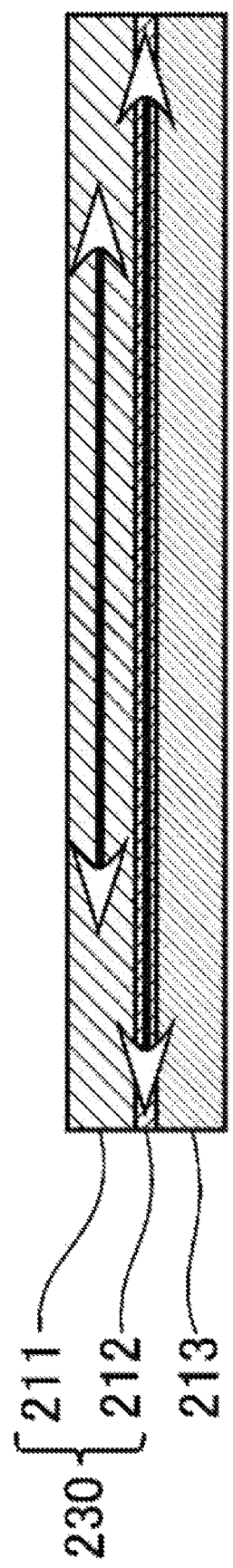
FIG. 59 illustrates magnification distortions generated in a bonding process of the comparative example 1.

Next, when the intermediate stack 230 has the holding released and bonded to the DRAM substrate 213 held by the substrate holder 221, a lamination process magnification distortion that increases the magnification is generated in the intermediate stack 230. Herein, the LOGIC substrate 212 of the intermediate stack 230 already includes a magnification distortion in which the magnification caused by the initial bonding increases. Therefore, the lamination process magnification distortions overlap, and as shown in FIG. 59, in the LOGIC substrate 212, a deformation that further increases the magnification outward in the radial direction is generated, and a magnification distortion larger than that of the CIS substrate 211 is generated.

Figure 60:
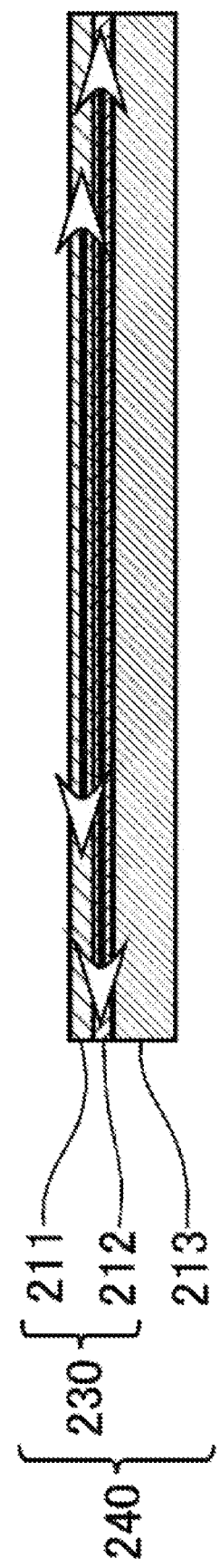
FIG. 60 illustrates magnification distortions generated in a bonding process of the comparative example 1.

As described above, since a large magnification distortion is generated in the LOGIC substrate 212, in the completed stack 240, a misalignment due to the magnification distortion is generated between the LOGIC substrate 212 and the DRAM substrate 213. As shown in FIG. 60, the magnification distortions generated in the CIS substrate 211 and the LOGIC substrate 212 remain as they are even after the CIS substrate 211 is thinned, and the misalignment between the CIS substrate 211 and the LOGIC substrate 212 is not eliminated.

FIG. 61 to FIG. 65 illustrates nonlinear distortions generated in each of the layers of the CIS substrate 211 and the LOGIC substrate 212 in the intermediate stack 230 and the DRAM substrate 213 in the second bonding process when the procedure of the comparative example 2 shown in the table of FIG. 11 is performed. As shown in FIG. 11, in the comparative example 2, the holding of the DRAM substrate 213 is released in the second bonding. In other words, in the comparative example 2, the CIS substrate 211 is the first substrate, the LOGIC substrate 212 is the second substrate, and the DRAM substrate 213 is the third substrate.

Figure 61:
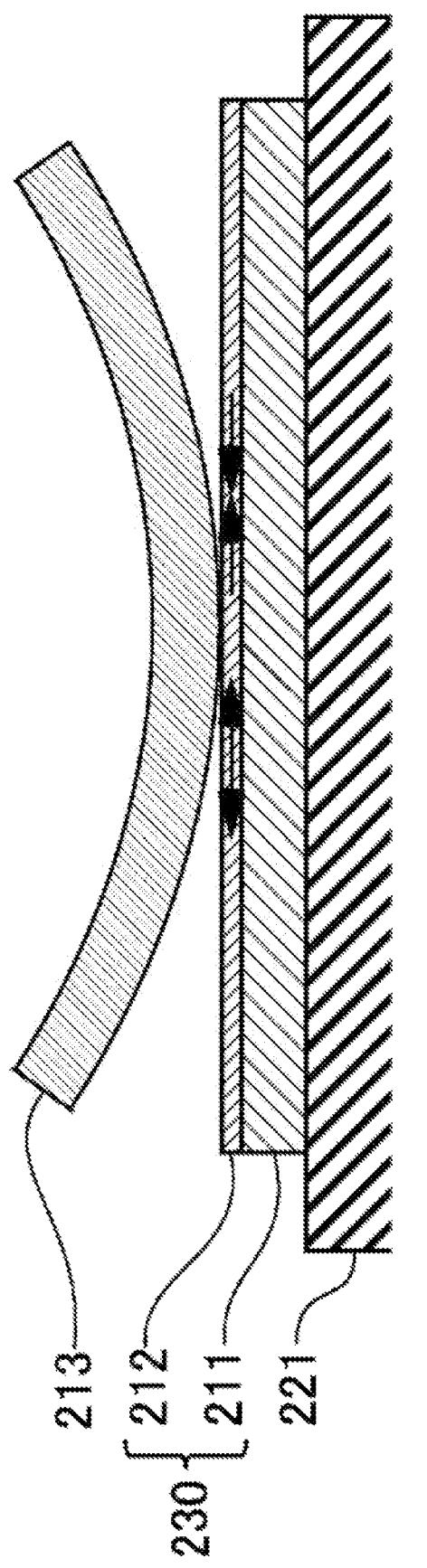
FIG. 61 illustrates a bonding process of the intermediate stack 230 and the DRAM substrate 213.
Figure 62:
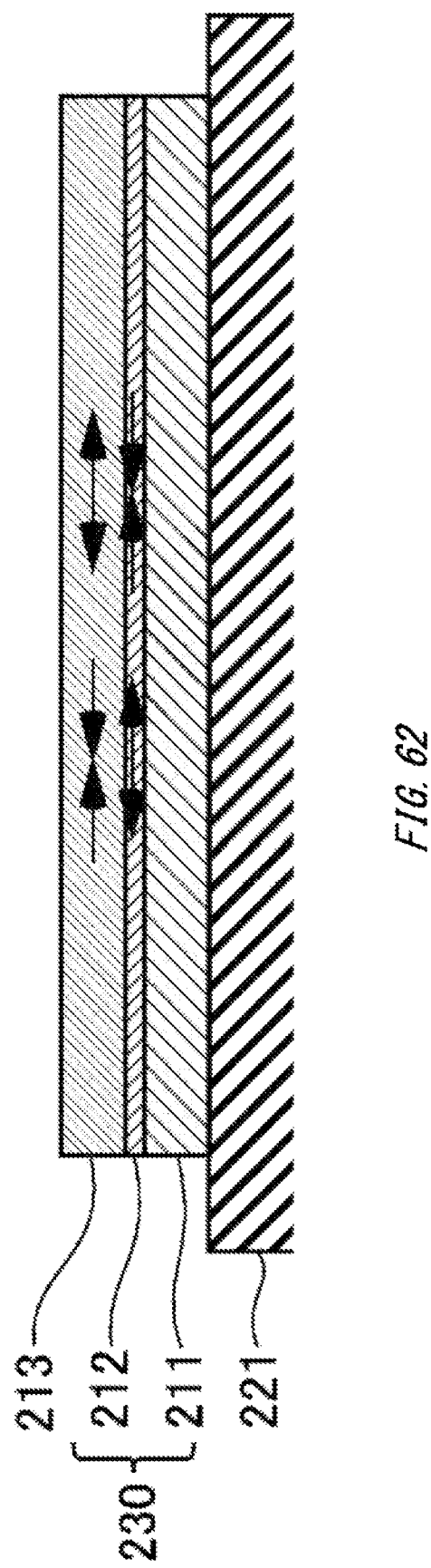
FIG. 62 illustrates a bonding process of the intermediate stack 230 and the DRAM substrate 213.
Figure 63:
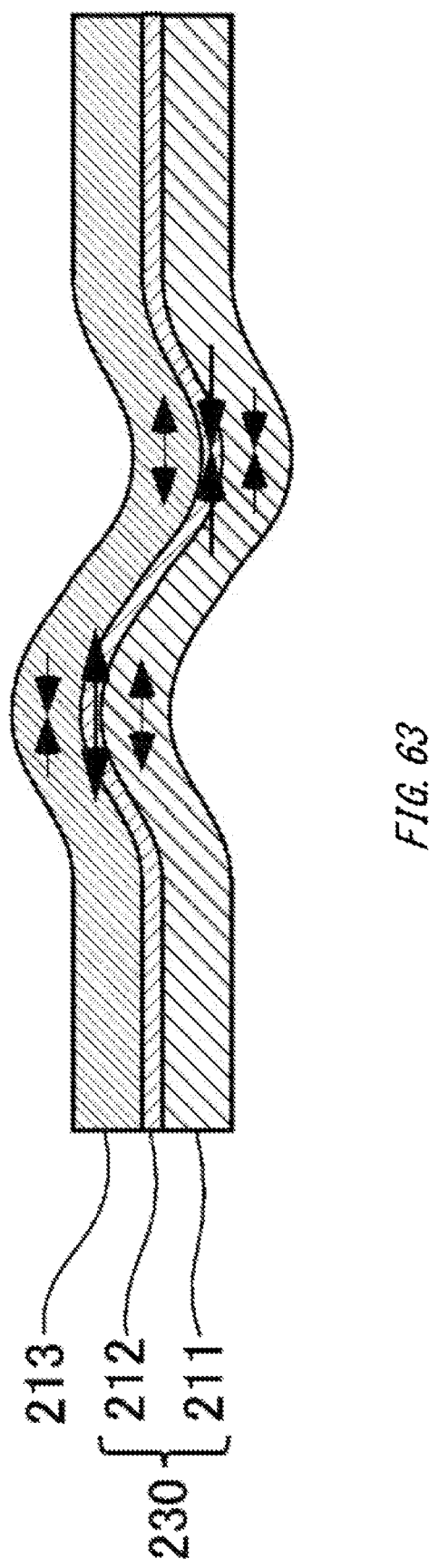
FIG. 63 illustrates a bonding process of the intermediate stack 230 and the DRAM substrate 213.

As shown in FIG. 61, at the point of time when the holding of the DRAM substrate 213 is released and the bonding is started, the intermediate stack 230 is attracted by the substrate holder 221 with a flat attracting surface, and is fixed in a flat state. As shown in FIG. 62, at the stage where the intermediate stack 230 and the DRAM substrate 213 are bonded, a distortion is generated in the DRAM substrate 213 in a direction opposite to the distortion generated in the LOGIC substrate 212 of the intermediate stack 230. In this way, the misalignment increases due to the difference between the distortion generated in the LOGIC substrate 212 and the distortion generated in the DRAM substrate 213. Furthermore, as shown in FIG. 63, when the holding by the substrate holder 221 is released, in the intermediate stack 230 and the entire DRAM substrate 213 that have been bonded, deformations are generated along with the warpages due to the distortion opposite to that of the CIS substrate 211 generated in the DRAM substrate 213.

Figure 64:
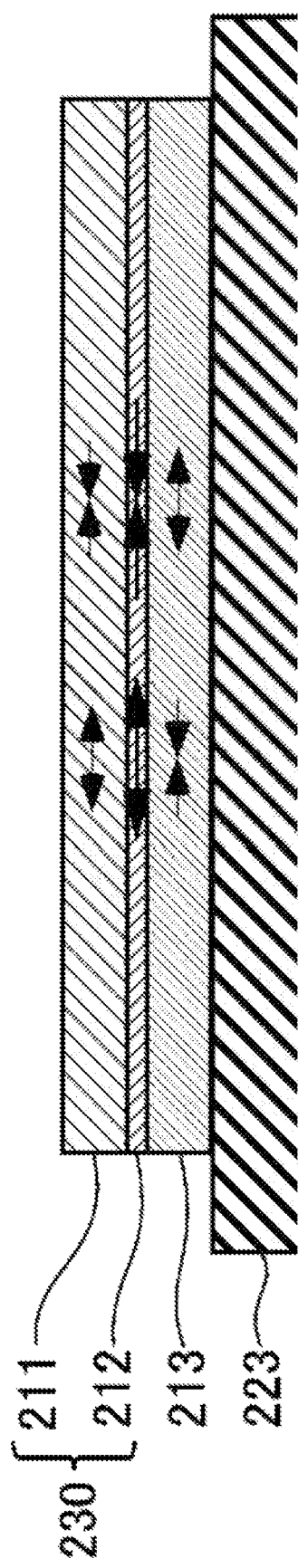
FIG. 64 illustrates a bonding process of the intermediate stack 230 and the DRAM substrate 213.
Figure 65:
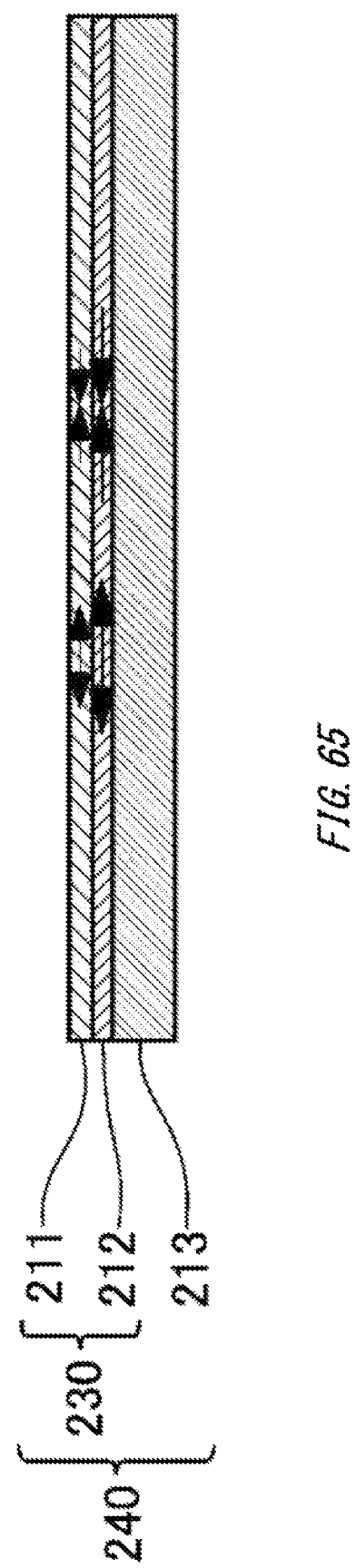
FIG. 65 is a cross sectional view of the completed stack 240.

As shown in FIG. 64, when the intermediate stack 230 and the DRAM substrate 213 that have been bonded are attracted to the substrate holder 223 as a jig for thinning and are forcibly flattened, the distortions are distributed to each of the intermediate stack 230 and the DRAM substrate 213 that have been bonded according to the rigidity. However, as shown in FIG. 65, when the completed stack 240 formed by thinning the CIS substrate 211 has the holding by the substrate holder 223 released, the distortions of the entire completed stack 240 overlap in the LOGIC substrate 212 and the DRAM substrate 213. Therefore, the distortion of each layer of the completed stack 240 also increases.

Figure 66:
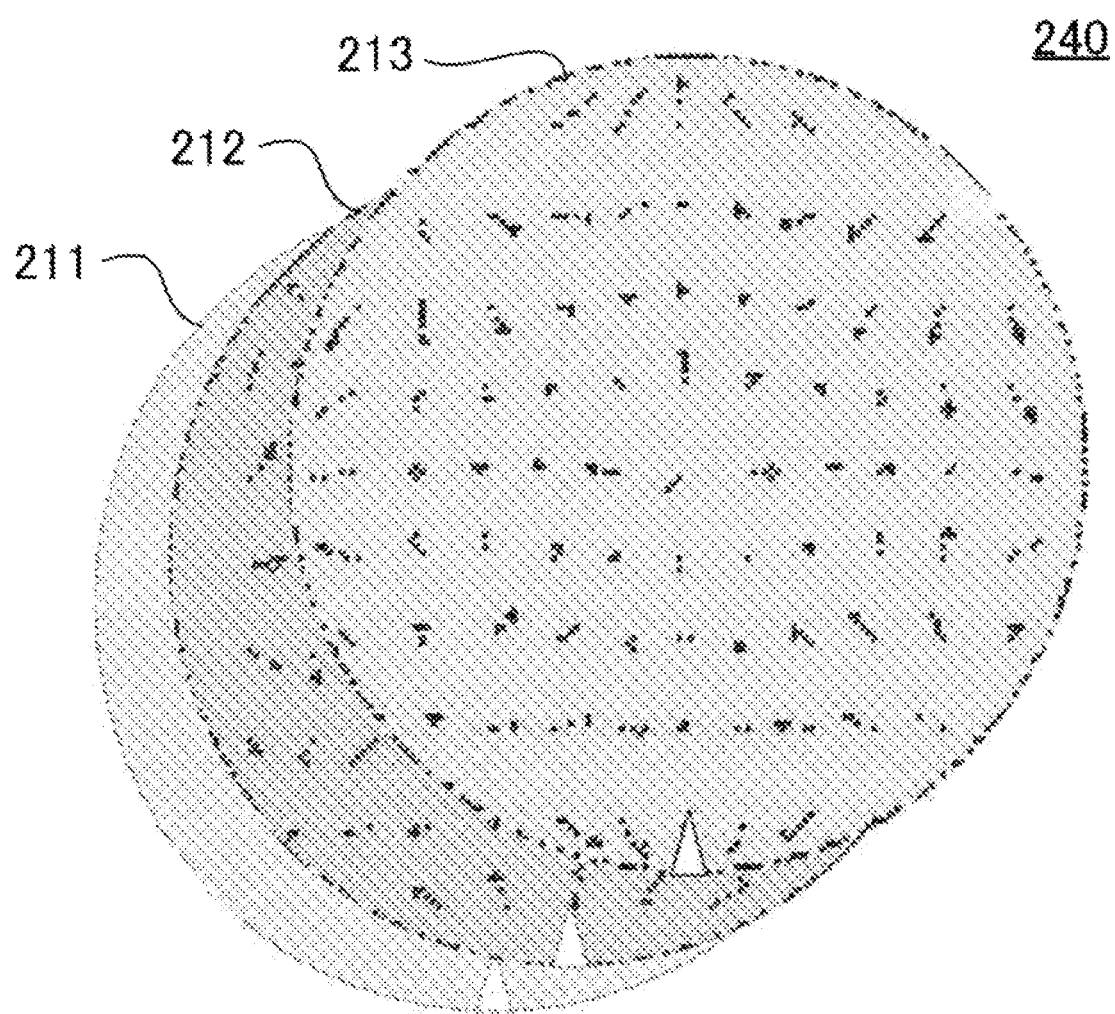
FIG. 66 is a schematic view indicating a distribution of nonlinear distortions in the manufacturing process of the completed stack 240.

FIG. 66 illustrates a schematic planar view showing the distributions of distortions in a state where the bonded intermediate stack 230 and the DRAM substrate 213 are held by the substrate holder 221 as shown in FIG. 62. Also, FIG. 67 illustrates a planar view schematically showing the distributions of distortions in the completed stack 240 shown in FIG. 65.

Figure 67:
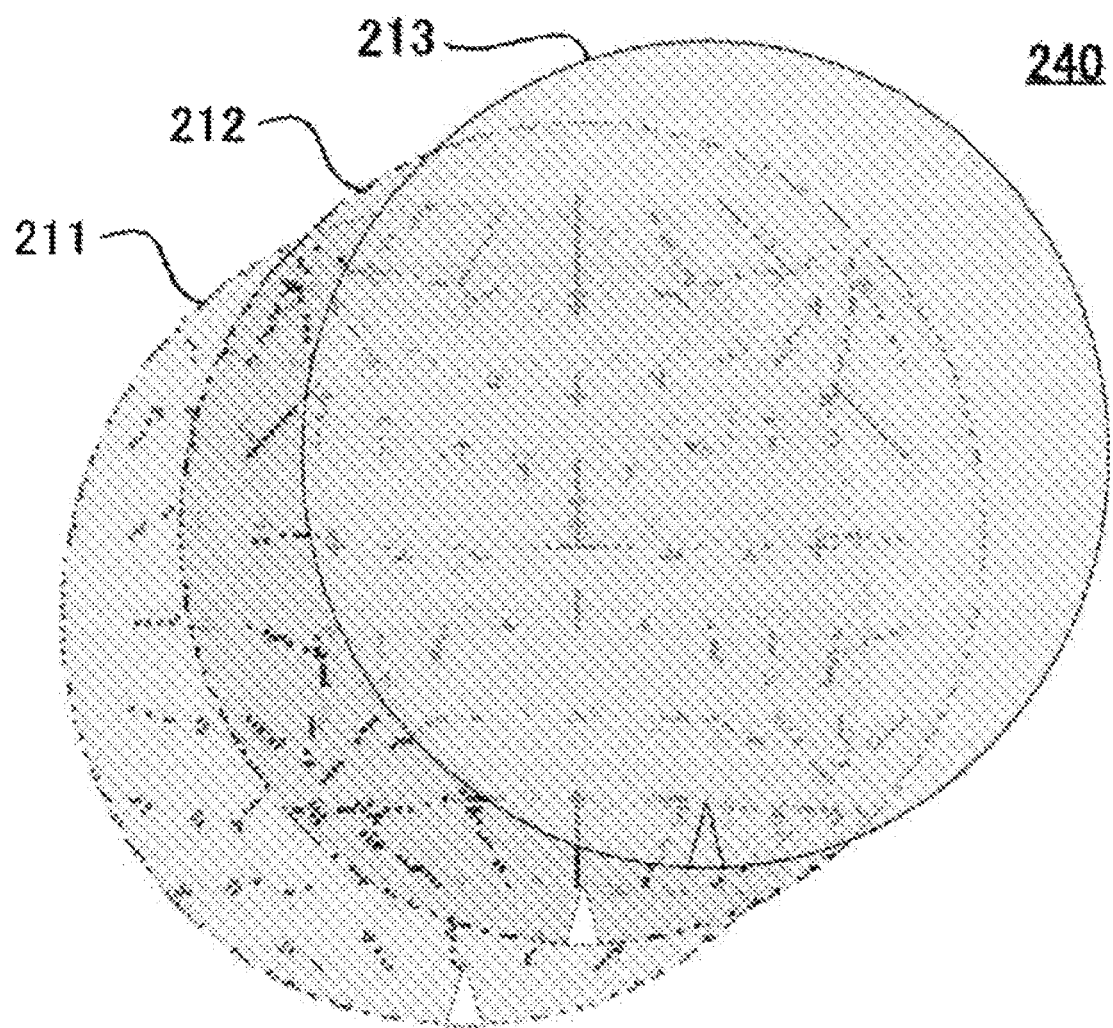
FIG. 67 is a schematic view indicating a distribution of nonlinear distortions in the completed stack 240.

As can be seen from the comparison between FIG. 66 and FIG. 67, the distortions caused by the second bonding are generated in the DRAM substrate 213 at the beginning of the bonding. However, in the final completed stack 240, by the thinning of the CIS substrate 211, the distortion of the LOGIC substrate 212 is doubled and at the same time, and the distortion of the CIS substrate 211 is also generated.

FIG. 68 to FIG. 71 illustrate the magnification distortions generated in the bonding process in the comparative example 2. The arrows having white arrowheads shown in FIG. 68 to FIG. 71 indicate that when the outward arrowheads are shown at both ends of one straight line, the distance between the structural bodies on the substrate is increased, and the magnification distortion with an increasing magnification is generated. Also, in the case where a pair of arrows having facing arrowheads is shown, the distance between the structural bodies on the substrate is narrowed, and the magnification distortion with a reduced magnification of the substrate is generated.

Figure 68:
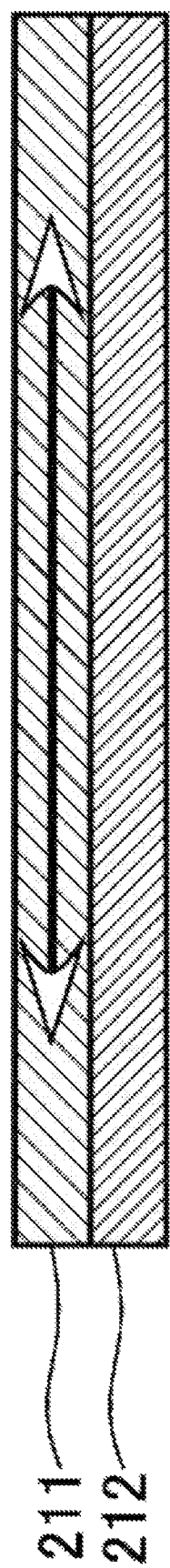
FIG. 68 illustrates a magnification distortion generated in a bonding process of a comparative example 2.
Figure 69:
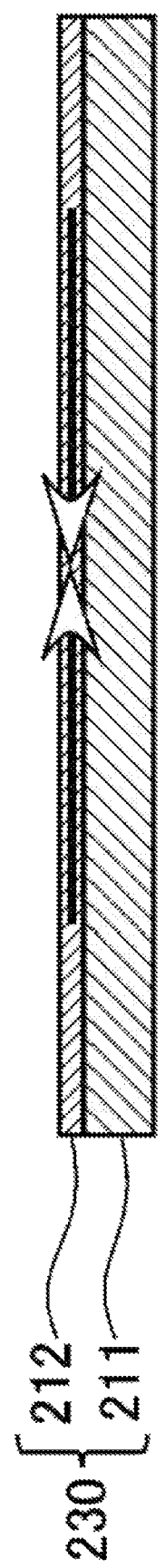
FIG. 69 illustrates a magnification distortion generated in a bonding process of the comparative example 2.

When the CIS substrate 211 whose holding is released is bonded to the LOGIC substrate 212 held by the substrate holder 221, as indicated by the arrows in FIG. 68, the lamination process magnification distortion is generated in the CIS substrate 211, and the magnification distortion of the CIS substrate 211 is increased. Subsequently, when the LOGIC substrate 212 is thinned, as shown in FIG. 69, the magnification distortion generated in the CIS substrate 211 is transferred to the thinned LOGIC substrate 212 as magnification distortion, which reduces the magnification. In this way, the magnification distortion of the CIS substrate 211 is eliminated.

Figure 70:
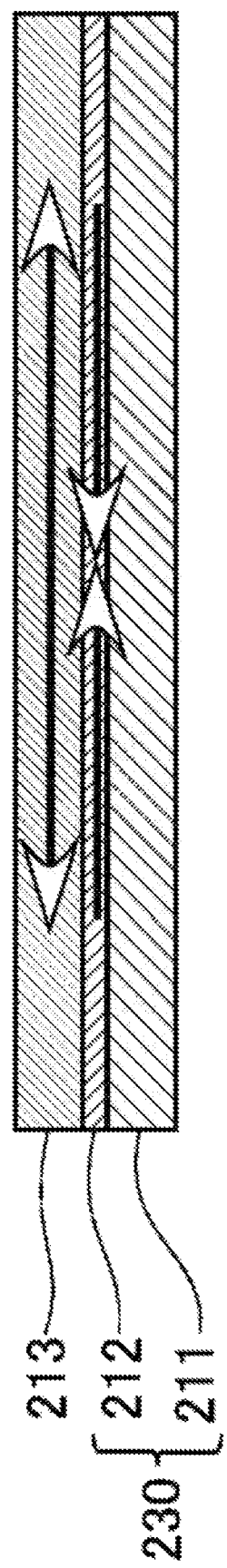
FIG. 70 illustrates magnification distortions generated in a bonding process of the comparative example 2.

Next, in a state where the intermediate stack 230 having the CIS substrate 211 and the LOGIC substrate 212 described above is held by the substrate holder 221, when the DRAM substrate 213 has the holding released and is bonded to the intermediate stack 230, a lamination process magnification distortion that increases the magnification is generated in the DRAM substrate 213. On the other hand, the LOGIC substrate 212 that is in direct contact with the DRAM substrate 213 has a magnification distortion generated therein that reduces the magnification as described above. Therefore, as shown in FIG. 70, a misalignment is generated due to the difference of the magnification distortions between the LOGIC substrate 212 and the DRAM substrate 213.

Figure 71:
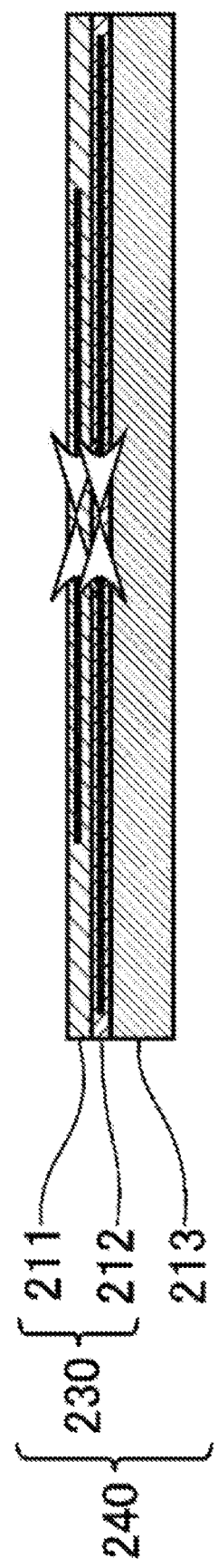
FIG. 71 illustrates magnification distortions generated in a bonding process of the comparative example 2.

Subsequently, when the CIS substrate 211 is thinned, the magnification distortion generated in the DRAM substrate 213 is distributed to the thinned CIS substrate 211 and the LOGIC substrate 212. Therefore, as shown in FIG. 71, in the LOGIC substrate 212, the lamination process magnification distortions generated by the two bondings are superimposed, and the magnification distortion toward the center along the opposite direction to the magnification distortion generated in the DRAM substrate 213, that is, the radial direction, is further increased. Also, in the CIS substrate 211 where the magnification distortion has been once eliminated, a magnification distortion is also generated toward the center along the radial direction.

As described above, in the second bonding for manufacturing the completed stack 240, by the holding of the intermediate stack 230 or the DRAM substrate 213 specified according to the procedure shown in FIG. 10 being firstly released, a completed stack 240 can be formed in which at least the distortions of the layer of the LOGIC substrate 212 and the layer of the DRAM substrate 213 have been reduced. It is noted that, in any case, although the distortion of the layer of the CIS substrate 211 remains, the distortion of the layer of the CIS substrate 211 can be reduced by the method described below.

As a first method, in the second bonding of the methods of the implementation 1 and the implementation 2 described above, the DRAM substrate 213 is bonded, on which the structure is formed in a state where the crystal orientation of the bonding surface in a direction parallel to the bonding surface is inclined at an angle of, for example, 45° with respect to the crystal orientation of the bonding surface of the CIS substrate 211 not thinned in the intermediate stack 230 in a direction parallel to the bonding surface. In this way, the distortion caused by the rigidity distribution of the intermediate stack 230 and the DRAM substrate 213 can be offset, the distortion generated by the second bonding can be reduced, and finally the distortion remained in the CIS substrate 211 can be reduced.

Herein, the state in which the angle of the plane orientation is shifted means that, for example, the state in which the crystal plane orientation of the intermediate stack 230 matches the crystal orientation of the DRAM substrate 213 is referred to as 0°, and the center of the intermediate stack 230 is maintained to match the center of the DRAM substrate 213, while the DRAM substrate 213 is rotated around the central axis with respect to the intermediate stack 230, and is represented by an angle. Further, the crystal orientation of each substrate can be known based on the notch, orientation flat, specifications and so on of the substrate 210. Furthermore, the crystal orientation of the substrate 210 or the intermediate stack 230 for bonding can be known from the position of a notch or the like with respect to the center of the bonding surface of the substrate 210 or the intermediate stack 230. The rotation angle is not limited to 45°, and if it is in the range from 22.5° to 67.5°, the distortion caused by the second bonding can be reduced as compared with the case where the crystal orientations are matched. By bonding the DRAM substrate 213 thus manufactured to the intermediate stack 230, the distortion caused by the rigidity distribution due to the anisotropy of the crystal orientation can be offset, and the distortion caused by the bonding can be suppressed.

Also, as a second method for reducing the distortion remained in the CIS substrate 211, after bonding the DRAM substrate 213 in the second bonding, furthermore, another substrate is bonded to the DRAM substrate 213 as a supporting substrate, and then the CIS substrate 211 may be thinned. In this way, the transfer of the distortion generated in the DRAM substrate 213 to the CIS substrate 211 in the second bonding can suppressed by the supporting substrate, and the distortion distributed to the CIS substrate 211 can be reduced.

Further, as a third method, after bonding the DRAM substrate 213 in the second bonding, the DRAM substrate 213 is thinned before the thinning of the CIS substrate 211, and furthermore, the CIS substrate 211 may also be thinned after the thinned DRAM substrate 213 is bonded to another supporting substrate. In this way, much of the distortion is transferred to the DRAM substrate 213, and the distortion of the CIS substrate 211 can be reduced.

It is noted that, in the second method and the third method described above, a supporting substrate where a distortion is hardly generated is preferable to be used. Specifically, in the second method described above, one with a crystal orientation rotated by, for example, 45°, in the bonding surface with respect to the crystal orientation of the bonding surface of the DRAM substrate 213 may be used, or in the third method described above, one with a crystal orientation rotated by, for example, 45°, in the bonding surface with respect to the crystal orientation of the bonding surface of the CIS substrate 211 may also be used. Also, the circuit substrate further serving as another layer of the stack, for example, the substrate with a circuit for performing processing connected to the DRAM substrate 213 described above, may also be used as the supporting substrate described above. Furthermore, the stacks may also be bonded together with the LOGIC substrate 212 and the DRAM substrate 213 facing each other, by forming a stack by bonding the CIS substrate 211 and the LOGIC substrate 212 using a substrate with an above-described crystal orientation inclined at, for example, 45° with respect to the other crystal orientation on any one of the CIS substrate 211 and the LOGIC substrate 212, and by forming a stack by bonding the DRAM substrate 213 and the supporting substrate using a substrate with an above-described crystal orientation inclined at, for example, 45° with respect to the other crystal orientation on any one of the DRAM substrate 213 and the supporting substrate.

Further, in this implementation, an example is shown in which a structure is formed on each of the two substrates bonded in the first bonding, but instead of this, of the two substrates bonded in the first bonding, a substrate with no structure formed thereon such as a bare silicon wafer may also be used on the one substrate whose holding is not released for bonding. In this case, there is no problem even if a misalignment is generated between one substrate and the other substrate whose holding is released due to distortion generated during the bonding process, so the one substrate may also not be deformed in advance corresponding to the distortion generated in the other substrate. In this case, the bonding conditions in the first bonding may also be determined based on the information related to the distortion estimated to be generated in the third substrate in the second bonding, and the bonding conditions in the second bonding may also be determined based on the information related to the distortion generated in the one substrate in the first bonding, so that the distortion generated in the other substrate due to the first bonding and the distortion generated in the third substrate bonded to the intermediate stack including the other substrate are the distortions in the same shape with each other.

Further, in this implementation, an example in which the CIS substrate 211, the LOGIC substrate 212, and the DRAM substrate 213 are laminated in this order has been shown, but instead of this, they may also be laminated in the order of the CIS substrate 211, the DRAM substrate 213, and the LOGIC substrate 212.

Further, at least two of the three or more substrates to be laminated may be the same type of substrate. In this case, for example, two DRAM substrates may be bonded to each other to form an intermediate stack, and a LOGIC substrate may also be laminated on the intermediate stack. In this case, of the two DRAM substrates, one that has the holding released for bonding is the first substrate and the other is the second substrate, and any one of the DRAM substrates is thinned.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: substrate laminating apparatus; 110: housing; 120, 130: substrate cassette; 140: transport unit; 150: control unit; 210: substrate; 211: CIS substrate; 212: LOGIC substrate; 213: DRAM substrate; 217: scribe line; 218: mark; 219: circuit region; 221.222, 223: substrate holder; 230: intermediate stack; 240: completed stack; 300: bonding unit; 310: frame; 311: top plate; 313: bottom plate; 321: fixed stage; 322, 342: microscope; 323, 343: activation device; 331: X-direction driving unit; 332: Y-direction driving unit; 333: Z-direction driving unit; 341: moving stage; 400: holder stocker; 500: prealigner

What is claimed is:

1. A bonding method comprising:
firstly bonding a first substrate to a second substrate by releasing a holding of the first substrate so as to form a first stack;
thinning the first substrate that has been bonded to the second substrate; and
secondly bonding the thinned first substrate to a third substrate, so as to form a second stack wherein a holding of the third substrate is released at the secondly bonding,
wherein:
the firstly bonding forms a first bonding region by bonding a part of the first substrate and a part of the second substrate, and then enlarges the first bonding region by releasing a holding of the first substrate, so as to form the first stack; and
the secondly bonding forms a second bonding region by bonding a part of the third substrate to a part of the thinned first substrate and the second substrate, and then enlarges the second bonding region by releasing a holding of the third substrate, so as to form the second stack.

2. The bonding method according to claim 1, wherein:
the first stack includes a light receiving element substrate that includes a plurality of light receiving elements converting incident light into signals, and a processing substrate for processing the signals.

3. The bonding method according to claim 2, wherein the third substrate is a memory substrate with a plurality of memory cells.

4. The bonding method according to claim 3, wherein:
a crystal orientation in a direction parallel to a bonding surface of the first substrate to the second substrate is rotated at an angle from 22.5° to 67.5° with respect to a crystal orientation of a bonding surface of the second substrate to the first substrate in a direction parallel to the surface.

5. The bonding method according to claim 3, further comprising:
thirdly bonding a supporting substrate to the memory substrate of the second stack; and
thinning the light receiving element substrate that has been bonded to the supporting substrate.

6. The bonding method according to claim 5, wherein:
when the supporting substrate is bonded, after a third region is formed where a part of the memory substrate and a part of the supporting substrate are bonded, a holding of the supporting substrate is released and then the third region is enlarged.

7. The bonding method according to claim 3, further comprising:
after thinning the memory substrate of the second stack, thirdly bonding a supporting substrate to the thinned memory substrate, wherein
in bonding surfaces of the thinned memory substrate and the supporting substrate, directions of crystal orientations parallel to the bonding surfaces of the thinned memory substrate and the supporting substrate are rotated at 45° with respect to each other.

8. The bonding method according to claim 7, wherein the supporting substrate includes a circuit connected to the memory substrate.

9. The bonding method according to claim 1,
wherein the second substrate is a light receiving element substrate that includes a plurality of light receiving elements converting incident light into signals,
wherein the first substrate is a processing substrate for processing the signals, and
wherein the third substrate is a memory substrate with a plurality of memory cells.

10. The bonding method according to claim 1, wherein each of the first substrate, the second substrate, and the third substrate includes a circuit.

11. A bonding method comprising:
firstly bonding a first substrate to a second substrate by releasing a holding of the first substrate so as to form a first stack;
thinning the second substrate that has been bonded to the second substrate; and secondly bonding the thinned second substrate to a third substrate, so as to form a second stack wherein a holding of the first stack is released at the secondly bonding, wherein:

the firstly bonding forms a first bonding region by bonding a part of the first substrate and a part of the second substrate, and then enlarges the first bonding region by releasing a holding of the first substrate, so as to form the first stack; and the secondly bonding forms a second bonding region by bonding a part of the third substrate to a part of the thinned second substrate and the first substrate, and then enlarges the second bonding region by releasing a holding of the first stack, so as to form the second stack.

12. The bonding method according to claim 11, wherein the first substrate is a light receiving element substrate that includes a plurality of light receiving elements converting incident light into signals, wherein the second substrate is a processing substrate for processing the signals, and wherein the third substrate is a memory substrate with a plurality of memory cells.

13. The bonding method according to claim 11, wherein each of the first substrate, the second substrate, and the third substrate includes a circuit.

14. A bonding method comprising:

firstly bonding a first substrate to a second substrate by releasing a holding of the first substrate to form a first stack;

thinning one substrate among the first substrate and the second substrate that have been bonded to each other; and secondly bonding the thinned one substrate to a third substrate, so as to form a second stack, wherein when the first substrate is thinned in the thinning, a holding of the third substrate is released at the secondly bonding; and when the second substrate is thinned in the thinning, a holding of the first stack is released at the secondly bonding, wherein:

the firstly bonding forms a first bonding region by bonding a part of the first substrate and a part of the second substrate, and then enlarges the first bonding region by releasing a holding of the first substrate, so as to form the first stack; and the secondly bonding forms a second bonding region by bonding a part of the third substrate to a part of the thinned one substrate, and then enlarges the second bonding region by releasing a holding of any one of the first stack and the third substrate, so as to form the second stack.

15. The bonding method according to claim 14, wherein each of the first substrate, the second substrate, and the third substrate includes a circuit.

16. A bonding method comprising:

firstly bonding a first substrate and a second substrate;

thinning one substrate among the first substrate and the second substrate that have been bonded to each other; and secondly bonding the thinned one substrate to a third substrate, wherein at the secondly bonding, the thinned one substrate and the third substrate are bonded so that an amount of misalignment between a structure of the thinned one substrate where a distortion has been generated at the firstly bonding and a structure of the third substrate is equal to or less than a predetermined amount.

17. A bonding method comprising:

firstly bonding a first substrate and a second substrate to form a first stack;

secondly bonding one substrate, which has been thinned, among the first substrate and the second substrate that have been bonded, to a third substrate, to form a second stack; and determining which holding of those of the first stack and the third substrate is to be released at the secondly bonding so that an amount of misalignment between a structure of the one substrate where a distortion has been generated at the firstly bonding and a structure of the third substrate is equal to or less than a predetermined amount.

18. A bonding method comprising:

firstly bonding a first substrate and a second substrate; and secondly bonding one substrate, which has been thinned, among the first substrate and the second substrate that have been bonded, to a third substrate, wherein at the secondly bonding, the one substrate and the third substrate are bonded so that a distribution of a stress generated in the third substrate at the secondly bonding is the same as a distribution of a stress generated in the one substrate at the firstly bonding, wherein:

the firstly bonding forms a first bonding region by bonding a part of the first substrate and a part of the second substrate, and then enlarges the first bonding region by releasing a holding of the first substrate, so as to form a first stack; and the secondly bonding forms a second bonding region by bonding a part of the third substrate to a part of the thinned one substrate, and then enlarges the second bonding region by releasing a holding of any one of the first stack and the third substrate, so as to form a second stack.

19. The bonding method according to claim 18, wherein each of the first substrate, the second substrate, and the third substrate includes a circuit.

* * * * *